(12) United States Patent
Uno et al.

(10) Patent No.: US 7,820,913 B2
(45) Date of Patent: Oct. 26, 2010

(54) BONDING WIRE FOR SEMICONDUCTOR DEVICE

(75) Inventors: Tomohiro Uno, Futtsu (JP); Yukihiro Yamamoto, Futtsu (JP)

(73) Assignee: Nippon Steel Materials Co., Ltd., Tokyo (JP)

( * ) Notice: Subject to any disclaimer, the term of this patent is extended or adjusted under 35 U.S.C. 154(b) by 366 days.

(21) Appl. No.: 11/794,797

(22) PCT Filed: Jan. 5, 2006

(86) PCT No.: PCT/JP2006/300312

§ 371 (c)(1),
(2), (4) Date: Sep. 18, 2007

(87) PCT Pub. No.: WO2006/073206

PCT Pub. Date: Jul. 13, 2006

(65) Prior Publication Data

US 2009/0188696 A1    Jul. 30, 2009

(30) Foreign Application Priority Data

| Jan. 5, 2005 | (JP) | ............................. 2005-000637 |
| Jan. 5, 2005 | (JP) | ............................. 2005-000638 |
| Jun. 29, 2005 | (JP) | ............................. 2005-189915 |
| Jul. 1, 2005 | (JP) | ............................. 2005-193629 |

(51) Int. Cl.
*H01R 4/62* (2006.01)
(52) U.S. Cl. .................................. 174/94 R; 174/126.2
(58) Field of Classification Search ............... 174/94 R, 174/126.2
See application file for complete search history.

(56) References Cited

U.S. PATENT DOCUMENTS

2004/0014266 A1 * 1/2004 Uno et al. .................... 438/200

FOREIGN PATENT DOCUMENTS

| GB | 2375880 A | 11/2002 |
| JP | 57-149744 A | 9/1982 |
| JP | 60-160554 | 10/1985 |
| JP | 61-99645 A | 5/1986 |

(Continued)

OTHER PUBLICATIONS

Korean Office Action dated Feb. 25, 2009 issued in corresponding Korean Application No. 10-2007-7017936.

(Continued)

*Primary Examiner*—Chau N Nguyen
(74) *Attorney, Agent, or Firm*—Kenyon & Kenyon LLP

(57) ABSTRACT

The present invention provides a bonding wire improved in formability of a ball part, improved in bondability, good in loop controllability, improved in bonding strength of a wedge connection, securing industrial production ability as well, and mainly comprised of copper which is more inexpensive than gold wire, that is, provides a bonding wire for a semiconductor device comprised of a bonding wire having a core material having copper as its main ingredient and a surface covering layer over the core material and of a conductive metal of a composition different from the core material, characterized in that the surface covering layer has as its main ingredients two or more types of metals selected from gold, palladium, platinum, rhodium, silver, and nickel and the surface covering layer has a concentration gradient of one or both of a main ingredient metal or copper in the wire radial direction.

16 Claims, 2 Drawing Sheets

FOREIGN PATENT DOCUMENTS

| | | |
|---|---|---|
| JP | 62-97360 A | 5/1987 |
| JP | 62-097360 A | 5/1987 |
| JP | 2004-64033 A | 2/2004 |
| JP | 2004-064033 A | 2/2004 |
| KR | 2003-33066 | 4/2003 |
| KR | 2004-58014 | 7/2004 |
| WO | WO 02/23618 | 3/2002 |
| WO | WO 03/036710 | 5/2003 |

OTHER PUBLICATIONS

Singh et al., "Enhancing Fine Pitch, High I/O Devices with Copper Ball Bonding", Electronic Components and Technology Conference, 2005, pp. 843-847.

* cited by examiner

BONDING WIRE FOR SEMICONDUCTOR DEVICE

TECHNICAL FIELD

The present invention relates to a bonding wire for a semiconductor device used for connecting an electrode on a semiconductor device and an interconnect of a circuit board (lead frame, board, tape).

BACKGROUND ART

At the present time, as the bonding wire for bonding an electrode on a semiconductor device and an external terminal, a thin wire of a wire size of 20 to 50 μm or so (bonding wire) is mainly being used. For bonding a bonding wire, the ultrasonic bonding/thermal compression bonding method is the most general. A general purpose bonding machine and a capillary jig through which the wire is passed for connection are used. The tip of the wire is heated to melt by arc heat input, the surface tension is used to form a ball, then this ball part is pressed against an electrode of the semiconductor device heated to 150 to 300° C. in range for bonding, then the wire is directly bonded to the external lead side by ultrasonic bonding.

In recent years, the structures, materials, connection techniques, etc. for mounting semiconductors have rapidly diversified. For example, in the mounting structures, in addition to the current QFP (Quad Flat Packaging) using lead frames, the BGA (Ball Grid Array), CSP (Chip Scale Packaging), or other new methods using the substrate, polyamide tape, etc. have come into use. Bonding wire improved more in loop property, bondability, use for mass production, etc. is being sought. In the connection techniques for such wire as well, in addition to the current mainstream ball/wedge bonding, in wedge/wedge bonding suitable for narrower pitches, the wire is directly bonded at two locations, so the improvement of the bondability of the wire is being sought.

The materials to which the bonding wire is bonded are also becoming more diversified. In addition to the conventional Al alloys used for the interconnects and electrodes on silicon substrates, Cu suitable for thin interconnects is being used. Further, lead frames are being plated with Ag, plated with Pd, etc. Further, resin substrates, tapes, etc. are being laid with Cu interconnects which are in turn covered with films of gold or other precious metal elements and their alloys in many cases. In order to handle these various members to be bonded with, improvement of the wire bondability and the bond reliability is being sought.

As the material of the bonding wire, up until now high purity "4N" (purity>99.99 mass %) gold has mainly been used. However, gold is expensive, so bonding wire of other types of metal less expensive in cost of material is desired.

In terms of requirements from the viewpoint of wire bonding techniques, it is required that a ball with good sphericity be formed at the time of ball formation and that the bond between that ball part and the electrode give sufficient bonding strength. Further, in order to handle the increasingly lower bonding temperatures and increasingly finer wires, bonding strength, tensile strength, etc. are also necessary at the location where the wire is wedge connected to an interconnect on a circuit board.

In the resin sealing process where a high viscosity heat curing epoxy resin is injected at a high speed, there is the problem of the wire deforming and contacting the adjacent wires. Further, as pitches become narrower, wires become longer, and wires become thinner, as much reduction of wire deformation as possible at the time of resin sealing is being sought. Increase of the wire strength enables such deformation to be controlled to a certain extent, but loop control becomes difficult, the strength at the time of bonding drops, and other problems arise which have to be solved or else practical application will be difficult.

As wire characteristics for satisfying these requirements, easy loop control in the bonding process and, further, improved bondability to the electrode parts and lead parts, suppression of excessive wire deformation in the resin sealing process after bonding, and other general characteristics are desirably satisfied.

Bonding wire inexpensive in cost of material, superior in electrical conductivity, improved in ball bonding and wedge bonding, etc. by using a copper as a material has been developed and is disclosed in Japanese Patent Publication (A) No. 57-149744 (A), Japanese Patent Publication (A) No. 61-99645, etc. However, with copper bonding wire, there are the problems that oxidation of the wire surface causes the bonding strength to drop and corrosion of the wire surface easily occurs at the time of resin sealing. These are becoming causes preventing practical use of copper binding wires.

Therefore, as a method for preventing surface oxidation of copper bonding wire, Japanese Patent Publication (A) No. 62-97360 proposes wire comprised of copper covered with gold, silver, platinum, palladium, nickel, cobalt, chrome, titanium, or another precious metal or a corrosion resistant metal. Further, from the viewpoint of the ball formability, prevention of degradation of the plating solution, etc. Japanese Patent Publication (A) No. 2004-64033 proposes a wire of a structure of a core material having copper as its main ingredient and a covering layer comprised of a different metal layer comprised of a metal other than copper formed on the core material and an oxidation resistant metal with a melting point higher than copper formed on that different metal layer.

As practical problems in copper bonding wire, the ease of oxidation of the wire surface, the drop in bonding strength, etc. may be mentioned. Further, with high purity copper bonding wire, there are the problems that due to the insufficient wire strength, the wire deformation at the time of resin sealing is large, the pull strength of the neck part is low, low loop formation is difficult, etc., so there is also the problem that there are few semiconductor products to which it can be applied. Therefore, as a means for preventing surface oxidation of copper bonding wire, the wire surface may be covered with a precious metal or oxidation resistant metal.

The inventors evaluated such wire considering the higher mounting density, smaller size, and greater thinness of semiconductor devices and other needs and thereupon learned that many practical problems remain, as explained later, in conventional covered copper wire of a structure of copper bonding wire covered on its surface with a metal different from copper (hereinafter referred to as the "conventional multilayer copper wire").

When forming a ball at the tip of a conventional multilayer copper wire, there is the problem that a "flat ball" off from a true sphere is formed or unmelted wire will remain inside the ball. If bonding such an abnormal ball part on an electrode, it will cause a drop in bonding strength, chip damage, or other problems. Further, along with the lower loop formation or other tougher loop control, the neck part is easily damaged and the pull strength falls in some cases.

If performing complicated loop control with a conventional multilayer copper wire, detachment at the interface between the covering layer and copper etc. may result in an unstable loop shape or electrical short-circuiting of adjoining wires in narrow pitch connection.

When wedge bonding a conventional multilayer copper wire to an electrode of a circuit board or the like, peeling at the interface between the covering layer and core material, discharge of the covering layer from the bond of the wire and electrode and copper being directly bonded, etc. may cause the bonding strength to become unstable or fall.

As a factor for alleviating these problems in the conventional multilayer copper wire, control of the thickness of the covering layer may be considered. However, if making the covering layer thicker, while an improvement in the wedge bonding etc. may be expected, formation of a thick covering layer by plating, vapor deposition, etc. would cause a drop in productivity, a rise in the costs of materials, and other problems in industrial production. Further, if making the covering layer thicker, there is the problem that the concentration of elements other than copper will rise inside the melted ball and therefore the ball part will end up hardening and chip damage will be given at the ball bond.

As opposed to this, if just making the covering layer of a conventional multilayer copper wire thinner, the problems will arise of peeling at the interface between the covering layer and core material and more difficult prevention of oxidation, improvement of wedge bonding, etc.

Further, to promote the practical use of copper wire in the future, it will be necessary to sufficiently handle thick wire of 50 μm size or more for power IC applications for which gold wire is not used much and thin wire of 20 μm size or less using the high conductivity of copper and, in terms of characteristics, handle the tougher requirements of improvement of the bondability of thick wire, narrow pitch small ball bonding, low temperature bonding, reverse bonding for multilayer chip connection, etc.

DISCLOSURE OF THE INVENTION

The present invention has as its object to solve the above-mentioned problems in the prior art and provide bonding wire mainly comprised of copper, less expensive than gold wire, improved in formability of the ball part and bondability, good in loop controllability as well, improved in bonding strength of wedge connection, and securing industrial production ability as well.

Means for Solving the Problems

To solve the above problems, the present invention has the following as its gist:

(1) A bonding wire for a semiconductor device comprised of a bonding wire having a core material having copper as its main ingredient and a surface covering layer over the core material and of a conductive metal of a composition different from the core material, characterized in that the surface covering layer has as its main ingredients two or more types of metals selected from gold, palladium, platinum, rhodium, silver, and nickel and in that the surface layer has a portion having a concentration gradient of one or both of a main ingredient metal or copper in a wire radial direction inside it.

(2) A bonding wire for a semiconductor device comprising a bonding wire having a core material having copper as its main ingredient and a surface covering layer over the core material and of a conductive metal of a composition different from the core material, characterized in that the surface covering layer has as its main ingredients two or more types of metals selected from gold, palladium, platinum, rhodium, silver, and nickel, the surface layer has a portion having a concentration gradient of one or both of a main ingredient metal or copper in a wire radial direction inside it, and at least one type of main ingredient of the surface covering layer has a concentration gradient both increasing and decreasing in the wire radial direction.

(3) A bonding wire for a semiconductor device as set forth in (1) or (2), characterized in that the surface covering layer further has a single metal region selected from gold, palladium, platinum, rhodium, silver, and nickel at its surface side.

(4) A bonding wire for a semiconductor device as set forth in (1) or (2), characterized in that the surface covering layer has a single metal region selected from gold, palladium, platinum, rhodium, silver, and nickel inside it.

(5) A bonding wire for a semiconductor device comprised of a bonding wire having a core material having copper as its main ingredient and a surface covering layer over the core material and of a conductive metal of a composition different from the core material, characterized in that the surface covering layer has as its main ingredient one or more types of metal selected from gold, palladium, platinum, rhodium, silver, and nickel, the surface covering layer has a surfacemost region comprised of copper alone or an alloy containing 30 mol % or more copper at its surface side, and the surface layer has a region where at least one type of the main ingredient metal and copper have concentration gradients both increasing and decreasing in the wire radial direction in the wire radial direction inside it.

(6) A bonding wire for a semiconductor device comprised of a bonding wire having a core material having copper as its main ingredient and a surface covering layer over the core material and of a conductive metal of a composition different from the core material, characterized in that the surface covering layer has as its main ingredient one or more types of metal selected from gold, palladium, platinum, rhodium, silver, and nickel, the surface covering layer has a surfacemost region comprised of an alloy containing two or more types of metals selected from gold, palladium, platinum, rhodium, silver, and nickel in a uniform concentration of 0.1 mol % or more at its surface side, and the surface layer has a concentration gradient of at least one type of main ingredient metal and copper in the wire radial direction inside it.

(7) A bonding wire for a semiconductor device as set forth in any one of (1) to (6), characterized in that the surface layer contains an intermetallic compound phase inside it.

(8) A bonding wire for a semiconductor device comprised of a bonding wire having a core material having copper as its main ingredient and a surface covering layer over the core material and of a conductive metal of a composition different from the core material, characterized in that the surface covering layer has a concentration gradient of copper in the wire radial direction inside it and in that the surface covering layer has copper concentration of 0.1 mol % or more at its surface.

(9) A bonding wire for a semiconductor device comprised of a bonding wire having a core material having copper as its main ingredient and a surface covering layer over the core material and of a conductive metal of a composition different from the core material, characterized in that the surface covering layer has a concentration gradient of copper and an intermetallic compound phase in the wire radial direction inside it and in that the surface covering layer has a copper concentration of 0.1 mol % or more at its surface.

(10) A bonding wire for a semiconductor device comprised of a bonding wire having a core material having copper as its main ingredient and a surface covering layer over the core material and containing a conductive metal and copper differing in one or both of ingredients or composition from the core material, characterized in that the surface covering layer has a thickness of 0.001 to 0.02 μm.

(11) A bonding wire for a semiconductor device as set forth in (10), characterized in that the surface covering layer has a region having a concentration gradient of a conductive metal other than copper in the wire radial direction inside it and the region has a thickness of 0.001 to 0.02 μm.

(12) A bonding wire for a semiconductor device as set forth in (10) or (11), characterized in that the surface covering layer has a region of a concentration of a conductive metal other than copper of 20 mol % or more having a thickness of 0.001 to 0.008 μm inside it.

(13) A bonding wire for a semiconductor device as set forth in (10) or (11), characterized in that the surface covering layer has a region of a concentration of a conductive metal other than copper of 40 mol % or more having a thickness of 0.001 to 0.006 μm inside it.

(14) A bonding wire for a semiconductor device as set forth in any one of (10) to (13), characterized in that the surface covering layer has a region of a concentration of a conductive metal other than copper of a constant level in the wire radial direction at its surface side and the region has a thickness of 0.007 μm or less.

(15) A bonding wire for a semiconductor device comprised of a bonding wire having a core material having copper as its main ingredient and a surface covering layer over the core material and containing a conductive metal and copper differing in one or both of ingredients or composition from the core material, characterized in that the surface covering layer has a thickness of 0.001 to 0.02 μm, the surface covering layer has a conductive metal other than copper having a maximum concentration of less than 40 mol % inside it, and the conductive metal other than copper has a concentration gradient in the wire radial direction.

(16) A bonding wire for a semiconductor device comprising a bonding wire having a core material having copper as its main ingredient and a surface covering layer over the core material and containing a conductive metal and copper differing in one or both of ingredients or composition from the core material, characterized in that the surface covering layer has a thickness of 0.001 to 0.02 μm, the outermost surface has a copper concentration of 50 to 95 mol % in range, and the conductive metal other than copper has a concentration gradient in the wire radial direction.

(17) A bonding wire for a semiconductor device as set forth in (8) to (16), characterized in that the surface covering layer has as its main ingredient one or more types of metal selected from gold, palladium, platinum, rhodium, silver, and nickel.

(18) A bonding wire for a semiconductor device as set forth in (8) or (9), characterized in that the surface covering layer has as its main ingredient one or more types of metal selected from gold, palladium, platinum, rhodium, silver, and nickel and contains one or more elements selected from Ca, Sr, Be, Al, and rare earth elements in a total of 1 to 300 mass ppm in range.

(19) A bonding wire for a semiconductor device as set forth in any one of (10) to (16), characterized in that the surface covering layer has a conductive metal or copper of a weighted concentration at its surface.

(20) A bonding wire for a semiconductor device as set forth in any one of (8) to (13) and (15) to (18), characterized in that the surface covering layer has copper concentrated at its crystal grain boundaries.

(21) A bonding wire for a semiconductor device as set forth in any one of (8), (9), (17), and (18), characterized in that the total of the conductive metals other than copper forming the surface covering layer is, in content in the wire as a whole, 0.02 to 10 mol % in range.

(22) A bonding wire for a semiconductor device as set forth in any one of (8) to (14), (16), (18), and (19) characterized in that the concentration of the conductive metals other than copper in the wire as a whole is, in total, 0.002 to 0.3 mol % in range.

(23) A bonding wire for a semiconductor device as set forth in any one of (1) to (7), characterized in that the core material having copper as its main ingredient contains one or more elements selected from Ca, Sr, Be, Al, and rare earth elements in a total of 1 to 300 mass ppm.

(24) A bonding wire for a semiconductor device as set forth in any one of (1) to (7) and (23), characterized in that the core material having copper as its main ingredient contains one or more metals selected from silver, tin, and gold in a total of 0.1 to 10 mass %.

(25) A bonding wire for a semiconductor device as set forth in any one of (8), (9), (17), (18), (20), and (21), characterized in that the core material having copper as its main ingredient contains one or more metals selected from silver, tin, and zinc in a total of 0.02 to 30 mass %.

(26) A bonding wire for a semiconductor device as set forth in any one of (10), (15), or (16), characterized in that the core material having copper as its main ingredient contains one or more types of additive elements selected from Ba, Ca, Sr, Be, Al, and rare earth elements in a total concentration of the additive elements with respect to the wire as a whole of 0.001 to 0.03 mass % in range.

(27) A bonding wire for a semiconductor device as set forth in any one of (10), (15), or (16), characterized in that the core material having copper as its main ingredient contains one or more types of additive elements selected from Ag, Pt, Pd, Sn, or Zn in a total concentration of the additive elements with respect to the wire as a whole of 0.01 to 0.3 mass % in range.

Figure 1A:
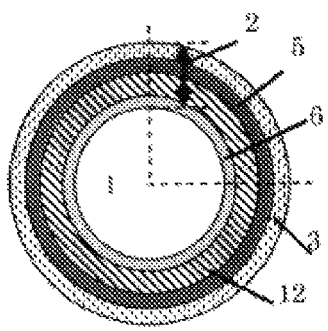
FIG. 1(a) shows an example of schematic illustration of a section of a bonding wire of the first configuration comprising of (single metal region of Au) 3/(concentration gradient layer of Pd and Au) 5/(concentration gradient layer containing three elements of Au, Pd and Cu) 12/(concentration gradient layer of Pd and Cu) 6/(core material of Cu) 1.
Figure 2A:
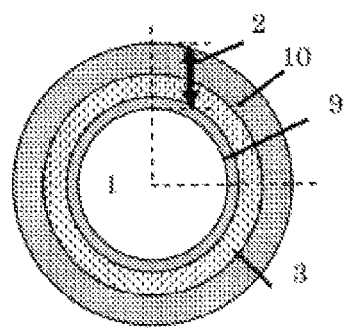
FIG. 2(a) shows an example of schematic illustration of a section of a bonding wire of the second configuration comprising of (Pd-Au alloy region) 10/(single metal region of Au) 3/(concentration gradient layer of Au and Cu) 9/(core material of Cu) 1.
Figure 3A:
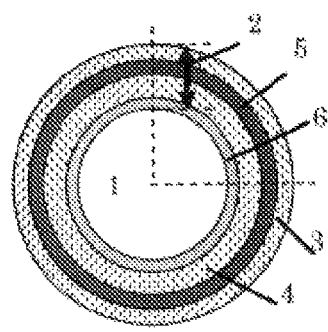
FIG. 3(a) shows an example of schematic illustration of a section of a bonding wire of the third configuration comprising of (single metal region of Au) 3/(concentration gradient layer of Pd and Au) 5/(single metal region of Pd) 4/(concentration gradient layer of Pd and Cu) 6/(core material of Cu) 1.
Figure 3B:
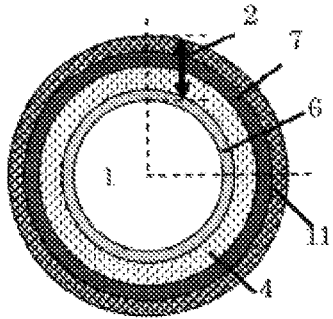
FIG. 3(b) shows an example of schematic illustration of a section of a bonding wire of the third configuration comprising of (Pd-Ag alloy region) 11/(concentration gradient layer of Pd and Ag) 8/(single metal region of Pd) 4/(concentration gradient layer of Pd and Cu) 6/(core material of Cu) 1.
Figure 4A:
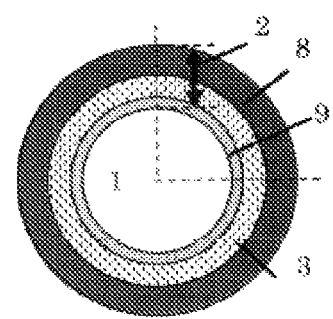
FIG. 4(a) shows an example of schematic illustration of a section of a bonding wire of the fourth configuration comprising of (concentration gradient layer of Pt and Au) 8/(single metal region of Au) 3/(concentration gradient layer of Au and Cu) 9/(core material of CU) 1.
Figure 4B:
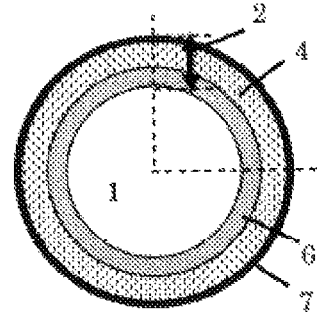
FIG. 4(b) shows an example of schematic illustration of a section of a bonding wire of the fourth configuration comprising of (concentration gradient layer of Pd and Ag) 7/(single metal region of Pd) 4/(concentration gradient layer of Pd and Cu) 6/(core material of Cu) 1.
Figure 4C:
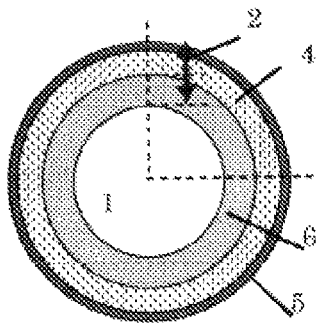
FIG. 4(c) shows an example of schematic illustration of a section of a bonding wire of the fourth configuration comprising of (concentration gradient layer of Pd and Au) 5/(single metal region of Pd) 4/(concentration gradient layer of Pd and Cu) 6/(core material of Cu) 1.
Figure 5A:
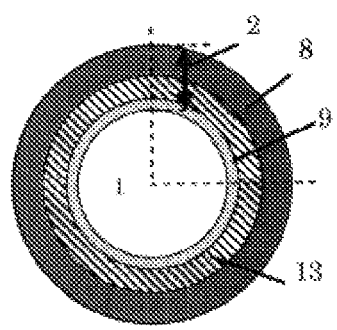
FIG. 5(a) shows an example of schematic illustration of a section of a bonding wire of the fifth configuration comprising of (concentration gradient layer of Pt and Au) 8/ (concentration gradient layer containing three elements of Pt, Au and Cu) 13/(concentration gradient layer of Au and Cu) 9/(core material of Cu) 1.
Figure 5B:
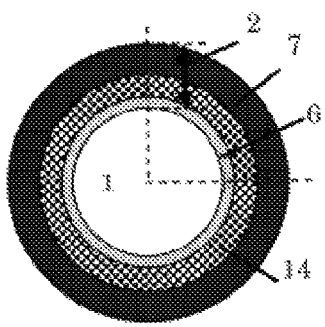
FIG. 5(b) shows an example of schematic illustration of a section of a bonding wire of the firth configuration comprising of (concentration gradient layer of Pd and Ag) 7/ (concentration gradient layer containing three elements of Ag, Pd and Cu) 14/(concentration gradient layer of Pd and Cu) 6/(core material of Cu) 1.
Figure 6:
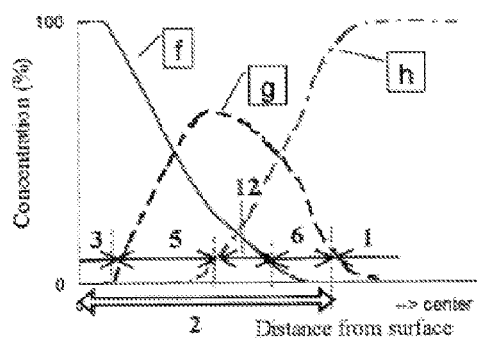
FIG. 6 is a graph showing an example of depth profile of concentrations in the radius direction of a bonding wire of a first configuration comprising of (single metal region of Au) 3/(concentration gradient layer of Pd and Au) 5/(concentration gradient layer containing three elements of Au, Pd and Cu) 12/(concentration gradient layer of Pd and Cu) 6/(core material of Cu) 1.
Figure 7:
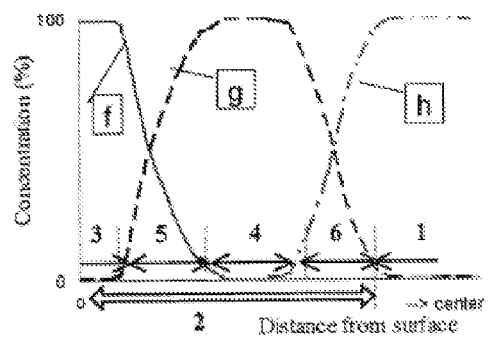
FIG. 7 is a graph showing an example of depth profile of concentrations in the radius direction of a bonding wire of the third configuration comprising of (simple metal region of Au) 3/(concentration gradient layer of Pd and Au) 5/(single metal region of Pd) 4/ (concentration gradient layer of Pd and Cu) 6/(core material of Cu) 1.
Figure 8:
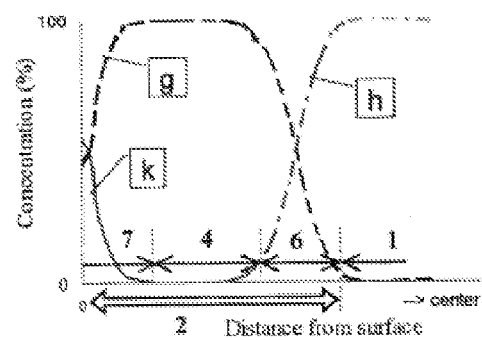
FIG. 8 is a graph showing an example of depth profile of concentrations in the radius direction of a bonding wire of the fourth configuration comprising of (concentration gradient layer of Ag and Pd) 7/(single metal region of Pd) 4/(concentration gradient layer of Pd and Cu) 6/(core material of Cu) 1.
Figure 9:
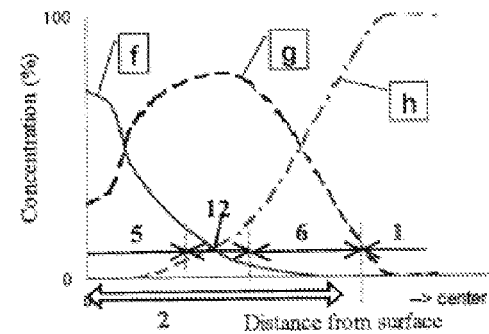
FIG. 9 is a graph showing an example of depth profile of concentrations in the radius direction of a bonding wire of the fifth configuration comprising of (concentration gradient layer of Pd and Au) 5/(concentration gradient layer containing three elements of Au, Pd and Cu) 12/(concentration gradient layer of Pd and Cu) 6/(core material of Cu) 1.

According to the bonding wire for a semiconductor device of the present invention, it is possible to provide a copper-based bonding wire inexpensive in cost of material, superior in ball bondability, wire bondability, etc., good in loop formability, and able to handle both the increasing thinness of wires for narrow pitch applications and the increasing thickness of wires for power IC applications.

BEST MODE FOR CARRYING OUT THE INVENTION

To achieve the above object, the present invention provides a bonding wire having a core material mainly comprised of copper and formed with a surface covering layer over it comprised of a conductive metal of a composition different from the core material or a conductive metal and copper. Roughly classified, <1> bonding wire with a surface covering layer having a concentration gradient of copper or conductive metal, <2> bonding wire with a surface covering layer having a concentration gradient of copper inside it and raised in concentration of copper at the surface region or with copper exposed, and <3> bonding wire with a surface covering layer controlled in thickness are provided.

First, the <1> bonding wire with a surface covering layer having a concentration gradient of copper or conductive metal ((1) to (7), (23), and (24)) will be explained.

The bonding wire of the present invention is comprised of a core material having copper as its main ingredient and a surface covering layer of a conductive metal of a composition different from the core material. However, with a simple two-layer structure of a copper core material and a surface covering layer, the ball formation, bondability, loop control, etc. are not sufficient and sometimes the characteristics even deteriorate from single layer copper wire. Therefore, to improve the overall characteristics compared with single layer copper wire, the surface covering layer of the present invention has a region of a concentration gradient of one or both of copper and the conductive metal.

Further, with just a concentration gradient of copper, the productivity of the bonding wire process sometimes falls from that of the current mainstream gold bonding wire. Therefore, the inventors discovered that as configurations of a surface covering layer for improving the productivity to equal or better than that of gold bonding wire, a surface covering layer having concentration gradients of two or more main ingredients of conductive metal other than copper, a surface covering layer with a single metal region of a main ingredient formed at the surface or inside it, a surface covering layer with an alloy region of a constant concentration of the main ingredient at its surfacemost region, etc. would be effective. Further, the technique of making the core material a copper alloy having specific elements is also effective.

The interface of the surface covering layer and core material is made a region with a detected concentration of the conductive metal forming the surface covering layer of 10 mol % or more. This is based on this being the region where the effect of improvement of characteristics can be expected from the structure of the surface covering layer of the present invention. For expression of the characteristics, the concentration of conductive metal usually continuously changes. Judging the precision of normal quantitative analysis for evaluating this overall, this was made a region with a concentration of conductive metal of 10 mol % or more. Preferably, if a region of 15 mol % or more, quantitative analysis is raised in precision and measurement becomes simpler.

If classifying the concentration gradients by component elements, they may be classified into two types according to the presence/absence of the copper element forming the core part. That is, they may be classified into concentration gradients comprised of the copper element forming the core part and a conductive metal element (hereinafter referred to as a "type A concentration gradient") and concentration gradients not including any copper element forming the core part and comprised of just a conductive metal element (hereinafter referred to as a "type B concentration gradient").

A "concentration gradient" is defined as an extent of change of concentration in the depth direction of preferably 5 mol % or more per μm. This is because if over this change, the effects of improvement of the surface covering layer having a concentration gradient described above can be expected, good reproducible results can be obtained in terms of precision in quantitative analysis, and other reasons. However, this is differentiated from the case where the concentration of an element in the wire locally rises or falls and the case where an element is distributed unevenly. Preferably, if 10 mol % or more per μm, production is easy. More preferably, if 20 mol % or more per μm, the different characteristics of the surface covering layer and core material are not impaired and a high effect of utilization of both can be expected. Note that the concentration gradient in the case of a bonding wire with a surface covering layer controlled in thickness will be explained later.

From the viewpoint of the productivity, quality stability, etc., it is preferable that the concentration gradient in the surface covering layer change continuously. That is, the extent of the slope of the concentration gradient need not necessarily be constant within the surface covering layer. It may also continuously change. For example, good characteristics can be obtained even if the slope of the change in concentration at the interface of the covering layer and core material, near the outermost surface, etc. differs from the inside of the covering layer or the concentration exponentially changes.

The concentration gradient region is preferably a region formed by diffusion of atoms. If this is a layer formed by diffusion, the possibility of local peeling, cracks, or other defects is low, formation of a continuous change of concentration is easy, and numerous other advantages arise.

The technique for obtain a suitable surface covering layer by the composition of the alloy, concentration distribution, etc. will be explained in detail next.

A bonding wire comprised of a core material having copper as its main ingredient and a surface covering layer over the core material and of a conductive metal of a composition different from the core material wherein the surface covering layer contains two or more types of metal of gold, palladium, platinum, rhodium, silver, and nickel and further the surface covering layer has a portion having a concentration gradient of one or both of the main ingredient metal and copper inside it is preferable.

This is because by the surface covering layer having two or more types of conductive metal elements other than copper and having a type A concentration gradient including the copper element of the core part and a type B concentration gradient not including the copper element of the core part and comprised of just the conductive metal element, it is possible to suppress any increase in electrical resistance etc. and improve the ball formability, wire strength, loop control, bonding strength, etc. compared with alloying with a substantially uniform distribution of elements of the surface covering layer. Regarding the effects of the concentration gradients, a type A concentration gradient near the interface of the surface covering layer and core part improves the stability of formation of a loop comprised of a bent part of the wire and a type B concentration gradient formed at the inside of the surface covering layer is effective for improving the ball formability, wire strength, etc.

When the main element of the surface covering layer is just a single type of gold, palladium, platinum, rhodium, silver, or nickel, the loop shape, resin deformation control, etc. are improved compared with conventional copper wire without any surface covering layer, but compared with the current gold wire, the suitable bonding conditions differ and, at the mass production level, overall improvement of the ball shape, loop shape, bonding strength, etc. is difficult. The inventors discovered that by having the surface covering layer comprised by two or more types of metal of gold, palladium, platinum, rhodium, silver, and nickel, the required characteristics can be improved overall and characteristics equal to those of general use gold bonding wire can be obtained. Further, in the vicinity of the interface of the surface covering layer/core material, by having a concentration gradient of copper element by diffusion etc., peeling of the surface covering layer can be suppressed and a stable loop shape can be obtained even with forced bending at the time of loop formation.

Regarding the combination of elements forming the surface covering layer, with gold-palladium, gold-platinum, gold-rhodium, gold-silver, and gold-nickel types, the improvement in the wedge bondability is remarkable, while with palladium-platinum, palladium-nickel, palladium-rhodium, etc., it was confirmed that the sphericity of the ball shape is extremely good. Regarding the average alloy ratio of the surface covering layer for improving these functions, in a gold-palladium, gold-platinum, gold-rhodium, gold-silver, or gold-nickel type, by making the ratio of the gold 50 to 90%, a high effect of improving the wedge bondability over that of conventional copper wire is obtained. Further, in a palladium-platinum or palladium-nickel type, by making the ratio of the palladium 40 to 90%, the arc discharge is stabilized and the effect of improvement of the sphericity of the ball shape or suppression of variations in dimensions is enhanced. Combination of the elements illustrated above in consideration of the control of the loop shape etc. is also possible.

By having the surface covering layer be comprised of three or more types of element, the improvement of the above characteristics can be further increased. A gold-palladium-platinum, gold-palladium-silver, gold-platinum-nickel, or other type can be illustrated.

The total thickness of the concentration gradient region is preferably 10% to 100% of the thickness of the surface covering layer. This is because if a 10% or more thickness, an effect of improvement of functions over that of average alloying is obtained. Further, preferably, if 20% to 80%, the effect of improvement of the electrical characteristics can be enhanced. If the extent of the concentration gradient is a change in concentration in the depth direction of 2 mol % or more per μm, an effect of improvement of the productivity of the bonding process can be secured.

Further, preferably the surface covering layer contains two or more types of main metals of gold, palladium, platinum, rhodium, silver, and nickel (hereinafter referred to as the "surface skin main metal"), the surface covering layer has a portion with a concentration gradient of one or both of the main ingredient metal or copper in the wire radial direction inside it, and has a concentration gradient of at least one or more types of surface skin main metal both increasing and decreasing in the depth direction. Here, a case where the concentration falls in the depth direction from the surface will be referred to as a "negative concentration gradient", while a case where the concentration increases will be referred to as a "positive concentration gradient". As a comparison, when the surface skin main metal has only a negative concentration gradient such as when there is a concentration gradient only at the interface of the surface covering layer and core material, it is difficult to further stabilize the loop shape, wedge bondability, etc. Therefore, by simultaneously securing positive and negative concentration gradients of the same element, the bondability between the surface covering layer and core material is improved, variations in loop height are reduced or the loop shape is otherwise stabilized, further the deformation shape in wedge bonding is stabilized, bond detachment defects are reduced, etc. This is believed because even if an uneven outside force, impact, etc. is given to the wire, the positive and negative concentration gradients mutually interfere with each other and promote stabilization of deformation.

As an example of positive and negative concentration gradients of the same element, when the surface covering layer has main ingredients of gold and palladium and the surface side has more gold, if comparing the concentration gradient of the palladium element, a bonding wire can be prepared wherein palladium is present in a positive concentration gradient at the portion of the type B concentration gradient comprised of gold and palladium in the surface covering layer and palladium is present in a negative concentration gradient at the portion of the type A concentration gradient comprised of palladium and the core part copper in the vicinity of the interface between the surface covering layer and core part.

If the surface covering layer is just comprised of an alloy, in high frequency IC applications, an increase in the electrical resistance will be a concern. Therefore, the inventors discovered that if forming a single metal region, it is possible to improve the electrical characteristics etc. Here, the "single metal region" is a region having one type of main element and having a total concentration of other metal elements of less than 0.01 mol %. With both a single metal region and alloy layer, contamination of the surface by C, S, Na, etc. at the electrode surface, O, N, H, or other elements etc. are not considered. The portion of the single metal region will be divided into the outermost surface and the inside of the surface covering layer. Each will be explained below.

A bonding wire comprised of a core material having copper as its main ingredient and a surface covering layer formed over the core material wherein the surface covering layer contains two or more types of surface skin main metal of gold, palladium, platinum, rhodium, silver, and nickel, further the surface covering layer has a portion having concentration gradients of surface skin main metal and copper inside it, and the outermost surface has a single metal region comprised of one type of surface skin main metal is preferable. This is because by having the wire outermost surface have a single metal region comprised of one type of gold, palladium, platinum, rhodium, silver, and nickel, the electrical characteristics are improved and, further, by promoting the uniform structure of the ball part, the effect of stabilization of the pressed ball shape is obtained.

A bonding wire comprised of a core material having copper as its main ingredient and a surface covering layer formed over the core material where the surface covering layer contains two or more types of surface skin main metal of gold, palladium, platinum, rhodium, silver, and nickel and, further, the surface covering layer has a single metal region comprised of one type of surface skin main metal and concentration gradients of surface skin main metal and copper inside it is preferable. This is because by forming a single metal region inside the surface covering layer, the electrical characteristics are improved and, further, by controlling the heat affected structure at the neck part near the ball, there are the advantages that the pull strength is increased and lower loop formation can also be handled. Here, when the neck part is affected by heat, the single metal region at the inside acts as a source of supply of diffusion to form diffusion layers at the two sides of the single metal region and increase the pull strength and further enable low loop formation by suppression of recrystallization.

By making the outermost surface an alloy of the surface skin main metal, the alloy part of the surface contributes to higher rigidity and is effective for preventing the wire from sagging when formed in long spans, improving the straightness, and reducing shaving of the wire surface. Further, by forming a single metal region at both the outermost surface and inside the surface covering layer, the electrical characteristics, wedge bondability, pull strength, etc. can be improved.

Configurations of the inside of the surface covering layer will be explained next for a wire including a single metal region taking as an example the above-mentioned palladium-gold type. A first configuration having concentration gradient layers in the direction from the wire surface to the center of the wire in which three elements are mixed such as a single metal region of gold/(concentration gradient layer of palladium and gold)/(concentration gradient layer of gold, palladium, and copper)/(concentration gradient layer of palladium and copper), a second configuration having a single metal region in the middle such as a (palladium and gold alloy)/gold/(concentration gradient region of gold and copper)/core material, a third configuration having a single metal region in the middle such as a single metal region of gold/(concentration gradient layer of palladium and gold)/palladium single metal region/(concentration gradient layer of palladium and copper), etc. may be mentioned.

In the first and third configurations, the single metal region of gold or other at the outermost surface assists the diffusion of the bonding interface and is thereby advantageous in obtaining a high bonding strength of the wedge bond, improving the productivity in low temperature connection, etc. In addition, in the first configuration, by effectively utilizing a large number of concentration gradient layers by a ternary system etc., an increase in the wire strength or a reduction in the resin deformation can also be expected. In the second configuration, the alloy part of the surface is advantageous for preventing sagging of the wire in formation of longer spans, improving the straightness, etc. In the third configuration, by having both palladium and gold present in single metal regions, if making the concentration gradient region thinner, the effect of improvement of the electrical characteristics can be further enhanced.

If viewing the concentration gradient, as a further improvement of the characteristics, in both the first and third configurations, the surface skin main metal palladium has positive and negative concentration gradients. As explained above, this promotes stabilization of the loop shape. Further, the second and third configuration are structured with a single metal region between the positive and negative concentration gradients of the surface skin main metal. Providing such a three-layer structure of a positive concentration gradient/single metal region/negative concentration gradient is more effective for stabilization against bending in loop formation, excessive plastic deformation in wedge bonding, or other wire deformation due to uneven external force.

With the illustrated combination, the functions can be improved even if palladium is switched with gold. The purity of the single metal of the surface covering layer is 99.9 mol % or more for one type of gold, palladium, platinum, rhodium, silver, and nickel. It is preferable that the impurities be suppressed to less than 0.1 mol %.

A bonding wire having a core material having copper as its main ingredient, a surface covering layer over the core material and of a conductive metal of a composition different from the core material, and further a surfacemost region, wherein the surface covering layer has as its main ingredient one or more types of metal selected from gold, palladium, platinum, rhodium, silver, and nickel, the surface covering layer has a portion of a concentration gradient of at least one type of main ingredient metal and copper in the wire radial direction inside it, and the surfacemost region has an alloy containing two or more types of gold, palladium, platinum, rhodium, silver, and nickel in a uniform concentration of 0.1 mol % or more is preferable. Here, by having an alloy containing two or more types of main ingredient metal in a uniform concentration of 0.1 mol % or more at the surface, the effect of raising the rigidity of the surface and suppressing wire deformation at the time of resin sealing is improved more. Further, it is not necessary to control the concentration gradient of the surface, so control during production becomes easy. Here, if the concentration of alloy is less than 0.1 mol %, the effect of improvement of the characteristics is small.

The reason why the concentration of two or more types of elements of gold, palladium, platinum, rhodium, silver, nickel, and copper is made 0.1 mol % or more is that this is advantageous for increasing the strength and thereby suppressing wire deformation at the time of resin sealing.

Regarding the configuration of the inside of the surface covering layer, if illustrating the change in the direction from the wire surface to the wire center by a platinum/gold type, a fourth configuration having a single metal region in the middle such as (concentration gradient region of platinum and gold)/gold/(concentration gradient region of gold and copper)/core material, a fifth configuration having (concentration gradient region of platinum and gold)/(concentration gradient region containing three elements of platinum, gold, and copper)/(concentration gradient region of gold and copper), etc. may be mentioned. The fourth configuration corresponds to the case of the above second configuration where the surface forms the concentration gradient region and gives the effects of improving ball bonding by surface modification, reducing damage to the wire surface at the time of loop control, etc. In the fifth configuration, effectively using the concentration gradient including the three elements enables a great improvement in strength to be achieved. With the illustrated combination, the functions can be improved even with a structure in which platinum and gold are switched. In the above example, if viewing the distribution of concentration of the gold element, by having positive and negative concentration gradients, promoting stabilization of characteristics, and controlling the length, change, etc. of the concentration gradients, the loop characteristics, wedge bondability, etc. may also be improved.

A bonding wire in which the surface covering layer is configured containing one or more types of surface skin main metal of gold, palladium, platinum, rhodium, silver, and nickel, further the outermost surface has a single metal region comprised of copper element separated from the copper forming the core material and formed on the surface by plating etc. or an alloy layer containing the copper element in an amount of 30 mol % or more, the surface covering layer has a concentration gradient of surface skin main metal and copper inside it, and the concentration gradient of the surface skin main metal both increases and decreases in the depth direction. Below, the copper element near the outermost surface will be referred to as "$copper_{out}$" and the copper element forming the core material will be referred to as "$copper_{in}$" to differentiate them.

The specific structure of the surface covering layer will be explained using a copper/gold type of ingredients as an example. When the outermost surface has a single metal region of $copper_{out}$ exposed at it, the configuration of the surface covering layer from the surface in the depth direction is shown by single metal region of $copper_{out}$/(concentration gradient layer 1 of $copper_{out}$ and gold)/single metal region of gold/(concentration gradient layer 2 of $copper_{in}$ and gold). If focusing on the copper element, the feature is that the outside (concentration gradient layer 1 of $copper_{out}$ and gold) and the inside (concentration gradient layer 2 of $copper_{in}$ and gold) are separated via a layer of gold alone. If comparing the concentration gradient of the copper element in the depth direction, at the (concentration gradient layer 1 of $copper_{out}$ and gold), the copper has a negative concentration gradient, while at the (concentration gradient layer 2 of $copper_{in}$ and gold), the copper inverts to a positive concentration gradient. Further, the gold element also has positive and negative concentration gradients mixed together. By the simultaneous inclusion of four types of concentration gradients in total comprised of the positive and negative concentration gradients of the two elements of copper and gold, higher effects can be obtained in improvement of the wedge bondability, wire strength, bending rigidity, etc. By having these four types of concentration gradients, it becomes possible to realize more superior advantages than a surface covering layer of a simple structure comprised of just the gold element and the copper element of the core material. Further, a similar effect of improvement can be obtained even when the single metal region of gold is consumed.

In addition, even when an alloy layer having concentration gradient layers of $copper_{out}$ and one or more types of elements of palladium, platinum, and nickel such as (concentration gradient layer 1 of $copper_{out}$ and old)/single metal region of gold/(concentration gradient layer 2 of $copper_{in}$ and gold) is exposed at the outermost surface, the bondability with gold plating can be improved. As an example of the method of production of such a wire structure, it is possible to first create an initial structure of $copper_{out}$/gold/$copper_{in}$ core material, then perform diffusion heat treatment etc. to form positive and negative concentration gradients of the copper element.

The above-mentioned structure of a surface covering layer was explained for a structure comprised of two types of elements, but if a structure increased in number of elements and having a greater number of concentration gradient layers, the applicability to complicated loop shapes in new type mounting, to fine wire connection, etc. can be further raised.

A third technique is a technique of obtaining a suitable composition of the copper alloy of the core material. Specifically, a bonding wire comprised of a core material having copper as its main ingredient and further containing one or more types of silver, tin, and gold in a total of 0.1 to 30 mass % and a surface covering layer formed over the core material, wherein the surface covering layer has at least one or more types of metal of gold, palladium, and platinum as its main ingredient and the surface covering layer has a concentration gradient of copper inside it is preferable. By making the core material a copper alloy including silver, tin, and gold, compared with the case of just copper alone, it is possible to suppress irregular shapes of the ball part etc. and achieve both an improvement of the circularity of the ball part bonded, an increase in the bonding strength, etc. Here, if the amount added is 0.1 mass % or more, the above improvement of the ball bondability can be realized at a mass production level, while if over 30 mass %, the hardening of the ball part causes the chip right under the bond to be damaged.

The surface covering layer preferably has a thickness of 0.03 μm or more. This is because if 0.03 μm or more, the wire as a whole can be formed uniformly, there will be little surface relief shapes, and there will be no problem of the surface covering layer peeling etc., so a sufficient effect can be obtained in suppression of oxidation, bondability, etc. Further, if 70% or less of the wire size, the industrial mass production ability will also be high and quality control etc. can be sufficiently handled. Regarding the lower limit of the thickness, preferably, if 0.1 μm or more, the effect of suppression of oxidation when exposed to a high temperature becomes higher, while more preferably, if 0.2 μm or more, analysis is possible relatively easily, so quality assurance etc. becomes easy and numerous other advantages accrue. On the other hand, as to the upper limit, preferably, if within 50% of the wire size, uniform formation of a layer of changing concentration at the inside becomes easy, while more preferably if within 30% of the wire size, the increase in the electrical resistance can be kept low and other advantages arise.

Regarding the analysis of the concentration of the surface covering layer, the technique of analysis while digging down in the depth direction from the surface of the wire by sputtering etc. or line analysis or point analysis at the wire cross-section are effective. The former is effective when the surface covering layer is thin, but when it becomes thicker, the measurement takes too long. The latter analysis of the cross-section is effective when the surface covering layer is thick and further has the advantage that analysis of the distribution of concentration at the cross-section as a whole, confirmation of reproducibility at several locations, etc. are relatively easy, but if the surface covering layer is thin, the precision falls. It is also possible to polish the wire at a slant to enlarge the thicknesses of the diffusion layers for analysis. At the cross-section, line analysis is relatively easy, but when desiring to improve the precision of analysis, it is effective to narrow the analysis intervals in line analysis or perform point analysis focusing on a region desired to be examined near the interface. For the analysis apparatus used for such concentration analysis, EPMA, EDX, Auger spectrometry, a transmission electron microscope (TEM), etc. may be utilized. Further, to examine the average structure etc., it is also possible to dissolve the surface part step by step by an acid etc. and find the composition of the dissolved parts from the concentration of ingredients contained in the solutions.

It is effective that the surface covering layer contain not only a concentration gradient, but also an intermetallic compound phase mainly comprised of copper and a conductive metal. That is, a bonding wire comprised of a core material mainly comprised of copper and a surface covering layer of a conductive metal wherein the surface covering layer contains a portion having a concentration gradient of copper and at least one layer of an intermetallic compound having copper and a conductive metal inside it gives superior characteristics. Having the intermetallic compound phase included in the surface covering layer increases the wire strength, modulus of elasticity, and other mechanical characteristics and is effective for improving the loop straightness, suppressing wire deformation at the time of sealing, etc. The intermetallic compound phase is mainly comprised of copper and a conductive metal. A total concentration of these of 80 mol % or more is preferable, but part of the alloying elements contained in core material or surface covering layer may also be contained. For example, as the intermetallic compound phase formed when the conductive metal is gold, palladium, platinum, etc., $CuAu_3$, $CuAu$, $Cu_3Au$, $Cu_3Pd$, $CuPd$, $Cu_3Pt$, $CuPt$, $CuPt_3$, $CuPt_7$, etc. are candidates. Having such an intermetallic compound phase formed at the surface covering layer or surface covering layer/core material interface is effective for improving the characteristics. The intermetallic compound phase preferably has a thickness from 0.001 µm to half of the thickness of the surface covering layer.

When the surface skin main metal forming the surface covering layer is gold, palladium, platinum, silver, or copper, by further including at least one type of Ca, Sr, Be, Al, and rare earth elements in a total of 1 to 300 mass ppm, the surface covering layer can be adjusted in strength, structure, and plastic deformation resistance, so the effect of controlling the deformation of the wire and the electrode material (Ag, Au, Pd, etc.) at the time of wedge bonding can be promoted. When the above-mentioned surface skin main metal has a concentration gradient, it is learned that the effect of addition of these elements has a great effect. Further, by the Ca, Sr, Be, Al, and rare earth element having a concentration gradient, a much higher effect can be obtained.

By having a core material having copper as its main ingredient include at least one type of Ca, Sr, Be, Al, and rare earth elements in a total of 1 to 300 mass ppm so as to adjust the wire structure or plastic deformation resistance, the effect of control of the wire and electrode material (Ag, Au, Pd, etc.) at the time of wedge bonding can be promoted. Further, when the above-mentioned surface skin main metal has a concentration gradient, it is learned that the effect of addition of these elements gives a great effect. Here, if the content is 1 mass ppm or more, the above effect appears, while if less than 300 mass ppm, any detrimental effect on oxidation at the time of ball formation can be suppressed. Further, by the Ca, Sr, Be, Al, and rare earth element having a concentration gradient, a much greater effect can be obtained.

By the core material having copper as its main ingredient containing one type or more of silver, tin, and gold in a total of 0.1 to 10 mass %, the wire can be increased in strength and wire deformation at the time of resin sealing can be reduced. Further, when the above-mentioned surface skin main metal has a concentration gradient, it was learned the effect of addition of these elements becomes greater. Here, when the content is 0.1 mass % or more, the above effect appears, while when over 10 mass %, the wire rises in electrical resistance which then becomes a problem. Further, by the Ca, Sr, Be, Al, and rare earth element having a concentration gradient, a much greater effect can be obtained.

Next, <2> a bonding wire having a surface covering layer with a concentration gradient of copper or a conductive metal wherein the surface covering layer is raised in concentration of copper at the surface region or copper is exposed at the surface ((8), (9), (17), (18), (20), (21), (25)) will be explained.

Note that in the explanation of the bonding wire of <2> below, the explanation relating to the definition of a concentration gradient, the interface between the surface covering layer and core material, the method of giving the surface covering layer a concentration gradient, the thickness of the surface covering layer, the fact that a continuous change of the concentration gradient in the surface covering layer is preferable from the viewpoint of productivity, quality stability, etc., the intermetallic compound phase included in addition to the concentration gradient at the surface covering layer, etc. is the same as the explanation of the bonding wire of <1>, so will be omitted.

The bonding wire of <2> of the present invention is comprised of a core material having copper as its main ingredient and a surface covering layer of a conductive metal of a composition different from the core material. However, with a simple two-layer structure of a core material of copper and a surface covering layer, the ball formation, bondability, loop control, etc. are not sufficient and the characteristics are sometimes degraded compared with even a single layer copper wire. Therefore, to improve the characteristics overall compared with a single layer copper wire, the surface covering layer of the present invention has a concentration gradient of copper inside it.

Further, with just a concentration gradient of copper, the productivity of the bonding wire process sometimes falls below that of the current mainstream gold bonding wire. Therefore, to improve the productivity to a level equal to or higher than that of gold bonding wire, the inventors discovered for the first time that it is effective for the surface covering layer to have copper exposed at its surface.

That is, this is a bonding wire comprised of a core material having copper as its main ingredient and a surface covering layer formed on the core material and of a conductive metal of a composition different from the core material, for example, a surface covering layer mainly comprised of a conductive metal other than copper, wherein the surface covering layer has a concentration gradient of copper inside it and the surface covering layer has a concentration of copper at its surface of 0.1 mol % or more.

The "conductive metal" is a metal other than copper and is preferably a metal with the effect of prevention of oxidation of the copper. As the conductive metal, at least one type of metal of gold, palladium, platinum, silver, and nickel is preferable. Among these, gold, palladium, platinum, and silver are preferable since they are high in conductivity and can handle the increasing higher speeds of semiconductor devices. Further, gold has much proven results in bondability with the sealing resin, bondability with the electrodes, etc., enables easy quality control, and has other advantages. Silver is relatively inexpensive, has little surface oxidation, gives good bondability with the Ag plating frequently used at the surface of the frame, and has other advantages. Palladium and platinum have the effect of stabilizing the ball shape.

The surface covering layer is comprised of a surface covering layer of copper and a conductive metal other than copper. The distribution of copper in the surface covering layer preferably has a concentration gradient of copper. Compared with the case where it is distributed uniformly in the layer as a whole, an improvement in the adhesion of the core material and surface covering layer and an improvement in the wedge bondability of the wire can be simultaneously achieved. Further, by the surface covering layer having a concentration gradient of copper inside it, even if the surface covering layer is made thin, the bondability can be sufficiently improved and as a result the effect can be obtained of reducing the concentration of the conductive metal contained in the ball parts and suppressing hardening of the ball parts. As opposed to this, when the surface covering layer does not have a concentration gradient where the copper is uniformly distributed inside it, it is difficult to simultaneously satisfy the prevention of oxidation, the improvement of the bondability, improvement of the close adhesion, suppression of ball hardening, and other numerous requested characteristics.

The definition of the concentration gradient is the same as in the explanation of the bonding wire of <1>, so will be omitted here.

This concentration gradient is preferably a region formed by diffusion of the conductive metal element and copper element. This is because if a layer formed by diffusion, the possibility of local peeling, cracking, or other defects will be low, formation of a continuous change in concentration will be easy, and there will be numerous other advantages.

The reason why the surface covering layer should have a concentration of copper at the surface of 0.1 mol % or more is that the surface covering layer and core part will both sufficiently melt and form a true spherical ball part so the ball bond will be high in strength and the wedge bondability will be good. As opposed to this, even if the surface covering layer contains a concentration gradient, when the surface does not have any copper, defects of irregular shape at the time of ball formation, the inside of the copper ball having copper wire remaining unmelted, and other problems cannot be solved. The surface covering layer more preferably has a concentration of copper at its surface of 3 mol % or more. This is because if 3 mol % or more, a sufficient effect of raising the bonding strength of the wedge bond can be obtained. More preferably, if 10 mol % or more, the sphericity of the ball part is improved. For example, even if forming a small ball of a size of 2.5 times or less the wire size, the sphericity will be good. Still more preferably, if 20 mol % or more, the arc discharge is stabilized, so the variations in ball size can be reduced. Here, the region of the surface is the region from 0.001 µm to half the thickness of the surface covering layer from the outermost surface in the depth direction. This is because the depth enabling stable quantitative analysis in Auger spectrometry or other analysis methods with a high spatial resolution is 0.001 µm or so and further, when considering the relationship between the Cu concentration of the surface and the characteristics, it was confirmed that to obtain the above-mentioned effect, the concentration of Cu up to a depth of half the thickness of the surface covering layer was important. Preferably, a range of 0.001 µm to 0.002 µm from the outermost surface is defined as the "surface" and the concentration of that region is treated as the above surface concentration. This is because the concentration of Cu of depth down to 0.002 µm further improves the ball formability.

If the surface covering layer has a concentration of copper at its surface of an upper limit of 90 mol % or less, the ball formability will be good. Further, if 80 mol % or less, the effect of suppression of the surface oxidation of the wire will be high. Even if allowed to stand in the atmosphere, the effect of suppression of deterioration of characteristics will be high. Further, if 70 mol % or less, a greater effect of increasing the strength at the time of wedge bonding is obtained.

Regarding the concentration gradient of the copper, the concentration of copper preferably changes decreasing in the direction from the core material side to the outermost surface. This is because by suppressing the concentration of copper at the surface and raising the concentration of copper at the interface of the core material and surface covering layer, it is possible to achieve both suppression of oxidation at the wire surface and improvement of the adhesion of the core material and surface covering layer. The wedge bondability, loop controllability, etc. can also be improved. Further, in addition to the concentration gradient of copper, the conductive metal preferably also has a concentration gradient opposite to the copper. This is because this improves the wire mechanical strength, modulus of elasticity, etc.

From the viewpoint of the productivity, quality stability, etc., it is preferable that the concentration gradient in the surface covering layer change continuously. That is, the extent of the slope of the concentration gradient need not necessarily be constant within the surface covering layer. It may also continuously change. For example, good characteristics can be obtained even if the slope of the change in concentration at the interface of the covering layer and core material, near the outermost surface, etc. differs from the inside of the covering layer or the concentration exponentially changes.

The surface covering layer having a region where the concentration of copper rises in the direction from the inside to the surface side at the region near the outermost surface is also effective as a concentration gradient. This is because a high concentration of copper at the outermost surface enables stabilization of arc discharge at the time of ball formation and stabilization of the ball shape and size and further because by keeping the concentration of copper low in a direction somewhat deep from the outermost surface, the wedge bondability can also be sufficiently secured. If combined with the above-mentioned inside concentration gradient, when viewing the change in copper concentration in the direction from the surface to the inside of the surface covering layer, it corresponds to the case where the concentration decreases (a negative concentration gradient) and the case where then the concentration increases (a positive concentration gradient).

In the structure of the surface covering layer, having an alloy layer of a constant concentration of copper formed near the surface and including a concentration gradient in the inside surface covering layer sometimes gives improved characteristics. This is because a region of a constant concentration of copper at the surface has the effect of stabilizing arc discharge and stabilizing the ball shape, dimensions, etc. Here, the "region near the surface" means the region of a depth of the 0.003 to 0.01 µm right below the above-mentioned surface region.

By having the surface of the surface covering layer formed with a thin Cu oxide, the adhesion with the sealing resin can be improved. The thickness of the Cu oxide is preferably 0.005 μm or less. This is because if over 0.005 μm, it causes a drop in the wedge bonding strength of the wire under a low temperature or other harsh conditions.

Regarding the surface covering layer formed on the core material having copper as its main ingredient, a surface covering layer comprised of an alloy layer or diffusion layer containing copper and a conductive metal is preferable.

Here, the explanation of the interface between the surface covering layer and core material is the same as the explanation for the bonding wire of <1>, so will be omitted.

Regarding the above-mentioned surface covering layer, if a bonding wire with a concentration of conductive metal in the wire as a whole of a total of 0.02 to 10 mol % in range, in addition to the improvement of the wedge bondability, bondability of the ball part can be secured. By controlling the concentration of conductive metal in the wire as a whole, it is believed possible to suppress the change in ball structure due to solid solution of the conductive metal or effect of diffusion on the bonding interface, so chip damage right under the ball bond can be reduced. On the other hand, if just forming the surface covering layer by a conductive metal and just making that layer thin, keeping the concentration of conductive metal in the wire as a whole low is difficult. With a concentration of conductive metal in the wire as a whole of a total of less than 0.01 mol %, overall satisfaction of the wedge bondability, loop control, etc. is difficult, while if over 10 mol %, chip damage becomes a problem and the unstable pressed shape of the ball due to formation of irregular shapes becomes a problem. Preferably, if the concentration of conductive metal is 0.03 to 2 mol % in range, the effect of reduction of damage to the chip at the time of bonding a large size ball is enhanced. More preferably, if 0.04 to 0.8 mol % in range, the effect of stabilizing the pressed shape of a small ball is enhanced.

The explanation of the thickness of the surface covering layer is the same as the explanation for the bonding wire of <1>, so will be omitted.

Regarding the distribution of elements forming the surface covering layer, if a bonding wire with copper concentrated at the crystal grain boundaries, it is possible to relatively easily provide products with a high industrial production ability while maintaining the overall usage performance. Regarding concentration of copper, concentration by 5% or more over the average concentration in the region of about 0.01 μm of the crystal grain boundaries is preferable. With the later explained methods of formation of a surface covering layer or surface layer, that is, plating, vapor deposition, etc., the phenomenon of copper concentrating at the crystal grain boundaries easily occurs. Control of the production conditions for avoiding this is complicated. On the other hand, for wedge bondability, loop control, ball formation, etc., it is confirmed that the effects of crystal grain boundary are almost nonexistent, so by obtaining a structure where copper is concentrated at the crystal grain boundaries, it is possible to improve productivity, yield, etc. and provide a relatively inexpensive wire.

The explanation of the method of analysis of the concentration of the surface skin is the same as the explanation for the bonding wire of <1>, so will be omitted.

The explanation regarding the inclusion of an intermetallic compound phase mainly comprised of copper and a conductive metal in addition to a concentration gradient in the surface covering layer is the same as the explanation for the bonding wire of <1>, so will be omitted.

When the surface skin main metal forming the surface covering layer is gold, palladium, platinum, silver, or copper, further inclusion of at least one type of element of Ca, Sr, Be, Al, and rare earth elements in a total of 1 to 300 mass ppm enables the surface covering layer to be adjusted in strength, structure, and plastic deformation resistance, so the effect of controlling the deformation between the wire and electrode material (Ag, Au, Pd, etc.) at the time of wedge bonding can be promoted. When the above-mentioned surface skin main metal has a concentration gradient, it was learned that the addition of these elements had a high effect. Further, by the Ca, Sr, Be, Al, and rare earth element having a concentration gradient, a much higher effect can be obtained.

By the core material having copper as its main ingredient containing one type or more of silver, tin, and zinc in a total of 0.02 to 30 mass %, the wire strength etc. increases and thereby the straightness of the loop in a long span is raised, wire deformation at the time of resin sealing is suppressed, and the requirements for thinner wire for narrower pitches can be handled. Normally, if the wire strength falls, the wedge bondability also falls in most cases, but with the addition of the above elements, both an increase in strength and improvement in wedge bondability can be achieved, so wire suitable for high density mounting can be provided.

Next, <3> a bonding wire controlled in thickness of the surface covering layer of the present invention ((10) to (17), (19) to (21), (26), (27)) will be explained. Note that this surface covering layer controlled in thickness will also be referred to as a "surface covering layer (outer covering layer)".

Note that in the explanation of the bonding wire of <3> below, the explanation of the fact that a continuous change of the concentration gradient in the surface covering layer (outer covering layer) is preferable from the viewpoint of the productivity, quality stability, etc., the method of analysis of the concentration of the surface covering layer (outer covering layer), etc. overlap the explanation of the bonding wire of <1>. Further, the explanation of the fact that the concentration gradient of copper is one where the concentration of copper decreases from the core material side to the outermost surface side, the concentration of copper at the crystal grain boundaries in the distribution of elements forming the surface covering layer (outer covering layer), etc. is the same as the explanation for the bonding wire of <2>. Therefore, the explanations will be omitted. However, in this case, in the explanations of the bonding wires of <1>, <2>, references to the "surface covering layer" should be deemed to mean the "surface covering layer (outer covering layer)".

The inventors studied bonding wire comprised of a core material having copper as its main ingredient and a covering layer containing a conductive metal and as a result learned that by including a conductive metal near the surface of the wire, improvement of wedge bondability, prevention of oxidation, etc. can be expected, but on the other hand, unstable ball formation, chip damage at the time of ball bonding, variations in loop shape, and other trouble sometimes occurs. Therefore, they tackled the development of copper wire able to handle not only the conventional general needs, but also new mounting needs such as connection of thick wire, narrow pitch small ball bonding, low temperature bonding, reverse bonding for connecting multilayer chips, etc., the increase of production margins, further improvements for suitability for mass production, etc. and discovered that control of the thickness, concentration distribution, etc. of the conductive metal layer, the region of concentration gradient, etc. is effective.

That is, a first aspect of the bonding wire of <3> of the present invention is a bonding wire for a semiconductor device having a core material having copper as its main ingredient and a surface covering layer (outer covering layer) over the core material and containing a conductive metal different from the core material in one or both of ingredients or composition and copper wherein the surface covering layer (outer covering layer) has a thickness of 0.001 to 0.02 μm.

The reason for the surface covering layer (outer covering layer) having a thickness of 0.02 μm or less is that if the surface covering layer (outer covering layer) has a thickness over 0.02 μm, residual unmelted parts of the ball tip, flat balls, or other defects will arise and therefore the ball sphericity will rapidly drop. This is believed caused by the differences in melting behavior between the surface covering layer (outer covering layer) and core part at the time of arc discharge. The ball shape is closely related to the thickness of the surface covering layer (outer covering layer) and changes at about 0.02 μm. If 0.02 μm or less, the inventors learned that it is possible to achieve both satisfactory ball formability and bondability for which simultaneous achievement had been considered difficult. Further, to secure stable sphericity even if the ball size is small, the surface covering layer (outer covering layer) preferably has a thickness of 0.015 μm or less. Still more preferably, if 0.01 μm or less, a great effect is obtained of suppressing hardening of the ball part and reducing chip damage right under the ball part. Further, regarding the lower limit of the thickness, if 0.001 μm or more, the above-mentioned effect of improvement of ball formation is obtained.

The "conductive metal" means a metal other than copper. It is preferably a metal having an effect of preventing oxidation of copper. As a conductive metal, at least one type of metal of gold, palladium, platinum, silver, and nickel is preferable. Among these, gold, palladium, platinum, and silver are desirable in that they have sufficient conductivity and enable the increasingly higher speeds of semiconductor devices to be handled. Further, gold has a long proven record in bondability with sealing resins and adhesion with electrodes, enables easy quality control, and has other advantages. Silver is relatively inexpensive, has little surface oxidation, gives good bondability with the Ag plating frequently used on frame surfaces, and has other advantages. Palladium and platinum have the effect of stabilizing the ball shape.

It is effective for the surface covering layer (outer covering layer) to be comprised of an alloy containing copper and a conductive metal and, further, for the surface covering layer (outer covering layer) to contain a thin region having a concentration gradient of a conductive metal inside it. That is, in addition to the above configuration, it is preferably a bonding wire where the surface covering layer (outer covering layer) has a region having a concentration gradient of a conductive metal of a thickness of 0.001 to 0.02 μm in the wire radial direction inside it. By the surface covering layer (outer covering layer) having a concentration gradient of a conductive metal inside it, the conductive metal can simultaneously improve the adhesion between the core material and outer covering layer and wedge bondability of the wire compared with the case where the surface covering layer (outer covering layer) has a uniform concentration as a whole. Regarding the efficacy of the adhesion, there is the effect it is possible to obtain a stable loop shape even with loop control complicatedly combining bending, curving, straightening, etc. of the wire and extend the replacement lifetime of the capillary reduced due to contamination, wear, etc. of the inside walls of the capillary accompanying the same. If the region having a concentration gradient of a conductive metal has a thickness of 0.02 μm or less, the strength of the wedge bond can be increased and the loop shape stabilized even with a short span of 1 mm or less, the replacement lifetime of the capillary can be made longer, and the mass production ability can be improved. On the other hand, if over 0.02 μm, an increase in the short span, high step difference connection, and other variations in loop height and capillary clogging or other defects is a concern.

The concentration gradient in the surface covering layer (outer covering layer) is preferably an extent of change of concentration in the depth direction of 10 mol % or more per μm. If this rate of change or more, the effects of improvement of the surface covering layer (outer covering layer) having a concentration gradient explained above can be expected, reproducible results can be obtained in terms of precision of quantitative analysis, etc. With a thin surface covering layer (outer covering layer) of a thickness 0.02 μm or less, while the impression is given that this value of concentration gradient is low, it is confirmed that such a gentle concentration gradient is effective in stabilizing the ball shape formed by gradual melting from the wire surface by arc discharge, in control of the bending angle of wire by complicated loop control, etc. If the value of the concentration gradient becomes higher, sometimes the effect becomes further higher. Preferably, if 10 mol % or more per 0.1 μm, high effects of mutual utilization of the different characteristics of the surface covering layer (outer covering layer) and core material without impairing either can be expected. More preferably, if 10 mol % or more per 0.01 μm, even if the surface covering layer (outer covering layer) has a thickness of 0.005 μm or less, high effects can be obtained simultaneously satisfying the requirements of increased strength of the wire and improvement of the bonding strength.

The region of the concentration gradient of the conductive metal does not necessarily have to be the surface covering layer (outer covering layer) as a whole and may also be partial. Further, when there are a plurality of conductive metals, if at least one type of conductive metal has a concentration gradient, an improvement in the bondability, loop control, or other characteristics can be obtained. The behavior of the concentration gradient differs depending on the conductive metal contained, so sometimes the characteristics can be further improved over the case of a single conductive metal. For example, by having one type of conductive metal with a remarkable concentration gradient and having other conductive metals mainly present at the outermost surface and low in concentration gradient, it is possible to improve contradictory performances such as bondability and prevention of oxidation.

A concentration gradient where the concentration falls from the surface toward the depth direction is advantageous for improving the bondability of the surface covering layer (outer covering layer) and core material. For the method of formation of this concentration gradient, a region formed by diffusion of a conductive metal element and copper element is preferable. This is because if a layer formed by diffusion, the possibility of occurrence of local peeling, cracks, or other defects is low, formation of a continuous change in concentration etc. are easy, and numerous other advantages accrue.

Regarding the concentration gradient of copper, the explanation of the fact that a change of the concentration of copper to decrease in the direction from the core material side to the outermost surface side is preferable is the same as the explanation for the bonding wire of <2>, so will be omitted.

The explanation that a continuous change of the concentration gradient in the outer covering layer is preferable from the viewpoint of the productivity, quality stability, etc. is the same as the explanation for the bonding wire of <1>, so will be omitted.

Formation of a thin film mainly comprised of a C element at the surface of the surface covering layer (outer covering layer) would also be effective for preventing the oxide film of the copper or conductive metal being formed thick. For formation of this C thin film, coating of a copper antirust agent would be effective. If for example thinly coating benzotriazole etc., it is possible to maintain the bondability while suppressing the oxidation.

The explanation of the fact that having the surface covering layer (outer covering layer) formed with thin Cu oxide on its surface can improve the adhesion with a sealing resin is the same as the explanation of the bonding wire of <2>, so will be omitted.

The explanation of the interface between the surface covering layer (outer covering layer) and core material is the same as the explanation of the bonding wire of <1>, so will be omitted.

If a bonding wire having a core material having copper as its main ingredient and a surface covering layer (outer covering layer) over the core material and having as its main ingredient a conductive metal of a composition different from the core material, wherein the surface covering layer (outer covering layer) has a region of a conductive metal of a concentration of 20 mol % or more and a thickness of 0.001 to 0.008 μm inside it, the great effect is obtained of achieving both a rise in wire tensile strength and an improvement in wedge bondability over a conventional copper wire. Here, if the region with a conductive metal concentration of 20 mol % or more has a thickness of less than 0.001 μm, the effect of increasing the tensile strength is not obtained, while if over 0.008 μm, flat balls and other ball shape defects increase. From this, judgment by the distribution of concentration of the conductive metal is useful for improvement of the bonding performance and also gives the advantages of the ability to easily obtain direct information by analysis and relatively ease of quality guarantee etc.

More preferably, if a bonding wire having a core material having copper as its main ingredient and a surface covering layer (outer covering layer) over the core material and having as a main ingredient a conductive metal of a composition different from the core material, wherein the surface covering layer (outer covering layer) has a region with a conductive metal concentration of 40 mol % or more of a thickness of 0.001 to 0.006 μm inside it, this is effective for raising the neck breakage strength in a pull test or suppressing surface oxidation. Due to the heat effect at the time of ball formation, the neck part drops in normal strength. As opposed to this, a layer of a conductive metal of a relatively high concentration of 40 mol % or more acts as a source of supply for diffusion of a conductive metal inside the wire in the process of the heat effect and is considered to raise the strength of the neck part. Further, as the merits of suppression of oxidation of the wire surface, the standards of sealing using an inert gas, deoxidizing agent, etc. and other measures which had been considered necessary at the time of shipment of conventional copper wire can be eased and ageing when left standing in the atmosphere can be suppressed, so the industrial production ability of the wire rises and the usage time can be extended. As grounds for the concentration and thickness, if a region of a concentration of 40 mol % or more, the above-mentioned action of supply for diffusion can be expected. Further, the effect of reducing the penetration of oxygen from the outside is high. Further, if that thickness is less than 0.001 μm, these effects of improvement are small, while if over 0.006 μm, flat balls and other ball shape defects increase.

If a bonding wire where the surface covering layer (outer covering layer) has a region of a constant concentration of conductive metal in the wire radial direction at its surface side of a thickness of 0.007 μm or less, the great effect is obtained of increasing the bonding strength of wedge bonding. For the region of the constant concentration, an average value of 60 mol % or more and a difference in concentration in a range of 0.001 μm or more suppressed to 5% or less are preferable. Regarding the grounds for this thickness, if the thickness is over 0.007 μm, irregular shapes easily occur at the time of ball formation. Regarding the action and effect, in application of heat at the time of bonding, in local heating by ultrasonic vibration, etc., it is believed that a region of a constant conductive metal concentration assists diffusion and therefore the bondability with the other member, that is, the electrode film, increases. The effect of the wedge bondability changes according to the combination of the material of the member to be bonded with and the conductive metal of the outer covering layer. When the electrode is Ag or Au and the conductive metal is Au or when the electrode is Pd and the conductive metal is Pd, the highest effect of improvement is obtained. Even when the electrode is Cu and the conductive metal is Au, Ag, or Pd, the effect is confirmed.

A second aspect of the bonding wire of <3> of the present invention is that if a bonding wire having a core material having copper as its main ingredient and a surface covering layer (outer covering layer) over the core material and having a conductive metal different from the core material and copper as main ingredients wherein the surface covering layer (outer covering layer) has inside it a maximum concentration of conductive metal of less than 40 mol % and a concentration gradient of conductive metal in the wire radial direction and the surface covering layer (outer covering layer) has a thickness of 0.001 to 0.02 μm in range, in addition to an improvement in the wedge bondability, stable loop formation becomes possible even with strict loop control such as a low loop short span or reverse direction connection, a good bondability is obtained with wire connection on a stud bump when connecting a chip, and other high effects are obtained. The outer covering layer in this case is characterized by a high Cu concentration with a low concentration of conductive metal suppressed in maximum concentration. The outer covering layer improves the effect of uniform dispersion of the work strain at the wire cross-section at the time of loop control. Further, the surface covering layer (outer covering layer) does not become an obstacle to diffusion for a Cu/Cu bond for wire connection of a bump. As examples of applications where a high action and effect are given by use of a surface covering layer (outer covering layer), there are applications which are difficult with conventional copper wire such as low loop formation of a maximum height of 100 μm or less, short spans of a wire length of 0.8 mm or less, and reverse direction connection (direction opposite to normal connection in structure connecting ball to board side and connecting wedge to electrode side on chip) required for connection of multilayer chips. As grounds for the concentration and thickness, if the maximum concentration of the conductive metal in a concentration gradient region is always less than 40 mol % and that low concentration surface covering layer (outer covering layer) has a thickness of 0.001 μm or more, the above action and effect can be sufficiently obtained. If over 0.02 μm, the ball formation becomes unstable, the bonding strength in wire connection on a bump falls, and other problems arise.

A third aspect of the bonding wire of <3> of the present invention is that if a bonding wire having a core material having copper as its main ingredient and a surface covering layer (outer covering layer) over the core material and having a conductive metal different from the core material and copper as its main ingredients, wherein the outermost surface has a copper concentration of 50 to 95 mol % in range, the surface covering layer (outer covering layer) has a concentration gradient in the wire radial direction inside it, and the surface covering layer (outer covering layer) has a thickness of 0.001 to 0.02 µm in range, in addition to the improvement of the wedge bondability, irregular deformation when ultrasonically bonding the ball is suppressed, the circularity of ball bonding is improved, and other high effects are obtained. This is believed to be because by raising the concentration of copper in the surface covering layer (outer covering layer), the arc discharge is made to concentrate at the wire tip and the melting at the surface covering layer (outer covering layer) and core part proceed substantially in parallel enabling unmelted parts to be suppressed and resulting in a uniform solidified structure as well. As grounds for the concentration and thickness, if the outermost surface has a copper concentration of 50 mol % or more, the arc discharge and melting behavior become stabilized, while if over 95 mol %, the effect of improvement by the conductive metal is not obtained much at all. Further, if the region having a concentration gradient of copper has a thickness of 0.001 µm, the above-mentioned action and effect are enhanced, while if over 0.02 µm, the wedge bondability at a low temperature of less than 200° C. drops.

Regarding the above-mentioned surface covering layer (outer covering layer), if a bonding wire with a concentration of conductive metal in the wire as a whole of a total of 0.002 to 0.3 mol % in range, in addition to the improvement of the wedge bondability, the high effect is obtained of suppression of hardening of the ball part and reduction of chip damage. The ball part of the copper wire tip is high in hardness and the work hardening at the time of deformation is high as well, so damage to the chip right under the ball bond is a problem in practice. By keeping the concentration of conductive metal in the wire as a whole low, even if the conductive metal is dissolved in the ball, the degree of hardening can be suppressed and chip damage can be prevented. Further, keeping the conductive metal concentration low is advantageous for reduction of the cost of the material. By providing a surface covering layer (outer covering layer) having a concentration gradient of a conductive metal and making that layer thin, it becomes possible to improve the wedge bondability or other characteristics and reduce the concentration of conductive metal in the wire as a whole. On the other hand, if just forming the surface covering layer (outer covering layer) by a conductive metal and making that layer thin, it is difficult to keep the concentration of conductive metal in the wire as a whole low. As grounds for the concentration and thickness of the surface covering layer (outer covering layer), a region with a concentration of conductive metal of less than 10 mol % has a small effect on the wedge bondability etc. If the region with a concentration of 10 mol % or more has a thickness of 0.01 µm or more, the above action and effect are sufficiently obtained. Stable formation industrially of an outer covering layer with a concentration of conductive metal in the wire as a whole of a total of less than 0.002 mol % is difficult. If over 0.3 mol %, when the electrode is an Al thin film, low-k dielectric film/Cu interconnect, or the like, damage to the chip or low-k film right under the ball increases.

Regarding the distribution of elements at the surface of the surface covering layer (outer covering layer) explained up to here, if a bonding wire with a weighted concentration of conductive metal or copper, in addition to the improvement of the wedge bondability, this is advantageous for formation of a ball with a good sphericity in formation of small balls. For example, it becomes possible to handle even the reduction of the pitch to 50 µm or less, the bonding of small balls of a pressed ball size of 2.3 times the wire size or less, etc. for which there are many issues involved in mass production even with general use gold wire and for which realization is considered even more difficult for copper wire. The weighted concentration structure may be regions of high concentrations of conductive metal or copper distributed in island forms seen microscopically or irregularly shaped high concentration regions. The degree of weighted concentration is preferably one giving a concentration difference of 10 mol % or more. That magnitude is preferable since it gives a distribution of concentration at the surface or in the depth direction in a range of 0.002 to 1 µm. Regarding the stabilization of the ball by this weighted concentration, the effect is high when the outer covering layer is thick, so it was confirmed that a sufficient action and effect could be obtained with any of the various bonding wires mentioned above having relatively thin surface covering layer (outer covering layer) structures according to the present invention. The mechanism of ball stabilization is not clear, but it is guessed that, as opposed to the phenomenon feared to occur in multilayer wires of the emission of electrons in arc discharge ending up spreading over a wide range of the surface covering layer (outer covering layer), the weighted concentrations of the conductive metal and copper cause the arc discharge to concentrate more at a certain region of the wire tip.

Regarding the distribution of elements forming the surface covering layer (outer covering layer), the concentration of copper at the crystal grain boundaries is the same as explained for the bonding wire of <2>, so the explanation will be omitted.

The method of analysis of the concentration of the surface covering layer (outer covering layer) is the same as explained for the bonding wire of <1>, so the explanation will be omitted.

In addition to concentration gradients in the surface covering layer (outer covering layer), inclusion of an intermetallic compound phase mainly comprised of copper and a conductive metal is also effective. That is, in a bonding wire comprised of a core material mainly comprised of copper and a surface covering layer (outer covering layer) of a conductive metal, wherein the surface covering layer (outer covering layer) contains inside it a portion having a concentration gradient of copper and at least one layer of an intermetallic compound having copper and a conductive metal and the surface covering layer (outer covering layer) has a concentration of copper at its surface of 0.1 mol % or more, superior characteristics are obtained. Having an intermetallic compound phase included in the outer covering layer is effective for increasing the wire strength, modulus of elasticity, and other mechanical characteristics, improving the loop straightness, suppressing wire deformation at the time of sealing, etc.

If the element with the highest concentration among the ingredients forming the core material is the "main ingredient", the main ingredient of the core material according to the present invention is copper. The material of the core material is copper or a copper alloy. The characteristics are improved by the ingredients and composition in the copper alloy.

By having the core material having copper as its main ingredient contain one or more types of additive elements selected from Ba, Ca, Sr, Be, Al, and rare earth elements and having the concentration of additive elements in the wire as a whole be a total of 0.001 to 0.03 mass % in range, the great effect is obtained of increasing the wire tensile strength and modulus of elasticity and reducing the resin deformation. This is advantageous for practical use for the increasingly thinner wires and narrower pitches. When the conductive metal forming the surface covering layer (outer covering layer) is gold, palladium, platinum, silver, or nickel, the ball melting causes the additive elements in the core material to act synergistically with the conductive metal and thereby give rise to the effect of further improving the circularity at the time of ball deformation. Regarding the effect if this addition, it was discovered that compared with the case of addition to a conventional copper wire not formed with any surface covering layer (outer covering layer), when the surface covering layer (outer covering layer) and the additive element are both used, the effect is promoted more. If the concentration of the additive elements is less than 0.001 mass %, the above effect of improvement is small, while if over 0.03 mass %, a shrinkage cavity will occur at the ball tip, the ball shape will become unstable, and even if the surface covering layer (outer covering layer) is made thin, improvement of the ball shape, bonding strength, etc. will be difficult.

By having the core material having copper as its main ingredient contain one or more types of additive elements of Au, Ag, Pt, Pd, Sn, or Zn and having the concentration of additive elements in the wire as a whole be a total of 0.001 to 0.3 mass % in range, it is possible to reduce breakage detachment etc. and thereby stabilize the bonding shape in wedge bonding on a BGA substrate etc. Further, this is also effective against resin deformation. By application to a core material part of a wire having the above-mentioned structure of an outer covering layer and core material, it is possible to satisfy the requirements of improvement of wedge bondability, stabilization of ball formability, etc. and possible to improve the overall characteristics over the case of addition to copper wire of a conventional single layer. If the concentration of the additive elements is less than 0.001 mass %, the above effect of improvement is small, while if over 0.3 mass %, the hardening of the ball causes chip damage or even if making the outer covering layer thinner, the ball shape, bonding strength, etc. are difficult to improve.

In the bonding wires <1>, <2>, and <3> of the present invention explained above, in producing the wire, the step of forming a core material and surface covering layer (including case of outer covering layer, same below) and the step of heat treatment for creating the concentration gradient in the surface covering layer and exposing copper element at the outermost surface become necessary.

As methods for forming a surface covering layer on the surface of a core material of copper, there are plating, vapor deposition, casting, etc. With plating, production is possible by either electroplating or electroless plating. With electroplating referred to as strike plating and flash plating, the plating rate is fast and the adhesion with the underlying material is good. The solutions used for electroless plating are classified into substitution types and reduction types. When the film is thin, even substitution type plating alone is sufficient, but when forming a thick film, it is effective to perform substitution type plating, then perform reduction type plating in stages. Electroless plating features simple equipment etc. and easy operation, but requires more time than the electroplating method.

In vapor deposition, sputtering, ion plating, vacuum vapor deposition, or other physical adsorption or plasma CVD or other chemical adsorption may be utilized. Each is a dry system, so the film need not be washed after formation and there is no concern over contamination of the surface at the time of washing etc.

Regarding the stage for performing the plating or vapor deposition, either the technique of forming a film of a conductive metal by the targeted wire size or the technique of forming a film on a large size core material, then drawing the wire several times to the targeted wire size would be effective. With formation of film by the final diameter of the former technique, production, quality control, etc. are simple, while the combination of film formation and drawing of the latter technique is advantageous for improving the adhesion of the film and core material. As specific examples of such methods of formation, the technique of continuously sweeping a copper wire of the targeted wire size in an electroplating solution while forming a film, the technique of dipping a thick copper wire in an electroplating or electroless plating bath to form a film, then drawing the wire to obtain the final size, etc. are possible.

When the surface covering layer forms a plurality of layers comprised of two or more types of surface skin main metals, the plurality of layers of different surface skin main metals are formed in stages by plating, vapor deposition, casting, etc. At that time, the method of forming all of the different surface skin main metals, then heat treating them, the method of alternately forming one layer of surface skin main metal and performing heat treatment, etc. are effective.

When using the surface covering layer and core material formed by the above techniques, diffusion heat treatment is effective as (i) the process of forming a concentration gradient of one or both of the main ingredient metal or copper in the surface covering layer or (ii) the process of forming a concentration gradient of copper in the surface covering layer and exposing copper at the outermost surface. This is heat treatment for assisting the mutual diffusion of the copper and conductive metal at the interface of the surface covering layer and core material. The method of continuously sweeping the wire while heat treating it is superior in productivity and quality stability. However, with just simple heating of the wire, it is not possible to control the distribution of copper at the surface and at the inside of the surface covering layer. Even if applying the work stress relief annealing used for usual wire production as it is, the drop in the adhesion between the surface covering layer and core material would result in unstable loop control, buildup of wire cut scraps inside the capillary thereby clogging the same, oxidation of the copper exposed at the surface and a drop in the bonding strength, and other problems difficult to completely resolve. Therefore, control of the temperature, speed, time, etc. of the heat treatment is important.

As a preferable heat treatment method, by continuously sweeping the wire while heat treating it and further giving a temperature gradient in the furnace rather than make the temperature in the furnace constant like in general heat treatment, mass production of wire having a surface covering layer and core material characterizing the present invention becomes easy. In a specific case, there is the method of locally introducing a temperature gradient, the method of changing the temperature in the furnace, etc. When suppressing surface oxidation of the wire, it is effective to run $N_2$, Ar, or another inert gas in the furnace while heating.

In the temperature gradient system, giving a gradient to the temperature in a plurality of regions, such as a positive temperature gradient near the furnace entrance (rise in temperature with respect to sweep direction of wire), a stable temperature region, and a negative temperature gradient near the furnace exit (fall in temperature with respect to sweep direction of wire), is effective. Due to this, by improving the adhesion without allowing peeling between the surface covering layer and core material near the furnace entrance, promoting diffusion between the copper and conductive metal to obtain the desired concentration gradient in the stable temperature region, and further suppressing excessive oxidation of copper at the surface near the furnace exit, it is possible to improve the bondability, loop controllability, etc. of the obtained wire. To obtain this effect, provision of a temperature gradient at the entry and exit of 1° C./mm (10° C./cm) or more is preferable.

In the method of changing the temperature, it is effective to divide the inside of the furnace into a plurality of regions and control the temperature differently in each region so as to create a distribution of temperature. For example, by dividing a furnace into three or more locations, independently controlling the temperature there, and making the two ends of the furnace lower in temperature than the center, similar effects of improvement as the case of a temperature gradient can be obtained. Further, to suppress surface oxidation of the wire, it is possible to make the two ends of the furnace or the exit side a low temperature with a slow rate of oxidation of copper so as to obtain a rise in the bonding strength of the wedge bond.

Such heat treatment with a temperature gradient or temperature distribution is preferably performed at the final wire size in terms of productivity, but on the other hand drawing the wire after heat treatment gives the effects of removing the oxide film on the surface and improving the bondability at low temperatures and, further, reducing wire shaving inside the capillary due to the joint use of drawing and stress relief annealing.

Further, casting is the technique of melting and pouring either the surface covering layer or core material. Connecting the surface covering layer and core material by a thick size of 1 to 50 mm or so, then drawing the wire is excellent in productivity. Compared with plating and vapor deposition, design of the alloy ingredients of the surface covering layer is easier, improvement of the strength, bondability, or other characteristics is also easy, and other advantages arise. Specific processes may be divided into a method of casting molten conductive metal around a core wire prepared in advance so as to form a surface covering layer and a method of using a hollow tube of a conductive metal prepared in advance and casting molten copper or copper alloy into its center to form a core wire. The latter method of casting a core material of copper inside a hollow tube enables easy and stable formation of a concentration gradient of copper in the surface covering layer. Here, if including a small amount of copper in a surface covering layer prepared in advance, control of the concentration of copper at the surface of the surface covering layer becomes easy. Further, with casting, the work of heat treatment for causing diffusion of Cu at the surface covering layer can be eliminated, but performing heat treatment to adjust the distribution of Cu in the surface covering layer can be expected to further improve the characteristics.

Further, when utilizing such molten metal, production of at least one of the core wire and surface covering layer by continuous casting becomes possible. Due to this continuous casting method, compared with the above casting method, the process is simplified and further the wire size is reduced and the productivity is improved.

Note that in the bonding wire of <I>, as the method for forming a single metal region of the surface skin main metal of gold, palladium, platinum, rhodium, silver, or nickel on the surface of or inside the surface covering layer, it is effective to form two layers of single metal regions comprised of different surface skin main metal on the surface of the core material and utilize diffusion heat treatment for forming the concentration gradient and establish suitable heat treatment conditions so as to leave the single metal regions at the surface or inside.

Further, as another technique for forming a single metal region on the surface of a surface covering layer, it is also possible to perform diffusion heat treatment, then newly form a single metal region by the above-mentioned plating, vapor deposition, etc. To improve the adhesion of this single metal region with the underlying material, it is also effective to perform further heat treatment after forming the single metal region.

As one technique for forming a surfacemost region comprised of copper alone or an alloy containing 30 mol % or more copper, it would be effective to form on the surface of the core material a layer comprised of one or more types of metal selected from gold, palladium, platinum, rhodium, silver, and nickel, further form on that surface a copper layer, then form two layers of single metal regions comprised of different surface skin main metal on the surface of the core material and perform diffusion heat treatment under suitable conditions. For the process of formation of the gold, palladium, platinum, rhodium, silver, and nickel layer and copper layer here, the above-mentioned plating, vapor deposition, casting, etc. is used.

EXAMPLES

Below, examples will be explained.

<1> Bonding Wire: Examples 1 to 78

As the materials of the bonding wire, for the copper used for the core material, a material of a high purity of approximately 99.99 mass % or more was used, while for the materials of the Au, Pt, Pd, Cu, Ag, Ni, and Rh of the outer periphery, materials of a purity of 99.9 mass % or more were prepared.

Copper wire reduced to a certain wire size was used as the core material. To form a layer of a different metal on that wire surface, electroplating, electroless plating, vapor deposition, casting, etc. was performed. To form a concentration gradient, heat treatment was performed. When forming a surface covering layer by the final wire size, the method was utilized of forming the outer covering layer by a certain wire size, then further drawing the wire to reduce it to the final wire size. For the electroplating solution and the electroless plating solution, plating solutions commercially available for semiconductor applications were used. For the vapor deposition, the sputtering method was used. Wire of a diameter of approximately 50 to 200 μm was prepared in advance, the wire surface was covered by vapor deposition, plating, etc., the wire was drawn to the final diameter of 15 to 25 μm, then finally the working stress was removed and heat treatment was performed to obtain an elongation value of 4% or so. In accordance with need, the wire was drawn to a wire size of 30 to 100 μm, then given heat treatment for diffusion and then further drawn.

When utilizing casting, the method of casting molten metal around a core wire prepared in advance or the method of casting molten copper or copper alloy in the center of a hollow tube prepared in advance was employed. The diameter of the core wire was approximately 3 to 8 mm, while the diameter of the outer periphery was approximately 5 to 10 mm. After that, this was forged, rolled, drawn, or otherwise worked and heat treated to produce the wire. Further, to form a plurality of layers, the composite method was performed of forming another layer on the surface of an intermediate product formed by the casting method by electroplating, electroless plating, vapor deposition, etc.

For the heat treatment of the wires of the invention examples, the wires were heated while being continuously swept. A system locally introducing a temperature gradient, a system changing the temperature inside the furnace, etc. was employed. The temperature difference was made 30 to 200° C. in range, the temperature distribution, wire sweep rate, etc.

were made suitable, and the tensile elongation was adjusted to 4% or so. For the atmosphere of the heat treatment, in addition to the air, $N_2$, Ar, or other inert gas was also utilized for the purpose of suppressing oxidation. Regarding the heat treatment processes of the comparative examples, samples were prepared for two cases: the case of heating treating the drawn Cu wire, then forming a plating layer (Comparative Examples 2, 4, 7, and 8) and the case of heat treating the wire two times: after drawing and after formation of the plating layer (Comparative Examples 3 and 6).

The wire tensile strength and modulus of elasticity were found by running tensile tests on five wires of lengths of 10 cm and finding the average values.

For connecting the bonding wire, a commercially available automatic wire bonder was used for ball/wedge bonding. Arc discharge was used to prepare a ball at the wire tip (initial ball size: 35 to 50 µm), this was joined to an electrode film on a silicon substrate, and the other end of the wire was wedge bonded on a lead terminal. To suppress oxidation at the time of ball melting, the wire tip was sprayed with $N_2$ gas while performing the electrodischarge.

As the other member bonded to, the material of the electrode film on the silicon substrate, that is, an Al alloy film of a thickness of 1 µm (Al-1% Si-0.5% Cu film, Al-0.5% Cu film) was used. On the other hand, as the other member for wedge bonding, a lead frame plated on its surface with Ag plating (thickness: 1 to 4 µm) or a resin substrate of an electrode structure of Au plating/Ni plating/Cu was used.

For the loop shape stability in the bonding process, two types of bonding samples were prepared: wire lengths of 3 mm and a 5 mm. 500 wires were observed by a projector for each and the wire straightness, variations in loop height, etc. were judged. With the conditions of a wire length of a long 5 mm, the loop control becomes stricter. With a wire length of 3 mm, when there were defects in straightness, loop height, etc. in five wires or more, it was judged there was a problem and the "X" mark was assigned; with a wire length of 3 mm, when there were defects in two to four wires and, with a wire length of 5 mm, when there were defects in five or more wires, it was judged that improvement was needed and the "Δ" mark was assigned; with a wire length of 3 mm, when there was a defect in one wire or no defect and, with a wire length of 5 mm, when there were defects in two to four wires, the loop shape was relatively good, so the "○" mark was assigned; while with a wire length of 5 mm, when there was a defect in one wire or no defect, it was judged that the loop shape was stable and the "⊚" mark was assigned. As causes of defects, insufficient adhesion at the interface between the core wire and outer periphery, fluctuations in characteristics in a cross-section, etc. may be considered.

The deformation of the wire at the time of resin sealing (resin deformation) was measured by preparing bonding samples of wire lengths of 5 mm, sealing them by a commercially available epoxy resin, then using a soft X-ray nondestructive inspection apparatus to measure the amounts of deformation of the parts with the greatest wire deformation for 20 wires. That average value divided by the wire span length (percentage) was used as the wire deformation rate at the time of sealing. When this wire deformation rate was 6% or more, it was judged that the result was defective and the "X" mark was assigned, when 4% to less than 6%, improvement was needed, so the "Δ" mark was assigned, when 2.5% to less than 4%, it was judged that there was no problem in practice and the "○" mark was assigned, and when less than 2.5%, the reduction of wire deformation was good, so the "⊚" mark was assigned.

For observation of the initial ball shape, balls before bonding were observed for 20 wires and a judgment made as to if the shapes were true spheres and if the dimensional accuracy was good. When abnormal shape balls were formed for two or more wires, it was judged that the result was defective and the "X" mark was assigned, when there were irregular shapes for two or less wires, but the number of wires where the ball position was remarkably offset from the wire was five or more, the "Δ" mark was assigned, when there was offset in two to four wires, but it was judged there was no great problem in practice, the "○" mark was assigned, and when there was offset in one wire or no offset and the dimensional accuracy was also good, the ball formation was good, so the "⊚" mark was assigned.

For judgment of the bonded shape of the pressed ball, bonded balls were observed for 500 wires and the circularity of the shape, dimensional accuracy, etc. were evaluated. Conditions giving a pressed ball size of 2 to 3 times the wire size in range were selected. When there were anisotropy or elliptical shapes of a large offset from a true circle or other defective ball shapes in five wires or more, it was judged that the result was defective and the "X" mark was assigned, when there were defective ball shapes in two to four wires or petal defects or other defects at the outer periphery of the ball pressed parts in eight wires or more, improvement was needed and the "Δ" mark was assigned, when there was a defective ball shape in one wire or no defect and there was petal shaped deformation in three to seven wires, it was judged the level was not a problem in practice and "○" mark was assigned, and when there was petal shaped deformation in two wires or less, the result was good, so the "⊚" mark was assigned.

For evaluation of the strength of the neck part, the breakage load (pull strength) of 20 wires was measured by a pull test moving a hook attached to the bottom of a loop upward and reading the breakage strength. The hook position may be changed in accordance with the measurement location. To evaluate the strength of the neck part, the pull test was performed near the ball bond (neck pull strength). To evaluate the strength of the wedge bond, the pull strength was measured near about ¼ of the wire span from the wedge bond. When the neck pull strength is 60% or more of the wire strength, the result is good, so the "⊚" mark was assigned, when less than 40%, improvement is needed, so the "Δ" mark was assigned, and when in the middle of that, the "○" mark was assigned.

For judgment of the wedge bondability for bonding wire to the lead side, since bonding becomes more difficult the lower the temperature, 1000 wires each were bonded at stage temperatures of low temperatures of 220° C. and 180° C. and the continuous workability, wire deformation shape, etc. were examined. When complete detachment occurred at the bond in two or more wires at 220° C., the "X" mark was assigned, when complete detachment occurred at less than two wires at 220° C. and partial detachment occurred near wire breakage, improvement was needed, so the "Δ" mark was assigned, when there were no defects at 220° C. and, further, there was complete detachment at one wire or not at all at 180° C., the "○" mark was assigned, and when there was no complete detachment at 180° C. and there was partial detachment at less than three wires, the "⊚" mark was assigned.

For evaluation of the pull strength of wedge bonds, the bondability of the bonding interface was judged by running pull tests for samples of a wire length of 3 mm near the wedge bonds and finding the average value for 20 wires.

Tables 1 to 10, 13, and 14 show the results of evaluation of copper bonding wire according to the present invention, while Tables 11 and 12 show comparative examples.

TABLE 1

| | Test No. | Main ingredient elements | Surface covering layer thickness (d/μm) | Concentration of surface-most surface (mol %) | Concentration in concentration gradient layer near surface (mol %) | Measurement portion of left concentration (depth from surface) | Concentration of intermediate layer (mol %) | Measurement portion of left concentration (depth from surface) |
|---|---|---|---|---|---|---|---|---|
| Inv. ex. | 1 | Au, Pd | 0.02 | Au: 100 | Au: 80, Pd: 20 | 0.1 d | Pd: 100 | 0.5 d |
| | 2 | Au, Pd | 0.05 | Au: 100 | Au: 75, Pd: 25 | 0.2 d | Pd: 100 | 0.5 d |
| | 3 | Au, Pd | 0.5 | Au: 100 | Au: 27, Pd: 73 | 0.35 d | Pd: 100 | 0.5 d |
| | 4 | Au, Pd | 1.5 | Au: 100 | Au: 45, Pd: 55 | 0.3 d | Pd: 100 | 0.5 d |
| | 5 | Au, Pd | 0.1 | Pd: 100 | Pd: 68, Au: 32 | 0.2 d | Au: 100 | 0.53 d |
| | 6 | Au, Pd | 0.3 | Pd: 100 | Pd: 55, Au: 45 | 0.25 d | Au: 100 | 0.5 d |
| | 7 | Au, Pd | 1 | Pd: 100 | Pd: 70, Au: 30 | 0.2 d | Au: 100 | 0.45 d |
| | 8 | Au, Pt | 0.05 | Au: 100 | Au: 52, Pt: 48 | 0.3 d | Pt: 100 | 0.5 d |
| | 9 | Au, Pt | 0.3 | Au: 100 | Au: 63, Pt: 37 | 0.2 d | Pt: 100 | 0.5 d |
| | 10 | Au, Pt | 1 | Au: 100 | Au: 53, Pt: 47 | 0.2 d | Pt: 100 | 0.45 d |
| | 11 | Au, Pt | 0.02 | Pt: 100 | Pt: 38, Au: 62 | 0.3 d | Au: 100 | 0.5 d |
| | 12 | Au, Pt | 0.1 | Pt: 100 | Pt: 65, Au: 35 | 0.3 d | Au: 100 | 0.5 d |
| | 13 | Pd, Pt | 0.7 | Pd: 100 | Pd: 15, Pt: 85 | 0.4 d | Pt: 100 | 0.6 d |
| | 14 | Pd, Pt | 2.5 | Pt: 100 | Pt: 37, Pd: 63 | 0.35 d | Pd: 100 | 0.5 d |
| | 15 | Au, Ni | 0.1 | Au: 100 | Au: 18, Ni: 82 | 0.3 d | Ni: 100 | 0.5 d |

| | Test No. | Concentration in concentration gradient layer of deep part from intermediate layer (mol %) | Measurement portion of left concentration (depth from surface) | Inter-metallic compounds observed | Production method A: Electroless B: Electro-plating C: Vapor deposition D: Casting | Wire size/ μm |
|---|---|---|---|---|---|---|
| Inv. ex. | 1 | Pd: 72, Cu: 28 | 0.8 d | — | A | 20 |
| | 2 | Pd: 54, Cu: 46 | 0.75 d | — | B | 25 |
| | 3 | Pd: 35, Cu: 75 | 0.85 d | Cu₃Pd | B | 25 |
| | 4 | Pd: 80, Cu: 20 | 0.8 d | — | B | 25 |
| | 5 | Au: 42, Cu: 58 | 0.8 d | — | B | 25 |
| | 6 | Au: 25, Cu: 75 | 0.85 d | — | B | 20 |
| | 7 | Au: 48, Cu: 52 | 0.7 d | AuCu | B | 25 |
| | 8 | Pt: 31, Cu: 69 | 0.8 d | — | A | 25 |
| | 9 | Pt: 27, Cu: 73 | 0.8 d | — | B | 25 |
| | 10 | Pt: 24, Cu: 76 | 0.7 d | Cu₃Pt | D | 25 |
| | 11 | Au: 33, Cu: 67 | 0.8 d | — | C | 25 |
| | 12 | Au: 26, Cu: 74 | 0.8 d | — | D | 25 |
| | 13 | Pt: 58, Cu: 42 | 0.7 d | — | B | 25 |
| | 14 | Pd: 38, Cu: 62 | 0.8 d | — | D | 25 |
| | 15 | Ni: 25, Cu: 75 | 0.8 d | — | B | 25 |

TABLE 2

(Continuation 1 of Table 1)

| | Test No. | Tensile strength/ MPa | Elongation/% | Initial ball formability | Pressed ball bonded shape | Neck part pull strength | Loop shape stability | Wire deformation at resin sealing | Wedge bonding material | Wedge bondability | Wedge bond pull strength/ MPa |
|---|---|---|---|---|---|---|---|---|---|---|---|
| Inv. ex. | 1 | 223 | 4 | ◎ | ◎ | ◎ | ◎ | ○ | Ag | ◎ | 152 |
| | 2 | 232 | 4 | ◎ | ◎ | ◎ | ◎ | ○ | Ag | ◎ | 155 |
| | 3 | 234 | 4 | ◎ | ◎ | ◎ | ◎ | ◎ | Au | ◎ | 156 |
| | 4 | 248 | 4 | ◎ | ◎ | ◎ | ◎ | ○ | Ag | ◎ | 158 |
| | 5 | 225 | 4 | ◎ | ◎ | ◎ | ◎ | ○ | Au | ◎ | 145 |
| | 6 | 228 | 3.5 | ◎ | ◎ | ◎ | ◎ | ○ | Ag | ◎ | 147 |
| | 7 | 233 | 4 | ◎ | ◎ | ◎ | ◎ | ◎ | Ag | ◎ | 146 |
| | 8 | 230 | 4 | ◎ | ◎ | ◎ | ◎ | ○ | Ag | ◎ | 152 |
| | 9 | 233 | 4 | ◎ | ◎ | ◎ | ◎ | ○ | Ag | ◎ | 155 |
| | 10 | 229 | 4 | ◎ | ◎ | ◎ | ◎ | ◎ | Ag | ◎ | 157 |
| | 11 | 240 | 4 | ◎ | ◎ | ◎ | ◎ | ○ | Ag | ◎ | 158 |
| | 12 | 234 | 4 | ◎ | ◎ | ◎ | ◎ | ○ | Pd | ◎ | 155 |

TABLE 2-continued (Continuation 1 of Table 1)

| Test No. | Wire mechanical characteristics Tensile strength/ MPa | Elongation/% | Initial ball formability | Pressed ball bonded shape | Neck part pull strength | Loop shape stability | Wire deformation at resin sealing | Wedge bonding material | Wedge bondability | Wedge bond pull strength/ MPa |
|---|---|---|---|---|---|---|---|---|---|---|
| 13 | 242 | 4 | ◉ | ◉ | ◉ | ◉ | ○ | Ag | ◉ | 148 |
| 14 | 248 | 4 | ◉ | ◉ | ◉ | ◉ | ○ | Au | ◉ | 145 |
| 15 | 258 | 4 | ◉ | ◉ | ◉ | ◉ | ○ | Ag | ◉ | 158 |

TABLE 3

(Continuation 2 of Table 1)

| | Test No. | Main ingredient elements | Surface covering layer thickness (d/μm) | Concentration of surface-most surface (mol %) | Concentration in concentration gradient layer near surface (mol %) | Measurement portion of left concentration (depth from surface) | Concentration of intermediate layer (mol %) | Measurement portion of left concentration (depth from surface) |
|---|---|---|---|---|---|---|---|---|
| Inv. ex. | 16 | Au, Ni | 0.3 | Ni: 100 | Ni: 57, Au: 43 | 0.2 d | Au: 100 | 0.5 d |
| | 17 | Pd, Ni | 0.7 | Pd: 100 | Pd: 28, Ni: 72 | 0.3 d | Ni: 100 | 0.6 d |
| | 18 | Pd, Ni | 0.4 | Ni: 100 | Ni: 47, Pd: 53 | 0.25 d | Pd: 100 | 0.5 d |
| | 19 | Pt, Ni | 0.1 | Pt: 100 | Pt: 70, Ni: 30 | 0.2 d | Ni: 100 | 0.5 d |
| | 20 | Pt, Ni | 0.3 | Ni: 100 | Ni: 22, Pt: 78 | 0.3 d | Pt: 100 | 0.5 d |
| | 21 | Au, Pd | 0.1 | Au: 100 | Au: 26, Pd: 74 | 0.3 d | Pd: 100 | 0.55 d |
| | 22 | Au, Pd | 0.3 | Au: 100 | Au: 43, Pd: 57 | 0.25 d | Pd: 100 | 0.5 d |
| | 23 | Au, Ag | 1.5 | Au: 100 | Au: 50, Ag: 50 | 0.3 d | Ag: 100 | 0.5 d |
| | 24 | Ag, Pt | 0.1 | Pt: 100 | Pt: 32, Ag: 68 | 0.3 d | Ag: 100 | 0.5 d |
| | 25 | Ag, Pd | 0.5 | Ag: 100 | Ag: 63, Pd: 37 | 0.2 d | Pd: 100 | 0.5 d |
| | 26 | Ag, Pd | 0.5 | Pd: 100 | Pd: 45, Ag: 55 | 0.3 d | Ag: 100 | 0.5 d |
| | 27 | Au, Rh | 0.7 | Rh: 100 | Rh: 72, Au: 28 | 0.4 d | Au: 100 | 0.5 d |
| | 28 | Pt, Rh | 0.6 | Pt: 100 | Pt: 26, Rh: 74 | 0.35 d | Rh: 100 | 0.6 d |
| | 29 | Pt, Rh | 0.2 | Rh: 100 | Rh: 72, Au: 28 | 0.35 d | Pt: 100 | 0.5 d |

| | Test No. | Surface covering layer Concentration in concentration gradient layer of deep part from intermediate layer (mol %) | Measurement portion of left concentration (depth from surface) | Inter- metallic compounds observed | Production method A: Electroless B: Electro- plating C: Vapor deposition D: Casting | Wire size/ μm |
|---|---|---|---|---|---|---|
| Inv. ex. | 16 | Au: 57, Cu: 43 | 0.7 d | — | A, B | 25 |
| | 17 | Ni: 22, Cu: 78 | 0.8 d | — | B | 25 |
| | 18 | Pd: 33, Cu: 67 | 0.8 d | — | D | 25 |
| | 19 | Ni: 54, Cu: 46 | 0.75 d | — | A | 20 |
| | 20 | Pt: 38, Cu: 68 | 0.8 d | — | D | 25 |
| | 21 | Pd: 12, Cu: 88 | 0.8 d | — | A, C | 25 |
| | 22 | Pd: 36, Cu: 64 | 0.8 d | — | B | 25 |
| | 23 | Ag: 48, Cu: 52 | 0.7 d | — | A | 25 |
| | 24 | Ag: 63, Cu: 37 | 0.85 d | — | B | 25 |
| | 25 | Pd: 40, Cu: 60 | 0.7 d | — | B | 25 |
| | 26 | Ag: 45, Cu: 55 | 0.7 d | — | B | 25 |
| | 27 | Au: 32, Cu: 68 | 0.8 d | — | A, D | 25 |
| | 28 | Rh: 45, Cu: 55 | 0.7 d | — | B | 25 |
| | 29 | Rh: 22, Cu: 78 | 0.7 d | — | B | 25 |

TABLE 4

(Continuation 3 of Table 1)

|  | Test No. | Wire mechanical characteristics | | Initial ball formability | Pressed ball bonded shape | Neck part pull strength | Wire | | | Wedge bonding material | Wedge bondability | Wedge bond pull strength/ MPa |
|---|---|---|---|---|---|---|---|---|---|---|---|---|
|  |  | Tensile strength/ MPa | Elongation/% |  |  |  | Loop shape stability | deformation at resin sealing | Wedge bonding material |  |  |  |
| Inv. ex. | 16 | 268 | 4 | ◎ | ◎ | ◎ | ◎ | ○ | Ag | ◎ | 130 |
|  | 17 | 263 | 4 | ◎ | ◎ | ◎ | ◎ | ○ | Au | ◎ | 142 |
|  | 18 | 269 | 4 | ◎ | ◎ | ◎ | ◎ | ○ | Ag | ◎ | 132 |
|  | 19 | 258 | 3.5 | ◎ | ◎ | ◎ | ◎ | ○ | Ag | ◎ | 144 |
|  | 20 | 265 | 4 | ◎ | ◎ | ◎ | ◎ | ○ | Pd | ◎ | 130 |
|  | 21 | 248 | 4 | ◎ | ◎ | ◎ | ◎ | ○ | Ag | ◎ | 148 |
|  | 22 | 245 | 4 | ◎ | ◎ | ◎ | ◎ | ○ | Au | ◎ | 152 |
|  | 23 | 257 | 4 | ◎ | ◎ | ◎ | ◎ | ○ | Ag | ◎ | 155 |
|  | 24 | 248 | 4 | ◎ | ◎ | ◎ | ◎ | ○ | Ag | ◎ | 138 |
|  | 25 | 256 | 4 | ◎ | ◎ | ◎ | ◎ | ○ | Ag | ◎ | 154 |
|  | 26 | 252 | 4 | ◎ | ◎ | ○ | ◎ | ○ | Pd | ◎ | 142 |
|  | 27 | 260 | 4 | ◎ | ◎ | ○ | ◎ | ○ | Ag | ◎ | 138 |
|  | 28 | 254 | 4 | ◎ | ◎ | ○ | ◎ | ○ | Au | ◎ | 137 |
|  | 29 | 250 | 4 | ◎ | ◎ | ○ | ◎ | ○ | Ag | ◎ | 135 |

TABLE 5

|  | Test No. | Surface covering layer | | | | | | |
|---|---|---|---|---|---|---|---|---|
|  |  | Main ingredient elements | Surface covering layer thickness (d/μm) | Concentration of surface-most surface (mol %) | Concentration in concentration gradient layer near surface (mol %) | Measurement portion of left concentration (depth from surface) | Concentration of intermediate layer (mol %) | Measurement portion of left concentration (depth from surface) |
| Inv. ex. | 30 | Au, Pd | 0.1 | Au: 100 | Au: 35, Pd: 65 | 0.4 d | Pd: 85, Cu: 15 | 0.6 d |
|  | 31 | Au, Pd | 0.2 | Pd: 100 | Pd: 61, Au: 39 | 0.2 d | Au: 75, Pt: 20, Cu: 5 | 0.53 d |
|  | 32 | Au, Pt | 0.5 | Pt: 100 | Pt: 44, Au: 57 | 0.3 d | Au: 65, Pt: 20, Cu: 15 | 0.5 d |
|  | 33 | Pd, Pt | 0.1 | Pd: 100 | Pd: 35, Pt: 65 | 0.3 d | Pt: 72, Pd: 5, Cu: 22 | 0.5 d |
|  | 34 | Au, Pt | 0.3 | Au: 100 | Au: 62, Pt: 38 | 0.2 d | Pt: 80, Cu: 20 | 0.55 d |
|  | 35 | Au, Pt | 0.2 | Pt: 100 | Pt: 44, Au: 57 | 0.3 d | Au: 65, Pt: 20, Cu: 15 | 0.5 d |
|  | 36 | Pd, Pt | 0.1 | Pd: 100 | Pd: 35, Pt: 65 | 0.3 d | Pt: 72, Pd: 5, Cu: 22 | 0.5 d |
|  | 37 | Au, Ag | 2 | Au: 100 | Au: 65, Ag: 35 | 0.3 d | Au: 65, Ag: 35 | 0.5 d |
|  | 38 | Ag, Pd | 0.7 | Ag: 100 | Ag: 82, Pd: 18 | 0.2 d | Ag: 70, Pd: 25, Cu: 5 | 0.5 d |
|  | 39 | Au, Rh | 0.5 | Au: 100 | Au: 45, Rh: 55 | 0.3 d | Ag: 70, Pd: 25, Cu: 5 | 0.5 d |
|  | 40 | Pt, Rh | 0.2 | Pt: 100 | Pt: 57, Rh: 43 | 0.3 d | Rh: 85, Cu: 15 | 0.5 d |

TABLE 5-continued

| | Test No. | Concentration in concentration gradient layer of deep part from intermediate layer (mol %) | Measurement portion of left concentration (depth from surface) | Inter-metallic compounds observed | Production method A: Electroless B: Electro-plating C: Vapor deposition D: Casting | Wire size/ μm |
|---|---|---|---|---|---|---|
| Inv. ex. | 30 | Pd: 23, Cu: 77 | 0.8 d | — | A | 25 |
| | 31 | Au: 31, Cu: 69 | 0.8 d | — | B | 25 |
| | 32 | Au: 80, Cu: 20 | 0.8 d | Au$_3$Pt | B | 25 |
| | 33 | Pt: 20, Cu: 80 | 0.8 d | — | B | 25 |
| | 34 | Pt: 27, Cu: 73 | 0.7 d | — | A, B | 25 |
| | 35 | Au: 80, Cu: 20 | 0.8 d | — | B | 25 |
| | 36 | Pt: 20, Cu: 80 | 0.8 d | — | B | 25 |
| | 37 | Ag: 28, Cu: 72 | 0.7 d | — | | 25 |
| | 38 | Pd: 48, Cu: 52 | 0.7 d | — | A | 25 |
| | 39 | Ag: 56, Cu: 44 | 0.7 d | — | C | 25 |
| | 40 | Rh: 35, Cu: 65 | 0.8 d | — | B | 25 |

TABLE 6

(Continuation of Table 5)

| | Test No. | Wire mechanical characteristics Tensile strength/ MPa | Elongation/% | Initial ball formability | Pressed ball bonded shape | Neck part pull strength | Loop shape stability | Wire deformation at resin sealing | Wedge bonding material | Wedge bondability | Wedge bond pull strength/ MPa |
|---|---|---|---|---|---|---|---|---|---|---|---|
| Inv. ex. | 30 | 247 | 4 | ◉ | ◉ | ○ | ◉ | ○ | Au | ◉ | 147 |
| | 31 | 247 | 4 | ◉ | ◉ | ○ | ◉ | ○ | Ag | ◉ | 142 |
| | 32 | 245 | 4 | ◉ | ◉ | ○ | ◉ | ○ | Ag | ◉ | 140 |
| | 33 | 258 | 4 | ◉ | ◉ | ○ | ◉ | ○ | Ag | ◉ | 138 |
| | 34 | 247 | 4 | ◉ | ◉ | ○ | ◉ | ○ | Ag | ◉ | 148 |
| | 35 | 245 | 4 | ◉ | ◉ | ○ | ◉ | ○ | Ag | ◉ | 140 |
| | 36 | 258 | 4 | ◉ | ◉ | ○ | ◉ | ○ | Ag | ◉ | 138 |
| | 37 | 255 | 4 | ◉ | ◉ | ○ | ◉ | ○ | Ag | ◉ | 157 |
| | 38 | 247 | 4 | ◉ | ◉ | ○ | ◉ | ○ | Ag | ◉ | 151 |
| | 39 | 245 | 4 | ◉ | ◉ | ○ | ◉ | ○ | Ag | ◉ | 155 |
| | 40 | 238 | 4 | ◉ | ◉ | ○ | ◉ | ○ | Ag | ◉ | 142 |

TABLE 7

| | Test No. | Main ingredient elements | Surface covering layer thickness (d/μm) | Concentration of surface-most surface (mol %) | Concentration in concentration gradient layer near surface (mol %) | Measurement portion of left concentration (depth from surface) | Concentration of intermediate layer (mol %) | Measurement portion of left concentration (depth from surface) |
|---|---|---|---|---|---|---|---|---|
| Inv. ex. | 41 | Au, Pd | 1.8 | Au: 95, Pd: 5 | Au: 70, Pd: 30 | 0.23 d | Pd: 100 | 0.4 d |
| | 42 | Au, Pd | 0.1 | Au: 85, Pd: 15 | Au: 32, Pd: 68 | 0.3 d | Pd: 100 | 0.55 d |
| | 43 | Au, Pd | 0.4 | Pd: 88, Au: 12 | Pd: 47, Au: 53 | 0.25 d | Au: 100 | 0.5 d |
| | 44 | Au, Pt | 0.3 | Au: 75, Pt: 25 | Au: 28, Pt: 72 | 0.3 d | Pt: 100 | 0.45 d |
| | 45 | Pt, Pd | 0.3 | Pt: 70, Pd: 30 | Pt: 20, Pd: 80 | 0.3 d | Pd: 100 | 0.5 d |
| | 46 | Au, Ni | 0.02 | Au: 85, Ni: 15 | Au: 32, Ni: 68 | 0.3 d | Ni: 100 | 0.6 d |
| | 47 | Au, Pd | 0.2 | Pd: 87, Au: 13 | Pd: 48, Au: 52 | 0.3 d | Au: 78, Pd: 22 | 0.5 d |
| | 48 | Au, Pd | 0.8 | Au: 78, Pd: 22 | Au: 52, Pd: 48 | 0.25 d | Pd: 87, Au: 13 | 0.5 d |
| | 49 | Au, Pt | 0.1 | Pt: 78, | Pt: 45, Au: 55 | 0.3 d | Au: 76, | 0.5 d |

TABLE 7-continued

| Test No. | | | | | | | |
|---|---|---|---|---|---|---|---|
| 50 | Pd, Ag | 0.5 | Au: 22, Pd: 82, Ag: 18 | Pd: 40, Ag: 60 | 0.3 d | Pt: 24, Ag: 82, Pd: 18 | 0.5 d |
| 51 | Au, Ni | 0.2 | Au: 85, Ni: 15 | Au: 47, Ni: 53 | 0.3 d | Ni: 72, Au: 28 | 0.5 d |
| 52 | Au, Pd | 0.2 | Pd: 98, Au: 2 | Pd: 96, Au: 4 | 0.1 d | Pd: 85, Au: 0.5, Cu: 14 | 0.3 d |
| 53 | Au, Pd | 0.3 | Au: 78, Pd: 22 | Au: 77, Pd: 23 | 0.1 d | Au: 78, Pd: 7, Cu: 15 | 0.5 d |
| 54 | Au, Rh | 0.1 | Au: 89, Rh: 11 | Au: 87, Rh: 13 | 0.1 d | Au: 85, Rh: 8, Cu: 7 | 0.5 d |
| 55 | Pt, Pd | 0.3 | Pd: 62, Pt: 38 | Pd: 63, Pt: 37 | 0.1 d | Pd: 45, Pt: 33, Cu: 22 | 0.6 d |

| | Test No. | Surface covering layer — Concentration in concentration gradient layer of deep part from intermediate layer (mol %) | Measurement portion of left concentration (depth from surface) | Intermetallic compounds observed | Production method A: Electroless B: Electroplating C: Vapor deposition D: Casting | Wire size/μm |
|---|---|---|---|---|---|---|
| Inv. ex. | 41 | Pd: 23, Cu: 77 | 0.8 d | — | B | 25 |
| | 42 | Pd: 32, Cu: 68 | 0.8 d | — | C | 25 |
| | 43 | Au: 27, Cu: 73 | 0.8 d | AuPd | B | 25 |
| | 44 | Pt: 33, Cu: 67 | 0.8 d | — | B | 25 |
| | 45 | Pd: 43, Cu: 57 | 0.75 d | — | B | 25 |
| | 46 | Ni: 8, Cu: 92 | 0.9 d | — | C | 20 |
| | 47 | Au: 22, Cu: 78 | 0.8 d | — | B | 25 |
| | 48 | Pd: 18, Cu: 82 | 0.8 d | — | B | 25 |
| | 49 | Au: 25, Cu: 75 | 0.8 d | — | B | 25 |
| | 50 | Ag: 20, Cu: 80 | 0.8 d | AuPd | B | 25 |
| | 51 | Ni: 38, Cu: 52 | 0.75 d | — | B | 25 |
| | 52 | Pd: 24, Cu: 76 | 0.8 d | — | D | 25 |
| | 53 | Au: 27, Cu: 73 | 0.8 d | — | D | 25 |
| | 54 | Au: 25, Cu: 75 | 0.8 d | — | D | 25 |
| | 55 | Pd: 18, Pt: 25, Cu: 57 | 0.8 d | — | D | 25 |

TABLE 8

(Continuation of Table 7)

| | Test No. | Wire mechanical characteristics — Tensile strength/MPa | Elongation/% | Initial ball formability | Pressed ball bonded shape | Neck part pull strength | Loop shape stability | Wire deformation at resin sealing | Wedge bonding material | Wedge bondability | Wedge bond pull strength/MPa |
|---|---|---|---|---|---|---|---|---|---|---|---|
| Inv. ex. | 41 | 298 | 4 | ◉ | ◉ | ◉ | ◉ | ◉ | Ag | ○ | 132 |
| | 42 | 282 | 4 | ◉ | ◉ | ◉ | ◉ | ◉ | Au | ○ | 135 |
| | 43 | 288 | 4 | ◉ | ◉ | ◉ | ◉ | ◉ | Ag | ○ | 125 |
| | 44 | 292 | 4 | ◉ | ◉ | ◉ | ◉ | ◉ | Ag | ○ | 132 |
| | 45 | 305 | 4 | ◉ | ◉ | ◉ | ◉ | ◉ | Ag | ○ | 125 |
| | 46 | 288 | 3.5 | ◉ | ◉ | ◉ | ◉ | ◉ | Ag | ○ | 127 |
| | 47 | 295 | 4 | ◉ | ○ | ○ | ◉ | ◉ | Ag | ○ | 125 |
| | 48 | 303 | 4 | ◉ | ○ | ○ | ◉ | ◉ | Ag | ○ | 138 |
| | 49 | 285 | 4 | ◉ | ○ | ○ | ◉ | ◉ | Au | ○ | 128 |
| | 50 | 292 | 4 | ◉ | ○ | ○ | ◉ | ◉ | Ag | ○ | 127 |
| | 51 | 281 | 4 | ◉ | ○ | ○ | ◉ | ◉ | Ag | ○ | 136 |
| | 52 | 284 | 4 | ◉ | ○ | ○ | ○ | ◉ | Ag | ○ | 122 |
| | 53 | 293 | 4 | ◉ | ○ | ○ | ○ | ◉ | Ag | ○ | 134 |
| | 54 | 284 | 4 | ◉ | ○ | ○ | ○ | ◉ | Ag | ○ | 137 |
| | 55 | 289 | 4 | ◉ | ○ | ○ | ○ | ◉ | Ag | ○ | 128 |

TABLE 9

| | Test No. | Main ingredient elements | Surface covering layer thickness (d/μm) | Concentration of surface-most surface (mol %) | Concentration in concentration gradient layer near surface (mol %) | Measurement portion of left concentration (depth from surface) | Concentration of intermediate layer (mol %) | Measurement portion of left concentration (depth from surface) |
|---|---|---|---|---|---|---|---|---|
| Inv. ex. | 56 | Au, Cu | 0.1 | Cu: 100 | Cu: 62, Au: 38 | 0.3 d | Au: 100 | 0.5 d |
| | 57 | Au, Cu | 0.2 | Cu: 100 | Cu: 65, Au: 35 | 0.2 d | Au: 100 | 0.55 d |
| | 58 | Au, Cu | 0.1 | Cu: 100 | Cu: 59, Au: 41 | 0.2 d | Au: 100 | 0.55 d |
| | 59 | Au, Cu | 1 | Cu: 100 | Cu: 85, Au: 15 | 0.1 d | Au: 100 | 0.55 d |
| | 60 | Pd, Cu | 0.2 | Cu: 100 | Cu: 70, Pd: 30 | 0.25 d | Pd: 100 | 0.6 d |
| | 61 | Pt, Cu | 0.3 | Cu: 100 | Cu: 42, Pt: 58 | 0.3 d | Pt: 100 | 0.5 d |
| | 62 | Au, Cu | 0.2 | Cu: 100 | Cu: 70, Au: 30 | 0.3 d | Au: 100 | 0.5 d |
| | 63 | Au, Cu | 0.1 | Cu: 100 | Cu: 22, Au: 78 | 0.2 d | Au: 85, Cu: 15 | 0.55 d |
| | 64 | Au, Cu | 0.3 | Cu: 100 | Cu: 85, Au: 15 | 0.35 d | Au: 68, Cu: 32 | 0.6 d |
| | 65 | Au, Cu | 0.2 | Cu: 100 | Cu: 74, Au: 26 | 0.3 d | Au: 85, Cu: 15 | 0.6 d |
| | 66 | Au, Cu | 0.2 | Cu: 90, Au: 10 | Cu: 72, Au: 28 | 0.2 d | Au: 100 | 0.4 d |
| | 67 | Au, Cu | 0.4 | Cu: 75, Au: 25 | Cu: 62, Au: 38 | 0.15 d | Au: 100 | 0.5 d |
| | 68 | Au, Cu | 0.5 | Au: 80, Cu: 20 | Au: 58, Cu: 42 | 0.25 d | Au: 100 | 0.45 d |
| | 69 | Pd, Cu | 0.2 | Cu: 100 | Cu: 74, Pd: 26 | 0.3 d | Pd: 55, Cu: 45 | 0.5 d |

| | Test No. | Concentration in concentration gradient layer of deep part from intermediate layer (mol %) | Measurement portion of left concentration (depth from surface) | Inter-metallic compounds observed | Production method A: Electroless B: Electroplating C: Vapor deposition D: Casting | Wire size/μm |
|---|---|---|---|---|---|---|
| Inv. ex. | 56 | Au: 61, Cu: 39 | 0.75 d | — | A | 20 |
| | 57 | Au: 33, Cu: 67 | 0.8 d | — | B | 25 |
| | 58 | Au: 22, Cu: 78 | 0.8 d | — | B | 25 |
| | 59 | Au: 31, Cu: 69 | 0.8 d | AuCu | B | 25 |
| | 60 | Pd: 28, Cu: 72 | 0.75 d | — | B | 25 |
| | 61 | Pt: 36, Cu: 64 | 0.7 d | PdCu | B | 25 |
| | 62 | Au: 37, Cu: 63 | 0.75 d | — | B | 20 |
| | 63 | Au: 27, Cu: 73 | 0.8 d | — | B | 25 |
| | 64 | Au: 28, Cu: 72 | 0.75 d | — | B | 25 |
| | 65 | Au: 25, Cu: 75 | 0.8 d | — | B | 25 |
| | 66 | Au: 45, Cu: 55 | 0.8 d | — | D | 25 |
| | 67 | Au: 34, Cu: 66 | 0.8 d | — | B | 25 |
| | 68 | Au: 62, Cu: 38 | 0.75 d | — | B | 25 |
| | 69 | Pd: 15, Cu: 85 | 0.8 d | — | B | 25 |

TABLE 10

(Continuation of Table 9)

| | Test No. | Tensile strength/MPa | Elongation/% | Initial ball formability | Pressed ball bonded shape | Neck part pull strength | Loop shape stability | Wire deformation at resin sealing | Wedge bonding material | Wedge bondability | Wedge bond pull strength/MPa |
|---|---|---|---|---|---|---|---|---|---|---|---|
| Inv. ex. | 56 | 269 | 4 | ◎ | ◎ | ◎ | ◎ | ○ | ○ | Ag | ○ | 113 |
| | 57 | 231 | 4 | ◎ | ◎ | ◎ | ◎ | ○ | ○ | Ag | ○ | 112 |
| | 58 | 233 | 4 | ◎ | ◎ | ◎ | ◎ | ○ | ○ | Ag | ○ | 115 |
| | 59 | 240 | 4 | ◎ | ◎ | ◎ | ◎ | ○ | ○ | Ag | ○ | 114 |
| | 60 | 245 | 4 | ◎ | ◎ | ◎ | ◎ | ○ | ○ | Ag | ○ | 117 |
| | 61 | 244 | 4 | ◎ | ◎ | ◎ | ◎ | ○ | ○ | Ag | ○ | 115 |
| | 62 | 245 | 4 | ◎ | ◎ | ◎ | ◎ | ○ | ○ | Ag | ○ | 118 |

TABLE 10-continued (Continuation of Table 9)

| Test No. | Wire mechanical characteristics | | Initial ball formability | Pressed ball bonded shape | Neck part pull strength | Loop shape stability | Wire deformation at resin sealing | Wedge bonding material | Wedge bondability | Wedge bond pull strength/ MPa |
|---|---|---|---|---|---|---|---|---|---|---|
| | Tensile strength/ MPa | Elongation/% | | | | | | | | |
| 63 | 235 | 4 | ◉ | ◉ | ◉ | ○ | ○ | Ag | ○ | 117 |
| 64 | 237 | 4 | ◉ | ◉ | ◉ | ○ | ○ | Ag | ○ | 116 |
| 65 | 236 | 4 | ◉ | ◉ | ◉ | ○ | ○ | Ag | ○ | 117 |
| 66 | 239 | 4 | ◉ | ◉ | ◉ | ○ | ◉ | Ag | ◉ | 132 |
| 67 | 248 | 4 | ◉ | ◉ | ◉ | ○ | ◉ | Ag | ◉ | 137 |
| 68 | 244 | 4 | ◉ | ◉ | ◉ | ○ | ◉ | Ag | ◉ | 138 |
| 69 | 262 | 4 | ◉ | ◉ | ◉ | ○ | ◉ | Ag | ◉ | 118 |

TABLE 11

| | Test No. | Surface covering layer | | | | | | | Production method A: Electroless B: Electroplating C: Vapor deposition D: Casting | Wire size/ μm |
|---|---|---|---|---|---|---|---|---|---|---|
| | | Main ingredient elements | Surface covering layer thickness (d/μm) | Concentration of surface-most surface (mol %) | Concentration in concentration gradient layer near surface (mol %) | Measurement portion of left concentration (depth from surface) | Concentration of intermediate layer (mol %) | Measurement portion of left concentration (depth from surface) | Concentration in concentration gradient layer of deep part from intermediate layer (mol %) | Measurement portion of left concentration (depth from surface) | Intermetallic compounds observed | | |

| | Test No. | Main ingredient elements | Surface covering layer thickness (d/μm) | Concentration of surface-most surface (mol %) | Concentration in concentration gradient layer near surface (mol %) | Measurement portion of left concentration (depth from surface) | Concentration of intermediate layer (mol %) | Measurement portion of left concentration (depth from surface) |
|---|---|---|---|---|---|---|---|---|
| Comp. ex. | 1 | None | — | — | — | — | — | — |
| | 2 | Au | 0.1 | Au: 100 | — | — | — | — |
| | 3 | Au | 0.2 | Au: 100 | Cu: 0.05, Au: 98 | 0.3 d | Cu: 12, Au: 88 | 0.6 d |
| | 4 | Ag | 0.5 | Ag: 100 | — | — | — | — |
| | 5 | Pd | 0.1 | Pd: 100 | — | — | — | — |
| | 6 | Pd | 0.5 | Pd: 100 | — | 0.3 d | Cu: 5, Pd: 95 | 0.5 d |
| | 7 | Pt | 0.2 | Pt: 100 | — | — | — | — |
| | 8 | Ni | 0.2 | Ni: 100 | — | — | — | — |

| | Test No. | Concentration in concentration gradient layer of deep part from intermediate layer (mol %) | Measurement portion of left concentration (depth from surface) | Intermetallic compounds observed | Production method A: Electroless B: Electroplating C: Vapor deposition D: Casting | Wire size/ μm |
|---|---|---|---|---|---|---|
| comp. ex. | 1 | — | — | — | — | 25 |
| | 2 | — | — | — | A | 25 |
| | 3 | Cu: 75, Au: 25 | 0.8 d | — | B | 25 |
| | 4 | — | — | — | A | 25 |
| | 5 | — | — | — | A | 25 |
| | 6 | Cu: 73, Pd: 27 | 0.8 d | — | B | 25 |
| | 7 | — | — | — | A | 25 |
| | 8 | — | — | — | A | 25 |

TABLE 12

(Continuation of Table 11)

| | Test No. | Wire mechanical characteristics | | Initial ball formability | Pressed ball bonded shape | Neck part pull strength | Loop shape stability | Wire deformation at resin sealing | Wedge bonding material | Wedge bondability | Wedge bond pull strength/ MPa |
|---|---|---|---|---|---|---|---|---|---|---|---|
| | | Tensile strength/ MPa | Elongation/% | | | | | | | | |
| Comp. ex. | 1 | 155 | 4 | ○ | X | Δ | Δ | Δ | Ag | X | 78 |
| | 2 | 172 | 3 | Δ | X | Δ | Δ | Δ | Ag | Δ | 125 |
| | 3 | 168 | 4 | Δ | X | Δ | Δ | Δ | Ag | Δ | 127 |

TABLE 12-continued (Continuation of Table 11)

|  | Wire mechanical characteristics | | Pressed | | Wire | | | Wedge bond | | |
| --- | --- | --- | --- | --- | --- | --- | --- | --- | --- | --- |
| Test No. | Tensile strength/ MPa | Elongation/% | Initial ball formability | ball bonded shape | Neck part pull strength | Loop shape stability | deformation at resin sealing | Wedge bonding material | Wedge bondability | pull strength/ MPa |
| 4 | 168 | 2 | Δ | X | Δ | Δ | Δ | Ag | Δ | 125 |
| 5 | 170 | 3 | Δ | X | Δ | Δ | Δ | Ag | X | 115 |
| 6 | 175 | 4 | Δ | X | Δ | Δ | Δ | Ag | X | 112 |
| 7 | 174 | 3 | Δ | X | Δ | Δ | Δ | Ag | Δ | 108 |
| 8 | 177 | 3.5 | Δ | X | Δ | Δ | Δ | Ag | X | 98 |

TABLE 13

| | | Core material | | Surface covering layer | | | | |
| --- | --- | --- | --- | --- | --- | --- | --- | --- |
| | Test No. | Main element | Contained element/ mass % | Main elements | Surface covering layer thickness (d/μm) | Concentration of surface-most surface (mol %) | Concentration in concentration gradient layer near surface (mol %) | Measurement portion of left concentration (depth from surface) | Concentration of intermediate layer (mol %) |
| Inv. ex. | 70 | Cu | Ag: 0.5 | Au, Pd | 0.1 | Au: 100 | Au: 77, Pd: 23 | 0.1 d | Pd: 100 |
| | 71 | Cu | Au: 1 | Au, Pd | 0.2 | Pd: 100 | Pd: 55, Au: 45 | 0.25 d | Au: 100 |
| | 72 | Cu | Sn: 3 | Pt, Pd | 0.1 | Pd: 100 | Pd: 35, Pt: 65 | 0.3 d | Pt: 72, Pd: 5, Cu: 22 |
| | 73 | Cu | Ag: 4, Sn: 3 | Pd, Ag | 0.3 | Pd: 82, Ag: 18 | Pd: 40, Ag: 60 | 0.3 d | Ag: 82, Pd: 18 |
| | 74 | Cu | Au: 0.5, Ca: 0.001 | Au, Pd | 0.2 | Pd: 88, Au: 12 | Pd: 47, Au: 53 | 0.25 d | Au: 100 |
| | 75 | Cu | Ag: 4, La: 0.002 | Au, Rh | 0.2 | Au: 70, Rh: 30 | Au: 58, Rh: 42 | 0.3 d | Au: 45, Rh: 35, Cu: 20 |
| | 76 | Cu | Ca: 0.001, Be: 0.001 | Au, Pd | 0.5 | Au: 95, Pd: 5 | Au: 70, Pd: 30 | 0.23 d | Pd: 100 |
| | 77 | Cu | Be: 0.001, Al: 0.02 | Au, Pd | 0.1 | Au: 100 | Au: 75, Pd: 25 | 0.2 d | Pd: 100 |
| | 78 | Cu | Al: 0.01, Sr: 0.001 | Au, Ni | 0.3 | Au: 85, Ni: 15 | Au: 47, Ni: 53 | 0.3 d | Ni: 72, Au: 28 |

| | | Surface covering layer | | | Production method A: Electroless B: Electro- plating C: Vapor deposition D: Casting | |
| --- | --- | --- | --- | --- | --- | --- |
| | Test No. | Measurement portion of left concentration (depth from surface) | Concentration in concentration gradient layer of deep part from intermediate layer (mol %) | Measurement portion of left concentration (depth from surface) | | Wire size/ μm |
| Inv. ex. | 70 | 0.5 d | Pd: 68, Cu: 32 | 0.8 d | A | 20 |
| | 71 | 0.5 d | Au: 25, Cu: 75 | 0.85 d | B | 25 |
| | 72 | 0.5 d | Pt: 20, Cu: 80 | 0.8 d | C | 25 |
| | 73 | 0.5 d | Ag: 20, Cu: 80 | 0.8 d | B | 25 |
| | 74 | 0.5 d | Au: 27, Cu: 73 | 0.8 d | B | 25 |
| | 75 | 0.6 d | Au: 14, Rh: 20, Cu: 66 | 0.8 d | B | 25 |
| | 76 | 0.4 d | Pd: 23, Cu: 77 | 0.8 d | A | 25 |
| | 77 | 0.5 d | Pd: 54, Cu: 46 | 0.75 d | B | 25 |
| | 78 | 0.5 d | Ni: 38, Cu: 52 | 0.75 d | B | 25 |

TABLE 14

(Continuation of Table 13)

| | Test No. | Wire mechanical characteristics | | Pressed Initial ball formability | ball bonded shape | Neck part pull strength | Loop shape stability | Wire deformation at resin sealing | Wedge bonding material | Wedge bondability |
|---|---|---|---|---|---|---|---|---|---|---|
| | | Tensile strength/ MPa | Elongation/% | | | | | | | |
| Inv. ex. | 70 | 275 | 4 | ◎ | ◎ | ◎ | ◎ | ◎ | Ag | ◎ |
| | 71 | 283 | 4 | ◎ | ◎ | ◎ | ◎ | ◎ | Ag | ◎ |
| | 72 | 284 | 4 | ◎ | ◎ | ○ | ◎ | ◎ | Ag | ◎ |
| | 73 | 285 | 4 | ◎ | ◎ | ○ | ◎ | ◎ | Ag | ◎ |
| | 74 | 283 | 4 | ◎ | ◎ | ◎ | ◎ | ◎ | Pd | ◎ |
| | 75 | 280 | 4 | ◎ | ○ | ○ | ◎ | ◎ | Ag | ◎ |
| | 76 | 286 | 4 | ◎ | ○ | ◎ | ◎ | ○ | Ag | ◎ |
| | 77 | 291 | 4 | ◎ | ◎ | ◎ | ◎ | ○ | Ag | ◎ |
| | 78 | 288 | 4 | ◎ | ◎ | ◎ | ◎ | ○ | Ag | ◎ |

The bonding wire of (1) of the present invention (1) is represented by Examples 1 to 55, the bonding wire of (2) of the present invention (2) is represented by Examples 1 to 51, the bonding wire of (3) of the present invention is represented by Examples 1 to 40, the bonding wire of (4) of the present invention is represented by Examples 1 to 29 and 41 to 46, the bonding wire of (5) of the present invention is represented by Examples 56 to 69, the bonding wire of (6) of the present invention is represented by Examples 52 to 55, the bonding wire of (7) of the present invention is represented by Examples 3, 7, 10, 32, 43, 50, 59, and 61, the bonding wire of (23) of the present invention is represented by Examples 74 to 78, and the bonding wire of (24) of the present invention is represented by Examples 70 to 75. Comparative Examples 1 to 8 of Tables 11 and 12 show the results of bonding wires not corresponding to the bonding wire of <1> of the present invention.

Part of the results of evaluation will be explained for representative examples of the bonding wires.

The bonding wires of Examples 1 to 55 were confirmed to be sufficiently high in formability of the ball part and wire strength due to the surface covering layer containing two or more types of main ingredient metal selected from gold, palladium, platinum, rhodium, silver, and nickel inside it and the surface covering layer having a concentration gradient of one or both of the main ingredient metal or copper in the wire radial direction according to the present invention. These characteristics are not sufficient with the Cu wires of Comparative Examples 1 to 8 where films of elements other than copper are formed on the surfaces. It became clear that they were improved in Examples 1 to 55 having concentration gradients.

The bonding wires of Examples 1 to 51 were confirmed to be good in loop controllability and wedge bondability due to the surface covering layer having concentration gradients of at least one type of element of gold, palladium, platinum, rhodium, silver, and nickel both increasing and decreasing in the depth direction according to the present invention.

The bonding wires of Examples 1 to 40 were confirmed to be good in wedge bondability and pressed shape due to the surface covering layer having a single metal region of gold, palladium, platinum, rhodium, silver, or nickel inside it according to the present invention.

The bonding wires of Examples 1 to 29 and 41 to 46 were confirmed to be high in pull strength, reduced in neck damage, and able to sufficiently handle lower loops due to the surface covering layer having a single metal region of gold, palladium, platinum, rhodium, silver, or nickel inside it according to the present invention.

The bonding wires of Examples 56 to 69 were confirmed to be good in ball formability, high in pull strength, and improved in wedge bondability due to having a surfacemost region comprised of copper alone or an alloy containing 30 mol % or more copper and a portion at the inside of the surface covering layer having concentration gradients of at least one type of element of gold, palladium, platinum, rhodium, silver, and nickel and copper both increasing and decreasing in the wire radial direction according to the present invention.

The bonding wires of Examples 52 to 55 were confirmed to be high in pull strength, reduced in neck damage, increased in pull strength, and otherwise able to handle lower loops due to the surface covering layer having inside it concentration gradients of at least one type of main ingredient metal of gold, palladium, platinum, rhodium, silver, and nickel and copper and an alloy layer containing two or more types of main ingredient metal in an amount of 0.1 mol % or more in a uniform concentration.

The bonding wires of Examples 3, 7, 10, 32, 43, 50, 59, and 61 were confirmed to have surface covering layers with intermetallic compounds formed inside them. The wires were increased in strength and were improved in straightness at the time of use, suppression of resin deformation, etc.

The bonding wires of Examples 74 to 78 were improved in wedge bondability due to the core part containing predetermined amounts of Ca, Sr, Be, Al, or rare earth elements according to the present invention, while the bonding wires of Examples 70 to 75 were improved in resin deformation due to the core part containing predetermined amounts of silver, tin, or gold.

<2> Bonding Wire: Examples 101 to 145

As the materials of the bonding wire, for the copper used for the core material, a material of a high purity of approximately 99.99 mass % or more was used, while for the materials of the Au, Pt, Pd, Ni, and Ag of the outer periphery, materials of a purity of 99.9 mass % or more were prepared.

Copper wire reduced to a certain wire size was used as the core material. To form a layer of a different metal on that wire surface, electroplating, electroless plating, vapor deposition, casting, etc. was performed. To form a concentration gradient, heat treatment was performed. When forming a surface covering layer by the final wire size, the method was utilized of forming the outer covering layer by a certain wire size, then further drawing the wire to reduce it to the final wire size. For the electroplating solution and the electroless plating solution, plating solutions commercially available for semiconductor applications were used. For the vapor deposition, sputtering was used. Wire of a diameter of approximately 50 to 200 μm was prepared in advance, the wire surface was covered by vapor deposition, plating, etc., the wire was drawn to the final diameter of 15 to 25 μm, then finally the working strain was removed and heat treatment was performed to obtain an elongation value of 4% to 10% or so. In accordance with need, the wire was drawn to a wire size of 30 to 100 μm, then given heat treatment for diffusion and then further drawn.

When utilizing casting, the method of casting molten metal around a core wire prepared in advance or the method of casting molten copper or copper alloy in the center of a hollow tube prepared in advance was employed. The diameter of the core wire was approximately 3 to 8 mm, while the diameter of the outer periphery was approximately 5 to 10 mm. After that, this was forged, rolled, drawn, or otherwise worked and heat treated to produce the wire.

For the heat treatment of the wires of the invention examples, the wires were heated while being continuously swept. A system locally introducing a temperature gradient, a system changing the temperature inside the furnace, etc. was employed. The temperature difference was made 30 to 200° C. in range, the temperature distribution, wire sweep rate, etc. were made suitable, and the tensile elongation was adjusted to 4% or so. For the atmosphere of the heat treatment, in addition to the air, $N_2$, Ar, or other inert gas was also utilized for the purpose of suppressing oxidation. Regarding the heat treatment processes of the comparative examples, samples were prepared for two cases: the case of heating treating the drawn Cu wire, then forming a plating layer (Comparative Examples 102 and 105 to 109) and the case of heat treating the wire two times: after drawing and after formation of the plating layer (Comparative Examples 103 and 104).

The wire tensile strength and modulus of elasticity were found by running tensile tests on five wires of lengths of 10 cm and finding the average values.

For measurement of the film thickness on the wire surface, depth analysis by AES was used. For observation of concentration at the crystal grain boundaries or other element distribution, surface analysis or line analysis using AES, EPMA, etc. was performed. The concentration of conductive metal in the wire was measured by ICP analysis, ICP mass analysis, etc. When the copper concentration near the crystal grain boundaries was a high 5% or more, the "○" mark was assigned, while when lower than that, no concentration was shown.

For connecting the bonding wire, a commercially available automatic wire bonder was used for ball/wedge bonding. Arc discharge was used to prepare a ball at the wire tip (initial ball size: 35 to 50 μm), this was joined to an electrode film on a silicon substrate, and the other end of the wire was wedge bonded on a lead terminal. To suppress oxidation at the time of ball melting, the wire tip was sprayed with $N_2$ gas while performing the electrodischarge.

As the other member bonded to, the material of the electrode film on the silicon substrate, that is, an Al alloy film of a thickness of 1 μm (Al-1% Si-0.5% Cu film, Al-0.5% Cu film) was used. On the other hand, as the other member for wedge bonding, a lead frame plated on its surface with Ag plating (thickness: 1 to 4 μm) or a resin substrate of an electrode structure of Au plating/Ni plating/Cu was used.

For the loop shape stability in the bonding process, two types of bonding samples were prepared: wire lengths of 3 mm and a 5 mm. 500 wires were observed by a projector for each and the wire straightness, variations in loop height, etc. were judged. With the conditions of a wire length of a long 5 mm, the loop control becomes stricter. With a wire length of 3 mm, when there were defects in straightness, loop height, etc. in five wires or more, it was judged there was a problem and the "X" mark was assigned; with a wire length of 3 mm, when there were defects in two to four wires and, with a wire length of 5 mm, when there were defects in five or more wires, it was judged that improvement was needed and the "Δ" mark was assigned; with a wire length of 3 mm, when there was a defect in one wire or no defect and, with a wire length of 5 mm, when there were defects in two to four wires, the loop shape was relatively good, so the "○" mark was assigned; while with a wire length of 5 mm, when there was a defect in one wire or no defect, it was judged that the loop shape was stable and the "⊚" mark was assigned. As causes of defects, insufficient adhesion at the interface between the core wire and outer periphery, fluctuations in characteristics in a cross-section, etc. may be considered.

The deformation of the wire at the time of resin sealing (resin deformation) was measured by preparing bonding samples of wire lengths of 5 mm, sealing them by a commercially available epoxy resin, then using a soft X-ray nondestructive inspection apparatus to measure the amounts of deformation of the parts with the greatest wire deformation for 20 wires. That average value divided by the wire span length (percentage) was used as the wire deformation rate at the time of sealing. When this wire deformation rate was 6% or more, it was judged that the result was defective and the "X" mark was assigned, when 4% to less than 6%, improvement was needed, so the "Δ" mark was assigned, when 2.5% to less than 4%, it was judged that there was no problem in practice and the "○" mark was assigned, and when less than 2.5%, the reduction of wire deformation was good, so the "⊚" mark was assigned.

For observation of the initial ball shape, balls before bonding were observed for 20 wires and a judgment made as to if the shapes were true spheres and if the dimensional accuracy was good. When abnormal shape balls were formed for two or more wires, it was judged that the result was defective and the "X" mark was assigned, when there were irregular shapes for two or less wires, but the number of wires where the ball position was remarkably offset from the wire was five or more, the "Δ" mark was assigned, when there was offset in two to four wires, but it was judged there was no great problem in practice, the "○" mark was assigned, and when there was offset in one wire or no offset and the dimensional accuracy was also good, the ball formation was good, so the "⊚" mark was assigned.

For judgment of the bonded shape of the pressed ball, bonded balls were observed for 500 wires and the circularity of the shape, dimensional accuracy, etc. were evaluated. Conditions giving a pressed ball size of 2 to 3 times the wire size in range were selected. When there were anisotropy or elliptical shapes of a large offset from a true circle or other defective ball shapes in five wires or more, it was judged that the result was defective and the "X" mark was assigned, when there were defective ball shapes in two to four wires or petal defects or other defects at the outer periphery of the ball pressed parts in eight wires or more, improvement was needed and the "Δ" mark was assigned, when there was a defective ball shape in one wire or no defect and there was petal shaped deformation in two wires or less, it was judged the level was not a problem in practice and "○" mark was assigned, and when there was petal shaped deformation in two wires or less, the result was good, so the "⊚" mark was assigned.

For the bonding strength of the ball bonds, the breakage load (shear strength) of 40 wires was measured by the shear test method of moving a jig horizontally 2 μm above an aluminum electrode to read the breakage strength. The absolute value of the shear strength can easily be adjusted by changing the bonding conditions etc., but reduction of variation in the shear strength is closely related to the stability of ball deformation and important from the viewpoint of mass production ability as well. If the standard deviation of the shear strength is 14.7 mN or more, reduction of the variation is needed, so the "Δ" mark was assigned, if 7.8 to 14.7 mN, there is no great problem in practice, so the "○" mark was assigned, while if less than 7.8 mN, the result is stable, so the "⊚" mark was assigned.

For evaluation of damage to the silicon substrate right under a ball bond, the ball bond and electrode film were removed by aqua regia, then the silicon substrate was examined for cracks, micropitting, etc. by an optical microscope, SEM, etc. 500 bonds were examined. When 5 μm or larger cracks were observed in three or more, it was judged that the chip damage was a problem and the "Δ" mark was assigned, when cracks were observed in one to three or 1 μm or so pitting was observed in two or more, chip damage was a concern, but this was not a problem in practice, so the "○" mark was assigned, and when no cracks occurred and pitting was observed in one bond or not at all, the result was very good, so the "⊚" mark was assigned.

For judgment of the wedge bondability for bonding wire to the lead side, since bonding becomes more difficult the lower the temperature, 1000 wires each were bonded at stage temperatures of low temperatures of 220° C. and 180° C. and the continuous workability, wire deformation shape, etc. were examined. When complete detachment occurred at the bond in two or more wires at 220° C., the "X" mark was assigned, when complete detachment occurred at less than two wires at 220° C. and partial detachment occurred near wire breakage, improvement was needed, so the "Δ" mark was assigned, when there were no defects at 220° C. and, further, there was complete detachment at one wire or not at all at 180° C., the "○" mark was assigned, and when there was no complete detachment at 180° C. and there was partial detachment at less than three wires, the "⊚" mark was assigned.

For evaluation of the pull strength of wedge bonds, the bondability of the bonding interface was judged by running pull tests for samples of a wire length of 3 mm near the wedge bonds and finding the average value for 20 wires.

Tables 15, 16, and 19 to 22 show the results of evaluation of copper bonding wire according to the present invention, while Tables 17 and 18 show comparative examples.

TABLE 15

| | Test No. | Main element | Surface covering layer thickness/μm | Cu concentration in depth direction from surface, mol % | | | Intermetallic compounds observed | Grain boundary concentration | Concentration of conductive metal in wire/mol % | Production method A: Electroless B: Electro-plating C: Vapor deposition D: Semi casting | Wire size/μm |
|---|---|---|---|---|---|---|---|---|---|---|---|
| | | | | Surface | Surface covering layer thickness 20% depth | Surface covering layer thickness 70% depth | | | | | |
| Inv. ex. | 101 | Au | 0.028 | 2 | 10 | 42 | — | None | 0.02 | A | 20 |
| | 102 | Au | 0.05 | 5 | 14 | 53 | — | ○ | 0.03 | B | 18 |
| | 103 | Au | 0.05 | 10 | 23 | 72 | — | ○ | 0.05 | B | 25 |
| | 104 | Au | 0.06 | 15 | 45 | 73 | — | ○ | 0.1 | C | 25 |
| | 105 | Au | 0.08 | 38 | 48 | 65 | CuAu | ○ | 0.08 | B | 25 |
| | 106 | Au | 0.04 | 22 | 31 | 56 | — | ○ | 0.07 | B | 25 |
| | 107 | Au | 0.06 | 58 | 53 | 72 | CuAu, CuAu$_3$ | ○ | 0.1 | D | 25 |
| | 108 | Au | 0.1 | 4 | 12 | 27 | — | None | 0.05 | A | 25 |
| | 109 | Au | 0.1 | 28 | 18 | 43 | — | ○ | 0.2 | B | 25 |
| | 110 | Au | 0.3 | 15 | 29 | 56 | — | ○ | 0.5 | B | 25 |
| | 111 | Au | 1 | 20 | 27 | 44 | — | ○ | 0.5 | B | 25 |
| | 112 | Au | 3 | 4 | 17 | 30 | — | ○ | 8 | D | 30 |
| | 113 | Ag | 0.05 | 15 | 42 | 68 | — | ○ | 0.1 | B | 20 |
| | 114 | Ag | 0.07 | 4 | 20 | 44 | — | ○ | 0.2 | B | 25 |
| | 115 | Ag | 0.1 | 11 | 25 | 51 | — | ○ | 0.1 | B | 25 |
| | 116 | Ag | 2 | 12 | 23 | 54 | — | ○ | 4 | D | 30 |
| | 117 | Pd | 0.037 | 15 | 35 | 58 | — | ○ | 0.15 | A | 20 |
| | 118 | Pd | 0.08 | 26 | 45 | 66 | — | ○ | 0.1 | D | 25 |
| | 119 | Pd | 0.1 | 14 | 32 | 57 | CuPd | ○ | 0.07 | B | 25 |
| | 120 | Pd | 1 | 4 | 12 | 46 | — | None | 2.5 | B | 25 |
| | 121 | Pt | 0.07 | 32 | 47 | 69 | — | ○ | 0.2 | C | 25 |
| | 122 | Pt | 0.1 | 5 | 13 | 39 | — | ○ | 0.5 | B | 25 |
| | 123 | Pt | 1 | 11 | 24 | 52 | CuPt | ○ | 3 | B | 25 |
| | 124 | Ni | 0.06 | 15 | 25 | 48 | — | ○ | 0.07 | B | 20 |
| | 125 | Ni | 0.1 | 8 | 14 | 32 | — | None | 0.1 | B | 25 |

TABLE 16

(Continuation of Table 15)

| | Test No. | Wire mechanical characteristics | | Pressed ball bonded shape | Shear strength variation | Chip damage | Wire | | | | Wedge bond pull strength/ MPa |
|---|---|---|---|---|---|---|---|---|---|---|---|
| | | Tensile strength/ MPa | Elongation/% | Initial ball formability | | | | Loop shape stability | deformation at resin sealing | Wedge bonding material | Wedge bondability | |

| | Test No. | Tensile strength/MPa | Elongation/% | Initial ball formability | Pressed ball bonded shape | Shear strength variation | Chip damage | Loop shape stability | deformation at resin sealing | Wedge bonding material | Wedge bondability | Wedge bond pull strength/MPa |
|---|---|---|---|---|---|---|---|---|---|---|---|---|
| Inv. ex. | 101 | 222 | 4 | ◎ | ◎ | ◎ | ◎ | ○ | ○ | Ag | ○ | 142 |
| | 102 | 231 | 4 | ◎ | ◎ | ◎ | ◎ | ◎ | ○ | Au | ○ | 159 |
| | 103 | 235 | 6 | ◎ | ◎ | ◎ | ◎ | ◎ | ○ | Ag | ○ | 149 |
| | 104 | 238 | 7 | ◎ | ◎ | ◎ | ◎ | ◎ | ○ | Ag | ○ | 151 |
| | 105 | 262 | 10 | ◎ | ◎ | ◎ | ◎ | ◎ | ◎ | Ag | ○ | 155 |
| | 106 | 237 | 4 | ◎ | ◎ | ◎ | ◎ | ◎ | ○ | Au | ○ | 165 |
| | 107 | 258 | 4 | ◎ | ◎ | ◎ | ◎ | ◎ | ◎ | Ag | ○ | 141 |
| | 108 | 241 | 4 | ◎ | ◎ | ◎ | ◎ | ◎ | ○ | Pd | ○ | 139 |
| | 109 | 238 | 4 | ◎ | ◎ | ◎ | ◎ | ◎ | ○ | Ag | ○ | 152 |
| | 110 | 249 | 4 | ◎ | ◎ | ◎ | ◎ | ◎ | ○ | Ag | ○ | 154 |
| | 111 | 242 | 4 | ◎ | ◎ | ◎ | ◎ | ◎ | ○ | Au | ○ | 157 |
| | 112 | 250 | 6 | ◎ | ◎ | ◎ | ○ | ◎ | ○ | Ag | ○ | 158 |
| | 113 | 218 | 4 | ◎ | ◎ | ◎ | ◎ | ◎ | ○ | Ag | ○ | 162 |
| | 114 | 221 | 4 | ◎ | ◎ | ◎ | ◎ | ◎ | ○ | Ag | ○ | 164 |
| | 115 | 227 | 4 | ◎ | ◎ | ◎ | ◎ | ◎ | ○ | Au | ○ | 163 |
| | 116 | 230 | 4 | ◎ | ◎ | ◎ | ○ | ◎ | ○ | Ag | ○ | 168 |
| | 117 | 223 | 4 | ◎ | ◎ | ○ | ◎ | ◎ | ○ | Ag | ○ | 142 |
| | 118 | 223 | 6 | ◎ | ◎ | ○ | ◎ | ◎ | ○ | Pd | ○ | 140 |
| | 119 | 252 | 4 | ◎ | ◎ | ○ | ◎ | ◎ | ○ | Ag | ○ | 136 |
| | 120 | 242 | 8 | ◎ | ◎ | ○ | ○ | ◎ | ○ | Pd | ○ | 145 |
| | 121 | 228 | 4 | ◎ | ◎ | ○ | ◎ | ◎ | ○ | Ag | ○ | 147 |
| | 122 | 224 | 4 | ◎ | ◎ | ○ | ◎ | ◎ | ○ | Ag | ○ | 142 |
| | 123 | 253 | 6 | ◎ | ◎ | ○ | ◎ | ◎ | ◎ | Ag | ○ | 148 |
| | 124 | 243 | 7 | ◎ | ◎ | ○ | ◎ | ◎ | ○ | Ag | ○ | 123 |
| | 125 | 242 | 4 | ◎ | ◎ | ○ | ◎ | ◎ | ○ | Ag | ○ | 115 |

TABLE 17

| | Test No. | Surface covering layer | | | | | | | Production method | Wire size/ μm |
|---|---|---|---|---|---|---|---|---|---|---|
| | | Main element | Surface covering layer thickness/ μm | Cu concentration in depth direction from surface, mol % | | | Intermetallic compounds observed | Grain boundary concentration | Concentration of conductive metal in wire/ mol % | A: Electroless B: Electro-plating C: Vapor deposition D: Semi casting | |
| | | | | Surface | Surface covering layer thickness 20% depth | Surface covering layer thickness 70% depth | | | | | |
| Comp. ex. | 101 | None | — | — | — | — | — | — | 0.05 | — | 25 |
| | 102 | Au | 0.04 | — | — | — | — | None | 0.2 | A | 25 |
| | 103 | Au | 0.1 | 0.05 | 6 | 18 | — | None | 0.2 | B | 25 |
| | 104 | Au | 2 | 0.02 | 4 | 15 | — | None | 12 | B | 25 |
| | 105 | Ag | 1 | — | — | — | — | None | 8 | B | 25 |
| | 106 | Pd | 0.5 | — | — | — | — | None | 0.8 | A | 25 |
| | 107 | Pd | 2 | — | — | — | — | None | 15 | B | 25 |
| | 108 | Pt | 0.4 | — | — | — | — | None | 0.5 | B | 25 |
| | 109 | Ni | 0.8 | — | — | — | — | None | 0.7 | B | 25 |

TABLE 18

(Continuation of Table 17)

| | Test No. | Tensile strength/Mpa | Elongation/% | Initial ball formability | Pressed ball bonded shape | Shear strength variation | Chip damage | Loop shape stability | deformation at resin sealing | Wedge bonding material | Wedge bondability | Wedge bond pull strength/Mpa |
|---|---|---|---|---|---|---|---|---|---|---|---|---|
| Comp. ex. | 101 | 172 | 4 | ○ | X | △ | ◎ | △ | △ | Ag | X | 94 |
| | 102 | 177 | 2 | △ | X | △ | ◎ | △ | △ | Au | △ | 127 |
| | 103 | 188 | 4 | △ | X | △ | ◎ | △ | △ | Ag | △ | 127 |
| | 104 | 189 | 4 | △ | X | △ | X | △ | △ | Ag | △ | 133 |
| | 105 | 172 | 3 | △ | X | △ | X | △ | △ | Ag | △ | 142 |

TABLE 18-continued (Continuation of Table 17)

| Test No. | Wire mechanical characteristics Tensile strength/ Mpa | Elongation/% | Initial ball formability | Pressed ball bonded shape | Shear strength variation | Chip damage | Loop shape stability | Wire deformation at resin sealing | Wedge bonding material | Wedge bondability | Wedge bond pull strength/ Mpa |
|---|---|---|---|---|---|---|---|---|---|---|---|
| 106 | 175 | 2.7 | Δ | X | Δ | ○ | Δ | Δ | Au | X | 121 |
| 107 | 181 | 3.2 | Δ | X | Δ | X | Δ | Δ | Ag | X | 123 |
| 108 | 173 | 3 | Δ | X | Δ | ◎ | Δ | Δ | Ag | Δ | 128 |
| 109 | 190 | 3 | Δ | X | Δ | ◎ | Δ | Δ | Au | X | 101 |

TABLE 19

| | Test No. | Main element | Average concentration of contained element/ mass % | Surface covering layer thickness/ μm | Surface covering layer Cu concentration in depth direction from surface, mol % Surface | Surface covering layer thickness 20% depth | Surface covering layer thickness 70% depth | Grain boundary concentration | Concentration of conductive metal in wire/ mol % | Production method A: Electroless B: Electro-plating C: Vapor deposition D: Semi casting | Wire size/ μm |
|---|---|---|---|---|---|---|---|---|---|---|---|
| Inv. ex. | 126 | Au | Ca: 0.001 La: 0.001 | 0.035 | 15 | 45 | 73 | ○ | 0.02 | C | 25 |
| | 127 | Au | Ca: 0.001 Be: 0.001 | 0.07 | 38 | 48 | 65 | ○ | 0.07 | B | 25 |
| | 128 | Au | Eu: 0.001 Al: 0.001 | 0.2 | 22 | 31 | 56 | ○ | 0.3 | B | 25 |
| | 129 | Pd | Ca: 0.001 Y: 0.001 | 0.08 | 10 | 45 | 73 | ○ | 0.1 | C | 25 |
| | 130 | Pd | Ca: 0.001 Be: 0.0005 | 0.05 | 25 | 50 | 65 | ○ | 0.1 | B | 25 |
| | 131 | Pd | La: 0.001 Al: 0.002 | 0.1 | 32 | 45 | 58 | ○ | 0.4 | B | 25 |
| | 132 | Pt | Nd: 0.001 Be: 0.0005 | 0.05 | 6 | 17 | 38 | None | 0.1 | A | 25 |
| | 133 | Ag | Ca: 0.001 Be: 0.0005 | 0.08 | 14 | 28 | 45 | ○ | 0.08 | B | 25 |
| | 134 | Ag | Gd: 0.001 Al: 0.001 | 0.1 | 33 | 43 | 61 | ○ | 0.1 | D | 25 |

TABLE 20

(Continuation of Table 19)

| | Test No. | Wire mechanical characteristics Tensile strength/ MPa | Elongation/% | Initial ball formability | Pressed ball bonded shape | Shear strength variation | Chip damage | Loop shape stability | Wire deformation at resin sealing | Wedge bonding material | Wedge bondability | Wedge bond pull strength/ MPa |
|---|---|---|---|---|---|---|---|---|---|---|---|---|
| Inv. ex. | 126 | 232 | 4 | ◎ | ◎ | ◎ | ◎ | ○ | ○ | Ag | ◎ | 149 |
| | 127 | 234 | 6 | ◎ | ◎ | ◎ | ◎ | ◎ | ○ | Au | ◎ | 155 |
| | 128 | 241 | 7 | ◎ | ◎ | ◎ | ◎ | ◎ | ○ | Ag | ◎ | 150 |
| | 129 | 245 | 4 | ◎ | ◎ | ◎ | ◎ | ◎ | ○ | Ag | ◎ | 136 |
| | 130 | 243 | 4 | ◎ | ◎ | ◎ | ◎ | ◎ | ○ | Ag | ◎ | 131 |
| | 131 | 247 | 4 | ◎ | ◎ | ◎ | ◎ | ◎ | ○ | Pd | ◎ | 135 |
| | 132 | 244 | 4 | ◎ | ◎ | ◎ | ◎ | ◎ | ○ | Pd | ◎ | 137 |
| | 133 | 242 | 4 | ◎ | ◎ | ◎ | ◎ | ◎ | ○ | Pd | ◎ | 147 |
| | 134 | 242 | 4 | ◎ | ◎ | ◎ | ◎ | ◎ | ○ | Pd | ◎ | 148 |

TABLE 21

| | Test No. | Core material Main element | Core material Contained element/ mass % | Surface covering layer Main element | Surface covering layer Average concentration of contained element/ mass % | Surface covering layer thickness/ μm | Cu concentration in depth direction from surface, mol % Surface Cu concentration mol % | Cu concentration in depth direction from surface, mol % Other elements of surface (mol %) | Surface covering layer thickness 20% depth | Surface covering layer thickness 70% depth |
|---|---|---|---|---|---|---|---|---|---|---|
| Inv. ex. | 135 | Cu | Ag: 2 | Au | | 0.028 | 2 | Au | 10 | 42 |
| | 136 | Cu | Ag: 15 | Pd | | 0.05 | 5 | Pd | 14 | 53 |
| | 137 | Cu | Sn: 3 | Au | | 0.1 | 10 | Au | 23 | 72 |
| | 138 | Cu | Sn: 7 | Au, Pd | | 0.2 | 15 | Au(50), Pd(35) | 45 | 73 |
| | 139 | Cu | Ag: 4 Sn: 3 | Au | Ca: 0.001 Be: 0.001 Eu: 0.001 | 0.15 | 38 | Au | 48 | 65 |
| | 140 | Cu | Ag: 4 Ca: 0.001 | Pt | | 0.04 | 22 | Pt | 31 | 56 |
| | 141 | Cu | Ag: 4 La: 0.002 | Au | | 0.06 | 58 | Au | 53 | 72 |
| | 142 | Cu | Ag: 4 Ca: 0.003 | Au, Pt | | 0.1 | 4 | Au(62), Pt(34) | 12 | 27 |
| | 143 | Cu | Ag: 4 Be: 0.001 | Pt, Pd | | 0.1 | 28 | Pt(25), Pd(47) | 18 | 43 |
| | 144 | Cu | Sn: 4 La: 0.002 | Au | | 0.3 | 15 | Au | 29 | 56 |
| | 145 | Cu | Sn: 4 Al: 0.003 | Pd | La: 0.001 Al: 0.002 | 1 | 20 | Pd | 27 | 44 |

| | Test No. | Surface covering layer Cu concentration in depth direction from surface, mol % Intermetallic compounds observed | Surface covering layer Cu concentration in depth direction from surface, mol % Grain boundary concentration | Concentration of conductive metal in wire/ mol % | Production method A: Electroless B: Electro-plating C: Vapor deposition D: Semi casting | Wire size/ μm |
|---|---|---|---|---|---|---|
| Inv. ex. | 135 | | None | 0.02 | A | 20 |
| | 136 | | ○ | 0.05 | B | 15 |
| | 137 | CuAu | ○ | 0.2 | B | 25 |
| | 138 | | ○ | 0.6 | C | 25 |
| | 139 | | ○ | 0.4 | B | 25 |
| | 140 | CuPt | ○ | 0.06 | B | 25 |
| | 141 | | ○ | 0.1 | D | 25 |
| | 142 | | None | 0.2 | A | 25 |
| | 143 | | ○ | 0.2 | B | 25 |
| | 144 | | ○ | 0.5 | B | 25 |
| | 145 | | ○ | 4 | B | 25 |

TABLE 22

(Continuation of Table 21)

| | Test No. | Wire mechanical characteristics Tensile strength/ MPa | Wire mechanical characteristics Elongation/% | Pressed Initial ball formability | Pressed ball bonded shape | Shear strength variation | Chip damage | Wire Loop shape stability | Wire deformation at resin sealing | Wedge bonding material | Wedge bondability | Wedge bond pull strength/ MPa |
|---|---|---|---|---|---|---|---|---|---|---|---|---|
| Inv. ex. | 135 | 282 | 4 | ◎ | ◎ | ◎ | ○ | ○ | ◎ | Ag | ◎ | 144 |
| | 136 | 285 | 5 | ◎ | ◎ | ◎ | ○ | ◎ | ◎ | Ag | ◎ | 134 |
| | 137 | 280 | 4 | ◎ | ◎ | ◎ | ○ | ◎ | ◎ | Ag | ◎ | 143 |
| | 138 | 283 | 6 | ◎ | ◎ | ◎ | ○ | ◎ | ◎ | Ag | ◎ | 150 |
| | 139 | 288 | 4 | ◎ | ◎ | ◎ | ○ | ◎ | ◎ | Ag | ◎ | 152 |
| | 140 | 283 | 4 | ◎ | ◎ | ◎ | ○ | ◎ | ○ | Pd | ◎ | 127 |
| | 141 | 280 | 4 | ◎ | ◎ | ◎ | ○ | ◎ | ◎ | Ag | ◎ | 141 |
| | 142 | 286 | 4 | ◎ | ◎ | ◎ | ○ | ◎ | ◎ | Ag | ◎ | 154 |
| | 143 | 291 | 4 | ◎ | ◎ | ◎ | ○ | ◎ | ◎ | Ag | ◎ | 132 |
| | 144 | 288 | 4 | ◎ | ◎ | ◎ | ○ | ◎ | ◎ | Ag | ◎ | 147 |
| | 145 | 292 | 4 | ◎ | ◎ | ○ | ○ | ◎ | ◎ | Ag | ◎ | 131 |

The bonding wire of (8) of the present invention is represented by Examples 101 to 125, the bonding wire of (9) of the present invention is represented by Examples 105, 107, 119, 123, the bonding wire of (17) of the present invention is represented by Examples 101 to 125, the bonding wire of (18) of the present invention is represented by Examples 126 to 134, the bonding wire of (25) of the present invention is represented by Examples 35 to 45, the bonding wire of (21) of the present invention is represented by Examples 101 to 145, and the bonding wire of (20) of the present invention is represented by Examples 102 to 107, 109 to 119, 121 to 124, 126 to 131, 133 to 134, 136 to 141, and 143 to 145. Tables 17 and 18 show the results of bonding wires not corresponding to the bonding wire of <2> of the present invention.

Part of the results of evaluation will be explained for representative examples of the bonding wires.

The bonding wires of Examples 101 to 125 were confirmed to be good in formability of the ball part, connection shape, wedge bondability, etc. due to the surface covering layer having a concentration gradient of copper in it and the surface having a copper concentration of 0.1 mol % or more according to the present invention. These characteristics are not sufficient with the Cu wires of Comparative Examples 101 to 109 where films of elements other than copper are formed on the surfaces. It became clear that they were improved in Examples 101 to 125.

In Examples 101 to 145, the concentration of additive elements in the wire as a whole was a total of 0.01 to 10 mol %, so chip damage was reduced, while in Comparative Examples 101 to 107 where the concentration was over 10 mol %, much chip damage was observed.

The bonding wires of Examples 105, 107, 119, and 123 were raised in wire strength and reduced in wire deformation at the time of resin sealing due to the surface covering layer having a concentration gradient of copper and intermetallic compounds with copper inside it and the surface having a copper concentration of 0.1 mol % or more according to the present invention.

The bonding wires of Examples 126 to 134 were improved in wedge bondability due to the surface covering layer having as a main ingredient gold, palladium, or platinum and containing predetermined amounts of Ca, Sr, Be, Al, or rare earth elements according to the present invention.

The bonding wires of Examples 135 to 145 secured sufficient wedge bondability while being increased in wire strength and being improved in effect of suppression of wire deformation at the time of resin sealing due to the core material being comprised of a copper alloy containing predetermined amounts of one or more types of metals of silver, tin, and zinc according to the present invention.

The bonding wires of Examples 102 to 107, 109 to 119, 121 to 124, 126 to 131, 133, 134, 136 to 141, and 143 to 145 exhibited concentration of copper at the crystal grain boundaries of the surface covering layer according to the present invention, were stabilized in ball size, loop shape, and other usage performance and thereby decreased in fluctuation, and were improved in overall yield of the wire production process by an average of 5% or more.

<3> Bonding Wire: Examples 201 to 241

As the materials of the bonding wire, for the copper used for the core material, a material of a high purity of approximately 99.99 mass % or more was used, while for the materials of the Au, Pt, Pd, Ag, and Ni of the surface covering layer (outer covering layer), materials of a purity of 99.9 mass % or more were prepared.

Copper wire reduced to a certain wire size was used as the core material. To form a layer of a different metal on that wire surface, electroplating, electroless plating, vapor deposition, casting, etc. was performed. To form a concentration gradient, heat treatment was performed. When forming a surface covering layer (outer covering layer) by the final wire size, the method was utilized of forming the outer covering layer by a certain wire size, then further drawing the wire to reduce it to the final wire size. For the electroplating solution and the electroless plating solution, plating solutions commercially available for semiconductor applications were used. For the vapor deposition, sputtering was used. Wire of a diameter of approximately 50 to 200 μm was prepared in advance, the wire surface was covered by vapor deposition, plating, etc., the wire was drawn to the final diameter of 15 to 75 μm, then finally the working strain was removed and heat treatment was performed to obtain an elongation value of 4% or so. In accordance with need, the wire was drawn to a wire size of 30 to 100 μm, then given heat treatment for diffusion and then further drawn.

When utilizing casting, the method of casting molten metal around a core wire prepared in advance or the method of casting molten copper or copper alloy in the center of a hollow tube prepared in advance was employed. After that, this was forged, rolled, drawn, or otherwise worked and heat treated to produce the wire.

For the heat treatment of the wires of the invention examples, the wires were heated while being continuously swept. A system locally introducing a temperature gradient, a system changing the temperature inside the furnace, etc. was employed. The temperature difference was made 30 to 200° C. in range, the temperature distribution, wire sweep rate, etc. were made suitable, and the tensile elongation was adjusted to 4% or so. For the atmosphere of the heat treatment, in addition to the air, $N_2$, Ar, or other inert gas was also utilized for the purpose of suppressing oxidation. Regarding the heat treatment processes of the comparative examples, samples were prepared for two cases: the case of heating treating the drawn Cu wire, then forming a plating layer and the case of heat treating the wire two times: after drawing and after formation of the plating layer.

The wire tensile strength and elongation were found by running tensile tests on five wires of lengths of 10 cm and finding the average values.

For measurement of the film thickness on the wire surface, depth analysis by AES was used. For observation of concentration at the crystal grain boundaries or other element distribution, surface analysis or line analysis using AES, EPMA, etc. was performed. The concentration of conductive metal in the wire was measured by ICP analysis, ICP mass analysis, etc. For the weighted concentration at the surface, the concentrations at four locations of random positions were analyzed. When the copper concentrations differed by 10% or more, it was judged that the concentration was weighted and the "◯" mark was assigned, while when lower than that, no weighting was shown. When the copper concentration near the crystal grain boundaries was a high 5% or more, the "◯" mark was assigned, while when lower than that, no concentration was shown.

For connecting the bonding wire, a commercially available automatic wire bonder was used for ball/wedge bonding. Arc discharge was used to prepare a ball at the wire tip, this was joined to an electrode film on a silicon substrate, and the other end of the wire was wedge bonded on a lead terminal. To suppress oxidation at the time of ball melting, the wire tip was sprayed with $N_2$ gas while performing the electrodischarge.

As the other member bonded to, the material of the electrode film on the silicon substrate, that is, an Al alloy film of a thickness of 1 μm (Al-1% Si-0.5% Cu film, Al-0.5% Cu film) was used. On the other hand, as the other member for wedge bonding, a lead frame plated on its surface with Ag plating (thickness: 1 to 4 μm) or a resin substrate of an electrode structure of Au plating/Ni plating/Cu was used.

For the loop shape stability in the bonding process, two types of trapezoidal loops were prepared: a general span with a wire length of 2 mm and a short span of 0.5 mm. 500 wires were observed by a projector for each and the wire straightness, variations in loop height, etc. were judged. When forming a trapezoidal loop by a short wire length of 0.5 mm, stricter loop control becomes necessary to avoid contact with the chip end. With a wire length of 2 mm, when there were defects in straightness, loop height, etc. in five wires, it was judged there was a problem and the "X" mark was assigned; with a wire length of 0.5 mm, when there were defects in two to four wires and, with a wire length of 0.5 mm, when there were defects in five or more wires, it was judged that improvement was needed and the "Δ" mark was assigned; with a wire length of 2 mm, when there was a defect in one wire or no defect and, with a wire length of 0.5 mm, when there were defects in two to four wires, the loop shape was relatively good, so the "○" mark was assigned; while with a wire length of 0.5 mm, when there was a defect in one wire or no defect, it was judged that the loop shape was stable and the "⊚" mark was assigned. As causes of defects, insufficient adhesion at the interface between the core wire and outer periphery, fluctuations in characteristics in a cross-section, etc. may be considered.

For evaluation of the capillary life, 50,000 wires were connected, then the capillary tip was judged for fouling, wear, or other changes. When the surface was clean, the "○" mark was assigned, when there was a little deposition etc., but not a problem for normal operation, the "Δ" mark was assigned, and when the amount or size of the deposition was remarkable, the "X" mark was assigned.

The deformation of the wire at the time of resin sealing (resin deformation) was measured by preparing bonding samples of wire lengths of 4 mm, sealing them by a commercially available epoxy resin, then using a soft X-ray nondestructive inspection apparatus to measure the amounts of deformation of the parts with the greatest wire deformation for 20 wires. That average value divided by the wire span length (percentage) was used as the wire deformation rate at the time of sealing. When this wire deformation rate was 5% or more, it was judged that the result was defective and the "X" mark was assigned, when 3% to less than 5%, improvement was needed, so the "Δ" mark was assigned, when 2% to less than 3%, it was judged that there was no problem in practice and the "○" mark was assigned, and when less than 2%, the reduction of wire deformation was good, so the "⊚" mark was assigned.

When the ratio of the ball size to the wire size becomes smaller, stable formation is difficult, so in the evaluation of the initial ball shape, two types of balls were used for evaluation: a normal size with a ratio of ball size/wire size of 1.9 to 2.2 in range and a small size ball of 1.6 to 1.7 in range. The balls before bonding were observed for 20 wires and a judgment made as to if the shapes were true spheres and if the dimensional accuracy was good. When abnormal shape balls were formed for two or more wires, it was judged that the result was defective and the "X" mark was assigned, when there were irregular shapes for two or less wires, but the number of wires where the ball position was remarkably offset from the wire was five or more, the "Δ" mark was assigned, when there was offset in two to four wires, but it was judged there was no great problem in practice, the "○" mark was assigned, and when there was offset in one wire or no offset and the dimensional accuracy was also good, the ball formation was good, so the "⊚" mark was assigned.

For evaluation of the bondability on stud bumps, first stud bumps were formed and then the same wire was continuously wedge connected over them. This process was performed for 1000 wires. If the bonder system stopped in the middle of this, the wire fell off a bump, or another shape defect occurred in just one wire or less, it was judged that the result was good and the "○" mark was assigned, if in one to five wires in range, it was judged this was a level not posing a problem in practice and the "Δ" mark was assigned, while if in over five wires, it was judged that improvement was needed on bonding on the bumps and the "X" mark was assigned.

For evaluation of the reverse bonding ability, a ball was bonded to the substrate side, wire was wedge bonded on a stud bump on the chip side, and the stability of that loop shape was evaluated. 1000 wires were connected. If bending, curling, or other wire deformation defects occurred in five wires or more, the "X" mark was assigned, in two to four wires, the "Δ" mark was assigned, and in one wire or none, the "○" mark was assigned.

For judgment of the bonded shape of the pressed ball, bonded balls were observed for 500 wires and the circularity of the shape, dimensional accuracy, etc. were evaluated. Small size balls with a ratio of initial ball size/wire size of 1.6 to 1.7 in range were used and conditions giving a pressed ball size of 2 to 3 times the wire size in range were selected. When there were anisotropy offset from a true circle or petal defects or other defective ball shapes in five wires or more, it was judged that the result was defective and the "X" mark was assigned, when there were defective ball shapes in two to four wires, improvement was desirable in accordance with need and the "Δ" mark was assigned, and if there was a defective ball shape in one wire or no defect, the result was good, so the "○" mark was assigned.

For evaluation of damage to the silicon substrate right under a ball bond, the ball bond and electrode film were removed by aqua regia, then the silicon substrate was examined for cracks, micropitting, etc. by an optical microscope, SEM, etc. 500 bonds were examined. When 5 μm or larger cracks were observed in three or more, it was judged that the chip damage was a problem and the "Δ" mark was assigned, when cracks were observed in one to three or 1 μm or so pitting was observed in two or more, chip damage was a concern, but this was not a problem in practice, so the "○" mark was assigned, and when no cracks occurred and pitting was observed in one bond or not at all, the result was very good, so the "⊚" mark was assigned.

For judgment of the wedge bondability for bonding wire to the lead side, since bonding becomes more difficult the lower the temperature, 1000 wires each were bonded at stage temperatures of low temperatures of 220° C. and 180° C. and the continuous workability, wire deformation shape, etc. were examined. When complete detachment occurred at the bond in two or more wires at 220° C., the "X" mark was assigned, when complete detachment occurred at less than two wires at 220° C. and partial detachment occurred near wire breakage, improvement was needed, so the "Δ" mark was assigned, when there were no defects at 220° C. and, further, there was complete detachment at one wire or not at all at 180° C., the "○" mark was assigned, and when there was no complete detachment at 180° C. and there was partial detachment at less than three wires, the "⊚" mark was assigned.

For the evaluation of the pull strength of the neck part directly above the ball bond, pull tests were run hooking the parts near the ball bonds for 20 samples with wire lengths of 3 mm. When that average value was seven-tenths or more of the wire breakage strength, it was judged that the pull strength was high and the "◎" mark was assigned, when five- to seven-tenths in range, it was judged that there was normally no problem and the "○" mark was assigned, and when less the five-tenths, damage was feared, so the "△" mark was assigned.

For evaluation of the shape of the wedge bonding, wire was wedge bonded to the Ag plating layer on an inner lead of a frame and judged for breakage detachment, variations in bonding shape, or other irregularities. Bonds of 1000 wires were observed. When there were irregularities in five or more wires, the "X" mark was assigned, in three to five wires, the "△" mark was assigned, in one to two wires, the "○" mark was assigned, and in none, the result was judged good and the "◎" mark was assigned.

TABLE 23

| | Test No. | Surface covering layer (outer covering layer) | | | | | | | | | Production method A: Electroless B: Electro-plating C: Vapor deposition D: Casting | Wire size/ μm |
|---|---|---|---|---|---|---|---|---|---|---|---|---|
| | | Main conductive metal | Surface covering layer (outer covering layer) thickness/ μm | Thickness of concentration gradient/ μm | 20 mol % or more thickness/ μm | 40 mol % or more thickness/ μm | Constant conductive metal concentration thickness/ μm | Surface concentration weighting | Grain boundary concentration | Concentration of conductive metal in wire/ mol % | Core material additive elements and concentration, mass % | | |
| Inv. ex. | 201 | Au | 0.001 | 0.0007 | 0.0006 | 0 | — | ○ | None | 0.001 | — | A | 15 |
| | 202 | Au | 0.002 | 0.0008 | 0.0007 | 0 | — | ○ | ○ | 0.002 | — | C | 25 |
| | 203 | Au | 0.015 | 0.01 | 0.001 | 0.0007 | 0.003 | ○ | ○ | 0.003 | Au0.001, Ca0.001 | B | 25 |
| | 204 | Au, Pd | 0.012 | 0.011 | 0.01 | 0.003 | — | ○ | ○ | 0.01 | — | A | 23 |
| | 205 | Au | 0.001 | 0.001 | 0.001 | 0 | — | ○ | None | 0.004 | La, Ba each 0.0007 | B | 25 |
| | 206 | Au | 0.004 | 0.004 | 0.003 | 0.002 | — | ○ | ○ | 0.04 | Au0.02 | A | 15 |
| | 207 | Au, Pt | 0.006 | 0.006 | 0.002 | 0.001 | — | None | ○ | 0.03 | — | B | 25 |
| | 208 | Au | 0.004 | 0.003 | 0.003 | 0.002 | — | ○ | ○ | 0.05 | La, Nd, each 0.007 | B | 20 |
| | 209 | Au | 0.006 | 0.006 | 0.005 | 0.001 | — | ○ | ○ | 0.02 | Al0.01 | B | 25 |
| | 210 | Au, Ag | 0.008 | 0.008 | 0.005 | 0.003 | — | ○ | None | 0.03 | — | A | 50 |
| | 211 | Au | 0.01 | 0.01 | 0.006 | 0.004 | — | ○ | ○ | 0.03 | — | D | 25 |
| | 212 | Au | 0.014 | 0.009 | 0.003 | 0.002 | 0.004 | None | ○ | 0.04 | Ca, Be, each 0.0005 | B | 30 |
| | 213 | Au | 0.013 | 0.013 | 0.005 | 0.004 | — | ○ | ○ | 0.05 | — | D | 25 |
| | 214 | Au | 0.018 | 0.012 | 0.003 | 0.002 | 0.005 | None | ○ | 0.1 | — | B | 75 |
| | 215 | Ag | 0.002 | 0.002 | 0.002 | 0.001 | — | ○ | None | 0.007 | Ag0.002 | A | 25 |
| | 216 | Ag | 0.006 | 0.006 | 0.004 | 0.002 | — | ○ | ○ | 0.02 | Ba, Al, each 0.002 | B | 25 |
| | 217 | Ag | 0.017 | 0.01 | 0.005 | 0.003 | 0.005 | None | ○ | 0.001 | Zn, Sn, each 0.003 | B | 23 |
| | 218 | Pd | 0.002 | 0.002 | 0.001 | 0 | — | ○ | None | 0.01 | — | B | 25 |
| | 219 | Pd, Ag | 0.004 | 0.004 | 0.004 | 0.001 | — | ○ | None | 0.02 | — | D | 20 |
| | 220 | Pd | 0.016 | 0.013 | 0.008 | 0.003 | 0.002 | None | ○ | 0.007 | Pd0.004 | B | 35 |
| | 221 | Pt | 0.003 | 0.003 | 0.001 | 0.0008 | — | ○ | ○ | 0.002 | — | B | 25 |
| | 222 | Pt | 0.005 | 0.005 | 0.004 | 0.001 | — | ○ | ○ | 0.003 | Be, Pr, each 0.001 | B | 25 |
| | 223 | Pt | 0.007 | 0.006 | 0.005 | 0.002 | 0.001 | None | ○ | 0.008 | Pt0.22 | B | 25 |
| | 224 | Ni | 0.002 | 0.002 | 0.001 | 0 | — | ○ | ○ | 0.02 | Ca, Eu, each 0.002 | B | 25 |
| | 225 | Ni | 0.006 | 0.006 | 0.003 | 0.001 | — | ○ | ○ | 0.05 | — | D | 30 |

TABLE 24

| | Test No. | Ball formability | | Short span loop stability | Capillary life | Wedge bonding material | Wedge bondability | Low temp. wedge bondability | Wire mechanical characteristics | | Ball vicinity pull strength evaluation | Chip damage | Resin deformation | 2nd bond irregular shape |
|---|---|---|---|---|---|---|---|---|---|---|---|---|---|---|
| | | Normal size ball | Small size ball | | | | | | Tensile strength/ MPa | Elongation/ % | | | | |
| Inv. ex. | 201 | ○ | ◎ | △ | △ | Ag | △ | △ | 138 | 5 | △ | △ | ○ | ○ |
| | 202 | ○ | ◎ | △ | △ | Au | △ | △ | 140 | 8 | △ | ○ | ○ | ○ |
| | 203 | ○ | ◎ | ○ | ○ | Ag | ○ | ◎ | 169 | 8 | △ | ○ | ◎ | ◎ |
| | 204 | ○ | ◎ | ○ | ○ | Ag | ○ | ○ | 170 | 8 | ○ | ○ | ○ | ○ |
| | 205 | ○ | ◎ | ○ | ○ | Ag | ○ | ○ | 175 | 8 | △ | ○ | ◎ | ○ |
| | 206 | ○ | ◎ | ○ | ○ | Ag | ○ | ○ | 173 | 6 | ○ | ○ | ○ | ◎ |
| | 207 | ○ | ○ | ○ | ○ | Ag | ○ | ○ | 174 | 8 | ○ | ○ | ○ | ○ |
| | 208 | ○ | ◎ | ○ | ○ | Ag | ○ | ○ | 192 | 6 | ○ | ○ | ◎ | ○ |
| | 209 | ○ | ◎ | ○ | ○ | Ag | ○ | ○ | 171 | 8 | ○ | ○ | ◎ | ○ |

TABLE 24-continued

| | Ball formability | | Short | | | Wedge bond-ability | Low temp. wedge bond-ability | Wire mechanical characteristics | | Ball vicinity pull strength evaluation | Chip damage | Resin deformation | 2nd bond irregular shape |
|---|---|---|---|---|---|---|---|---|---|---|---|---|---|
| Test No. | Normal size ball | Small size ball | span loop stability | Capillary life | Wedge bonding material | | | Tensile strength/ MPa | Elongation/ % | | | | |
| 210 | ○ | ◎ | ○ | ○ | Au | ○ | ○ | 185 | 15 | ○ | ○ | ○ | ○ |
| 211 | ○ | ◎ | ○ | ○ | Ag | ○ | ○ | 176 | 10 | ○ | ○ | ○ | ○ |
| 212 | ○ | ○ | ○ | ○ | Ag | ○ | ◎ | 205 | 8 | ○ | ○ | ◎ | ○ |
| 213 | ○ | ◎ | ○ | ○ | Ag | ○ | ○ | 172 | 8 | ○ | ○ | ○ | ○ |
| 214 | ○ | ○ | ○ | ○ | Ag | ○ | ◎ | 184 | 20 | ○ | ○ | ○ | ○ |
| 215 | ○ | ◎ | ○ | ○ | Pd | ○ | ○ | 173 | 10 | ○ | ○ | ○ | ◎ |
| 216 | ○ | ◎ | ○ | ○ | Ag | ○ | ○ | 195 | 6 | ○ | ○ | ◎ | ○ |
| 217 | ○ | ○ | ○ | ○ | Ag | ○ | ◎ | 171 | 8 | ○ | Δ | ○ | ◎ |
| 218 | ○ | ◎ | ○ | ○ | Au | ○ | ○ | 175 | 10 | Δ | ○ | ○ | ○ |
| 219 | ○ | ◎ | ○ | ○ | Ag | ○ | ○ | 173 | 6 | ○ | ○ | ○ | ○ |
| 220 | ○ | ◎ | ○ | ○ | Ag | ○ | ◎ | 182 | 8 | ○ | ○ | ○ | ◎ |
| 221 | ○ | ◎ | ○ | ○ | Ag | ○ | ○ | 174 | 10 | Δ | ○ | ○ | ○ |
| 222 | ○ | ○ | ○ | ○ | Au | ○ | ○ | 202 | 8 | ○ | ○ | ◎ | ○ |
| 223 | ○ | ○ | ○ | ○ | Ag | ○ | ◎ | 176 | 10 | ○ | ○ | ○ | ◎ |
| 224 | ○ | ◎ | ○ | ○ | Ag | ○ | ○ | 197 | 10 | ○ | ○ | ◎ | ○ |
| 225 | ○ | ◎ | ○ | ○ | Ag | ○ | ○ | 182 | 15 | ○ | ○ | ○ | ○ |

TABLE 25

| | | Surface covering layer (outer covering layer) | | | | | | | | | Production method A: Electroless B: Electroplating C: Vapor deposition D: Casting | |
|---|---|---|---|---|---|---|---|---|---|---|---|---|
| Test No. | Main conductive metal | Surface covering layer (outer covering layer) thickness/ μm | Thickness of concentration gradient/ μm | 20 mol % or more thickness/ μm | 40 mol % or more thickness/ μm | Constant conductive metal concentration thickness/ μm | Surface concentration weighting | Grain boundary concentration | Concentration of conductive metal in wire/ mol % | Core material additive elements and concentration, mass % | | Wire size/ μm |
| Comp. ex. | 201 | — | — | — | — | — | — | — | — | — | — | 25 |
| | 202 | Au | 0.0008 | — | — | — | — | None | None | — | — | A | 25 |
| | 203 | Au | 0.025 | 0.023 | 0.008 | 0.003 | 0.001 | None | None | 0.04 | — | A | 20 |
| | 204 | Au | 0.04 | 0.025 | 0.01 | 0.004 | 0.001 | None | None | 0.08 | Au0.001 | D | 25 |
| | 205 | Au | 0.05 | 0.04 | 0.03 | 0.015 | 0.01 | None | None | 0.9 | Au, Pt, Pd, each 0.2 | B | 25 |
| | 206 | Au | 0.05 | 0.024 | 0.08 | 0.002 | 0.04 | None | None | 0.35 | — | B | 25 |
| | 207 | Ag | 0.03 | 0.03 | 0.024 | 0.012 | — | None | None | 0.08 | — | B | 25 |
| | 208 | Ag | 0.05 | 0.05 | 0.04 | 0.02 | — | None | None | 0.2 | Al, Be, La, Sr, each 0.01 | C | 35 |
| | 209 | Pd | 0.03 | 0.03 | 0.02 | 0.01 | — | None | None | 0.07 | — | B | 25 |
| | 210 | Pd | 0.04 | 0.03 | 0.02 | 0.01 | 0.01 | None | None | 0.35 | — | B | 25 |
| | 211 | Pt | 0.03 | 0.025 | 0.017 | 0.01 | 0.01 | None | None | 0.33 | — | B | 30 |
| | 212 | Ni | 0.04 | 0.03 | 0.015 | 0.01 | 0.01 | None | None | 0.7 | Pd0.5, Zn0.3, Al0.3 | B | 20 |

TABLE 26

| | Test No. | Ball formability | | Short span loop stability | Capillary life | Wedge bonding material | Wedge bond-ability | Low temp. wedge bond-ability | Wire mechanical characteristics | | Ball vicinity pull strength evaluation | Chip damage | Resin deformation | 2nd bond irregular shape |
|---|---|---|---|---|---|---|---|---|---|---|---|---|---|---|
| | | Normal size ball | Small size ball | | | | | | Tensile strength/ MPa | Elongation/ % | | | | |
| Comp. ex. | 201 | ○ | ○ | Δ | Δ | Ag | X | X | 148 | 10 | Δ | Δ | Δ | Δ |
| | 202 | ○ | ○ | Δ | Δ | Ag | X | X | 153 | 12 | Δ | Δ | Δ | Δ |
| | 203 | ○ | X | Δ | Δ | Ag | ○ | Δ | 178 | 8 | ○ | ○ | ○ | ○ |
| | 204 | ○ | X | Δ | Δ | Pd | ○ | Δ | 182 | 8 | ○ | ○ | ○ | ○ |
| | 205 | Δ | X | Δ | Δ | Ag | ○ | Δ | 188 | 12 | ○ | Δ | ○ | ○ |
| | 206 | ○ | X | Δ | Δ | Ag | ○ | Δ | 177 | 8 | ○ | Δ | ○ | ○ |
| | 207 | ○ | X | Δ | Δ | Pd | ○ | Δ | 180 | 8 | ○ | ○ | ○ | ○ |
| | 208 | ○ | X | Δ | Δ | Ag | ○ | Δ | 172 | 15 | ○ | ○ | ○ | ○ |
| | 209 | ○ | X | Δ | Δ | Ag | ○ | Δ | 176 | 8 | ○ | ○ | ○ | ○ |
| | 210 | Δ | X | Δ | Δ | Ag | ○ | Δ | 180 | 12 | ○ | Δ | ○ | ○ |
| | 211 | ○ | X | Δ | Δ | Ag | ○ | Δ | 173 | 12 | ○ | Δ | ○ | ○ |
| | 212 | ○ | X | Δ | Δ | Ag | ○ | Δ | 178 | 8 | ○ | Δ | ○ | ○ |

TABLE 27

| | Test No. | Surface covering layer (outer covering layer) | | | | | | | | Production method A: Electroless B: Electroplating C: Vapor deposition D: Casting | Wire size/ μm |
|---|---|---|---|---|---|---|---|---|---|---|---|
| | | Main conductive metal | Surface covering layer (outer covering layer) thickness/ μm | Thickness of concentration gradient/ μm | Maximum concentration of conductive metal/ mol % | Copper concentration of surface-most surface/ mol % | Concentration weighting of surface | Grain boundary concentration | Concentration of conductive metal in wire/ mol % | Core material additive elements and concentration, mass % | | |
| Inv. ex. | 226 | Au | 0.001 | 0.001 | 28 | 43 | ○ | None | 0.004 | — | A | 20 |
| | 227 | Au | 0.005 | 0.003 | 33 | 45 | ○ | ○ | 0.007 | — | B | 18 |
| | 228 | Au, Ag | 0.01 | 0.006 | 35 | 44 | ○ | ○ | 0.02 | — | C | 50 |
| | 229 | Au | 0.015 | 0.013 | 37 | 55 | ○ | ○ | 0.03 | Ca, Al, each 0.002 | B | 25 |
| | 230 | Ag | 0.008 | 0.004 | 32 | 67 | ○ | ○ | 0.01 | — | B | 25 |
| | 231 | Ni | 0.008 | 0.006 | 25 | 77 | ○ | ○ | 0.02 | Ag, Sn, each 0.01 | B | 18 |
| | 232 | Au | 0.002 | 0.002 | 37 | 62 | ○ | None | 0.002 | — | B | 25 |
| | 233 | Au | 0.004 | 0.004 | 47 | 53 | ○ | ○ | 0.008 | — | B | 20 |
| | 234 | Au | 0.01 | 0.008 | 32 | 72 | ○ | ○ | 0.03 | Au 0.02, Nd 0.002 | D | 75 |
| | 235 | Au, Pd | 0.018 | 0.01 | 45 | 54 | ○ | ○ | 0.07 | — | A | 25 |
| | 236 | Ni | 0.008 | 0.007 | 44 | 63 | ○ | ○ | 0.05 | — | B | 20 |
| | 237 | Pd | 0.008 | 0.005 | 48 | 55 | ○ | ○ | 0.06 | Pd 0.01, Be 0.002 | B | 25 |
| | 238 | Au | 0.005 | 0.005 | 60 | 42 | ○ | ○ | 0.006 | — | B | 25 |
| | 239 | Au | 0.01 | 0.007 | 63 | 37 | ○ | ○ | 0.05 | — | B | 20 |
| | 240 | Au, Pt | 0.015 | 0.015 | 75 | 25 | ○ | None | 0.12 | — | B | 25 |
| | 241 | Au | 0.018 | 0.013 | 85 | 12 | ○ | ○ | 0.25 | — | D | 15 |
| Comp. ex. | 212 | — | — | — | — | — | — | — | — | — | — | 20 |
| | 213 | Ag | 0.4 | 0.3 | 72 | 30 | — | — | 0.32 | — | B | 20 |
| | 214 | Au | 0.6 | 0.35 | 68 | 34 | — | — | 0.4 | Ca, Be, Al, each 0.015 | D | 25 |
| | 215 | Pt | 0.5 | 0.4 | 85 | 15 | — | — | 0.35 | — | B | 18 |
| | 216 | Pd | 0.5 | 0.44 | 75 | 25 | — | — | 0.33 | Ag, Pd, each 0.06 | D | 25 |
| | 217 | Au | 0.4 | 0.3 | 30 | 70 | — | — | 0.08 | — | B | 25 |
| | 218 | Pd | 0.3 | 0.25 | 35 | 65 | — | — | 0.15 | — | B | 25 |
| | 219 | Au | 0.4 | 0.3 | 100 | 0 | — | — | 0.37 | — | A | 25 |

TABLE 28

| | Test No. | Ball formability | | Small ball pressed shape | Reverse bondability | Bondability on stud bump | Wedge bonding material | Wedge bondability | Chip damage | Resin deformation | Irregular shape of 2nd bond |
|---|---|---|---|---|---|---|---|---|---|---|---|
| | | Normal size ball | Small size ball | | | | | | | | |
| Inv. ex. | 226 | ○ | ◎ | ○ | ○ | ○ | Ag | ○ | ○ | ○ | ○ |
| | 227 | ○ | ◎ | ○ | ○ | ○ | Au | ○ | ○ | ○ | ○ |
| | 228 | ○ | ◎ | ○ | ○ | ○ | Ag | ○ | ○ | ○ | ○ |
| | 229 | ○ | ◎ | ◎ | ○ | ○ | Ag | ○ | ○ | ◎ | ○ |
| | 230 | ○ | ◎ | ◎ | ○ | ○ | Ag | ○ | ○ | ○ | ○ |
| | 231 | ○ | ◎ | ◎ | ○ | ○ | Ag | ○ | ○ | ○ | ◎ |
| | 232 | ○ | ◎ | ◎ | ○ | ○ | Ag | ○ | ○ | ○ | ○ |
| | 233 | ○ | ◎ | ◎ | Δ | Δ | Ag | ○ | ○ | ○ | ○ |
| | 234 | ○ | ◎ | ◎ | ○ | ○ | Ag | ○ | ○ | ◎ | ◎ |
| | 235 | ○ | ◎ | ◎ | Δ | Δ | Ag | ○ | ○ | ○ | ○ |
| | 236 | ○ | ◎ | ◎ | Δ | Δ | Ag | ○ | ○ | ○ | ○ |
| | 237 | ○ | ◎ | ◎ | Δ | Δ | Pd | ○ | ○ | ◎ | ◎ |
| | 238 | ○ | ◎ | ○ | Δ | Δ | Ag | ○ | ○ | ○ | ○ |
| | 239 | ○ | ◎ | ○ | Δ | Δ | Au | ○ | ○ | ○ | ○ |
| | 240 | ○ | ◎ | ○ | Δ | Δ | Ag | ○ | ○ | ○ | ○ |
| | 241 | ○ | ◎ | ○ | Δ | Δ | Ag | ○ | ○ | ○ | ○ |
| Comp. ex. | 212 | ○ | ○ | ○ | X | Δ | Pd | X | ○ | ○ | X |
| | 213 | Δ | X | X | X | X | Au | ○ | Δ | ○ | ○ |
| | 214 | Δ | X | X | X | X | Au | ○ | Δ | ◎ | ○ |
| | 215 | Δ | X | X | X | X | Ag | ○ | Δ | ○ | ○ |
| | 216 | Δ | X | X | X | X | Au | ○ | Δ | ○ | ○ |
| | 217 | Δ | X | X | X | X | Au | ○ | ○ | ○ | ○ |
| | 218 | Δ | X | X | X | X | Au | ○ | ○ | ○ | ○ |
| | 219 | Δ | X | X | X | X | Ag | ○ | X | ○ | ○ |

Tables 23 and 24 show the results of evaluation of copper bonding wire according to the present invention, while Tables 25 and 26 show the results of evaluation of comparative examples. Further, Tables 27 and 28 show results of evaluation of copper bonding wires according to the present invention and comparative examples.

The bonding wire of (10) of the present invention is represented by Examples 201 to 241, the bonding wire of (11) of the present invention is represented by Examples 203 to 241, an example of the bonding wire of (12) of the present invention (12) is represented by Examples 203 to 225, the bonding wire of (13) of the present invention is represented by Examples 204, 206 to 217, 219, 220, 222, 223, and 225, the bonding wire of (14) of the present invention is represented by Examples 203, 212, 214, 217, 220, and 223, the bonding wire of (15) of the present invention is represented by Examples 226 to 232, 234, the bonding wire of (16) of the present invention is represented by Examples 229 to 237, the bonding wire of (19) of the present invention is represented by Examples 201 to 206, 208 to 211, 213, 215, 216, 218, 219, 221, 222, 224, 225, and 226 to 241, the bonding wire of (20) of the present invention is represented by Examples 201 to 204, 206 to 209, 211 to 214, 216, 217, 220 to 225, 227 to 231, 233 to 239, and 241, the bonding wire of (22) of the present invention is represented by Examples 202 to 216 and 218 to 241, the bonding wire of (26) of the present invention is represented by Examples 203, 205, 208, 209, 212, 216, 222, 224, 229, 234, and 237, and the bonding wire of (27) of the present invention is represented by Examples 203, 206, 215, 217, 220, 223, 231, 234, and 237.

Part of the results of evaluation will be explained for representative examples of the bonding wires.

The bonding wires of Examples 201 to 241 were confirmed to simultaneously satisfy the formability of the ball parts and the wedge bondability by having a surface covering layer or outer covering layer of a thickness of 0.001 to 0.02 μm in range according to the present invention. On the other hand, in Comparative Example 201 relating to a conventional copper wire not having a surface covering layer (outer covering layer), it was confirmed there was the problem that the wedge bondability was extremely poor. Further, in Comparative Examples 203 to 212, the surface covering layer (outer covering layer) had a thickness over 0.02 μm, the wedge bondability was good, and the shape was good with normal size balls, but with small size balls, shape defects occurred, so the applications would probably be limited.

The bonding wires of Examples 203 to 241 were improved in short span and other loop controllability and further were improved and good in capillary life as well by the region having a concentration gradient of conductive metal in the surface covering layer (outer covering layer) having a thickness of 0.001 to 0.02 μm in range according to the present invention. On the other hand, in Comparative Examples 201 and 202, the surface covering layer (outer covering layer) had a thickness of less than 0.001 μm and the loop controllability and the capillary life were both not sufficient, while in Comparative Examples 203 to 219, the surface covering layer (outer covering layer) had a thickness of over 0.02 μm and ball shape defects occurred.

The bonding wires of Examples 203 to 225 were confirmed to be good in wedge bondability, low temperature wedge bondability, wire tensile strength, etc. due to the surface covering layer (outer covering layer) having a region of a conductive metal concentration of 20 mol % or more of a thickness of 0.001 to 0.008 μm inside it according to the present invention.

The bonding wires of Examples 204, 206 to 217, 219, 220, 222, 223, and 225 were confirmed to be improved in pull strength near the ball bond due to the surface covering layer (outer covering layer) having a region of a conductive metal concentration of 40 mol % or more of a thickness of 0.001 to 0.006 μm inside it according to the present invention.

The bonding wires of Examples 203, 212, 214, 217, 220, and 223 were confirmed to be improved much more in low temperature wedge bondability due to the region having a constant concentration of conductive metal having a thickness of 0.007 μm or less according to the present invention.

The bonding wires of Examples 226 to 232 and 234 were confirmed to be superior in reverse bonding ability and wire bondability on stud bumps due to the surface covering layer (outer covering layer) having a maximum concentration of the conductive metal of 40 mol % or less and the surface covering layer (outer covering layer) having a thickness of 0.001 to 0.02 μm.

The bonding wires of Examples 229 to 237 were confirmed to be improved in pressed shape of the small balls due to the outermost surface having a copper concentration of 50 to 95 mol % in range, the surface covering layer (outer covering layer) having a concentration gradient in it, and the surface covering layer (outer covering layer) having a thickness of 0.001 to 0.02 μm according to the present invention.

The bonding wires of Examples 201 to 206, 208 to 211, 213, 215, 216, 218, 219, 221, 222, 224, 225, 226 to 241 were confirmed to be improved much more in stability of small size ball shapes due to the surface covering layer having conductive metal and copper in weighted concentrations at their surfaces according to the present invention.

The bonding wires of Examples 202 to 204, 206 to 209, 211 to 214, 216, 217, 220 to 225, 227 to 231, 233 to 239, and 241 were confirmed to be stable in ball size, loop shape, or other usage performance and to be improved in overall yield of the wire production process by an average of 5% or so due to having a concentration of copper at the crystal grain boundaries of the surface covering layer (outer covering layer) according to the present invention.

The bonding wires of Examples 202 to 216 and 218 to 241 were confirmed to be greatly reduced in chip damage due to the concentration of conductive metal in the wire as a whole according to the present invention being a total of 0.002 to 0.3 mol %.

The bonding wires of Examples 203, 205, 208, 209, 212, 216, 222, 224, 229, 234, and 237 were confirmed to be reduced in wire deformation at the time of resin sealing due to the core material having copper as its main ingredient containing one or more types of additive elements selected from Ba, Ca, Sr, Be, Al, and rare earth elements and the concentration of the additive elements in the wire as a whole being a total of 0.001 to 0.03 mass % according to the present invention.

The bonding wires of Examples 203, 206, 215, 217, 220, 223, 231, 234, and 237 were confirmed to be reduced in irregular shape of wedge bonding due to the core material having copper as its main ingredient containing one or more types of additive elements of Ag, Pt, Pd, Sn, or Zn and the concentration of additive elements in the wire as a whole being a total of 0.001 to 0.3 mass % according to the present invention.

The invention claimed is:

1. A bonding wire for a semiconductor device comprised of a core material having copper as its main ingredient and a surface covering layer over said core material of a conductive metal different from the core material, characterized in that said surface covering layer has as its main ingredients two or more metals selected from gold, palladium, platinum, rhodium, silver, and nickel, wherein said surface covering layer has a portion having a concentration gradient of at least one of said main ingredient metals or copper in a wire radial direction, wherein the concentration gradient is defined as an extent of change of concentration in the radial direction of 10 mol % per μm or more.

2. A bonding wire for a semiconductor device as set forth in claim 1, characterized in that at least one of said main ingredient metals has a concentration gradient both increasing and decreasing in the wire radial direction.

3. A bonding wire for a semiconductor device as set forth in claim 1, characterized in that said surface covering layer further has a single metal region selected from gold, palladium, platinum, rhodium, silver, and nickel at its surface side.

4. A bonding wire for a semiconductor device as set forth in claim 1, characterized in that said surface covering layer further has a single metal region selected from gold, palladium, platinum, rhodium, silver, and nickel inside it.

5. A bonding wire for a semiconductor device as set forth in claim 1, characterized in that said surface covering layer has a surfacemost region comprised of copper alone or an alloy containing 30 mol % or more copper at its surface side, and said surface covering layer has a region where at least one main ingredient metal and copper have concentration gradients both increasing and decreasing in the wire radial direction in the wire radial direction.

6. A bonding wire for a semiconductor device as set forth in claim 1, characterized in that said surface covering layer has a surfacemost region comprised of an alloy containing two or more metals selected from gold, palladium, platinum, rhodium, silver, and nickel in a uniform concentration of 0.1 mol % or more at its surface side, and said surface covering layer further has a concentration gradient of at least one main ingredient metal and copper in the wire radial direction.

7. A bonding wire for a semiconductor device as set forth in claim 1, characterized in that said surface covering layer contains an intermetallic compound phase inside it.

8. A bonding wire for a semiconductor device as set forth in claim 1, characterized in that said core material having copper as its main ingredient contains one or more elements selected from Ca, Sr, Be, Al, and rare earth elements in a total of 1 to 300 mass ppm.

9. A bonding wire for a semiconductor device as set forth in claim 1, characterized in that said core material having copper as its main ingredient contains one or more metals selected from silver, tin, and gold in a total of 0.1 to 10 mass %.

10. A bonding wire for a semiconductor device as set forth in claim 1, characterized in that said surface covering layer has a surfacemost region comprised of a concentration gradient layer.

11. A bonding wire for a semiconductor device as set forth in claim 10, characterized in that said surface covering layer further comprises a single metal region comprised of one main ingredient metal and said surface covering layer further comprises a concentration gradient layer on the inside of the single metal region.

12. A bonding wire for a semiconductor device as set forth in claim 1, 2 or 10, characterized in that said surface covering layer has a concentration gradient layer comprised of copper and two main ingredient metals.

13. A bonding wire for a semiconductor device as set forth in claim 12, characterized in that said surface covering layer has a thickness of 0.02-0.8 μm.

14. A bonding wire for a semiconductor device as set forth in claim 1, 2, 10 or 11, wherein the two or more main ingredient metals are selected from gold, palladium, and silver.

15. A bonding wire for a semiconductor device as set forth in claim 14, characterized in that said surface covering layer has a thickness of 0.02-0.8 μm.

16. A bonding wire for a semiconductor device as set forth in claim 1, 2, 10, or 11, characterized in that said surface covering layer has a thickness of 0.02-0.8 μm.

* * * * *